US012805192B2

(12) United States Patent
Lui et al.

(10) Patent No.: US 12,805,192 B2
(45) Date of Patent: Nov. 17, 2026

(54) COMPOSITION FOR ORGANIC OPTOELECTRONIC DEVICE, ORGANIC OPTOELECTRONIC DEVICE AND DISPLAY DEVICE

(71) Applicant: SAMSUNG SDI CO., LTD., Yongin-si (KR)

(72) Inventors: Jinhyun Lui, Suwon-si (KR); Youngkyoung Jo, Suwon-si (KR); Jun Seok Kim, Suwon-si (KR); Changwoo Kim, Suwon-si (KR); Seungjae Lee, Suwon-si (KR); Hyung Sun Kim, Suwon-si (KR); Seungchul Lyu, Suwon-si (KR); Sangil Lee, Suwon-si (KR); Kyunghag Jung, Suwon-si (KR); Sung-Hyun Jung, Suwon-si (KR); Wooseok Jeong, Suwon-si (KR); Pyeongseok Cho, Suwon-si (KR); Dalho Huh, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 998 days.

(21) Appl. No.: 17/746,029

(22) Filed: May 17, 2022

(65) Prior Publication Data

US 2022/0399508 A1 Dec. 15, 2022

(30) Foreign Application Priority Data

May 18, 2021 (KR) ........................ 10-2021-0064311
May 16, 2022 (KR) ........................ 10-2022-0059688

(51) Int. Cl.
*H10K 85/60* (2023.01)

(52) U.S. Cl.
CPC ....... *H10K 85/6574* (2023.02); *H10K 85/654* (2023.02); *H10K 85/6572* (2023.02); *H10K 85/6576* (2023.02)

(58) Field of Classification Search
CPC ............. H10K 85/6574; H10K 85/654; H10K 85/6572; H10K 85/6576; H10K 2101/90
See application file for complete search history.

(56) References Cited

U.S. PATENT DOCUMENTS 5,061,569 A 10/1991 Vanslyke et al.
9,266,865 B2 2/2016 Numata et al.
(Continued)

FOREIGN PATENT DOCUMENTS

CN 103429570 A 12/2013
CN 103502243 A 1/2014
(Continued)

OTHER PUBLICATIONS

Chinese Notice of Allowance dated Mar. 3, 2025.
(Continued)

*Primary Examiner* — Michael M Dollinger
(74) *Attorney, Agent, or Firm* — Lee IP Law, P.C.

(57) ABSTRACT

A composition for an organic optoelectronic device, an organic optoelectronic device, and a display device, the composition including a first compound represented by Chemical Formula 1, and a second compound represented by Chemical Formula 4,

[Chemical Formula 1]

(Continued)

-continued

[Chemical Formula 4]

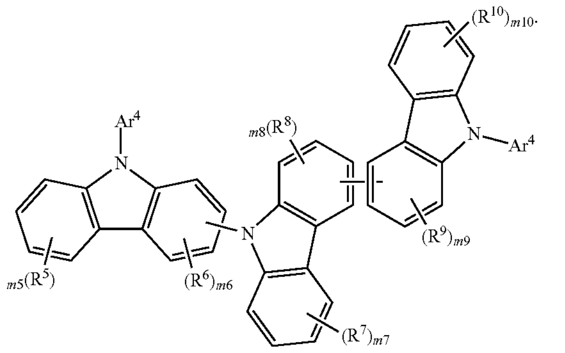

12 Claims, 1 Drawing Sheet

(56) References Cited

U.S. PATENT DOCUMENTS 9,564,595 B2 2/2017 Kato et al.
10,297,762 B2 5/2019 Zeng et al.
2010/0187977 A1 7/2010 Kai
2012/0292609 A1 11/2012 Yokoyama et al.
2013/0020565 A1 1/2013 Numata
2013/0112950 A1 5/2013 Yokoyama
2014/0107338 A1 4/2014 Ahn
2015/0053960 A1 2/2015 Park
2015/0357583 A1 12/2015 Ahn et al.
2016/0035985 A1 2/2016 Numata et al.
2016/0351822 A1 12/2016 Lee et al.
2017/0084845 A1 3/2017 Kim
2017/0317293 A1 11/2017 Kim
2018/0337348 A1 11/2018 Jung et al.
2019/0013490 A1 1/2019 Cho et al.
2019/0165280 A1 5/2019 Jang et al.
2019/0363261 A1 11/2019 Lee
2020/0039971 A1 2/2020 Kang et al.
2020/0127213 A1* 4/2020 Jang .................... H10K 85/6574
2020/0388766 A1 12/2020 Kim et al.
2021/0009894 A1 1/2021 Ha et al.
2021/0104698 A1 4/2021 Kim et al.
2022/0025812 A1 1/2022 Han et al.
2022/0109109 A1 4/2022 Kim et al.
2022/0181561 A1 6/2022 Fleetham
2022/0231229 A1 7/2022 Yang
2023/0212173 A1 7/2023 Lim et al.
2023/0345828 A1 10/2023 Lee et al.
2024/0023355 A1 1/2024 Cho et al.
2024/0341167 A1 10/2024 Fleetham et al.

FOREIGN PATENT DOCUMENTS

CN 107108585 A 8/2017
CN 110437213 A 11/2019
CN 114075132 A 2/2022
CN 114075204 A 2/2022
CN 114195700 A 3/2022
CN 114975810 A 8/2022
CN 115707267 A 2/2023
CN 116264876 A 6/2023
CN 119156899 A 12/2024
CN 119301118 A 1/2025
EP 4520756 A1 3/2025
EP 4521906 A1 3/2025
JP 1993-009471 A 1/1993
JP 1995-126615 A 5/1995
JP 1998-095973 A 4/1998
JP 5335103 B2 11/2013
KR 10-2012-0102374 A 9/2012
KR 10-2013-0018724 A 2/2013
KR 10-2013-0098983 A 9/2013
KR 10-2016-0080090 A 7/2016
KR 10-1773363 B1 8/2017
KR 10-2018-0002351 A 1/2018
KR 10-2018-0055193 A 5/2018
KR 10-2018-0055679 A 5/2018
KR 10-1849747 B1 5/2018
KR 10-2019-0070064 A 6/2019
KR 10-2019-0103765 A 9/2019
KR 10-2019-0123695 A 11/2019
KR 10-2019-0124162 A 11/2019
KR 10-2044943 B1 11/2019
KR 10-2020-0017727 A 2/2020
KR 10-2101476 B1 4/2020
KR 10-2020-0057651 A 5/2020
KR 10-2154083 B1 9/2020
KR 10-2021-0018128 A 2/2021
KR 10-2021-0041166 A 4/2021
KR 10-2021-0084629 A 7/2021
KR 10-2022-0122557 A 9/2022
KR 10-2023-0002039 A 1/2023
TW I486332 B 6/2015
WO WO 1995/009147 A1 4/1995
WO WO 2011/125680 A1 10/2011
WO WO 2012/001986 A1 1/2012
WO WO 2012/128298 A1 9/2012
WO WO 2013/077352 A1 5/2013
WO WO-2019132632 A1 * 7/2019 ............. C09K 11/06

OTHER PUBLICATIONS

Third Party Submission received in co pending related U.S. Appl. No. 17/824,175, dated Oct. 3, 2024.
Third Party Submission received in co pending related U.S. Appl. No. 17/824,175, dated Oct. 10, 2024.
Office Action (including a search report) dated Jan. 12, 2024, of the corresponding Chinese Patent Application No. 202210542006.6.
U.S. Appl. No. 17/824,175, filed May 25, 2022.
Hayato Tsuji, Chem Comm. vol. 50, The hydrogen/deuterium isotope effect of the host material on the lifetime of organic light-emitting diodes.
Chinese Office action and Search Report dated May 31, 2023.
U.S. Patent Office action received in co-pending related U.S. Appl. No. 17/824,175, dated Jun. 23, 2025.
Korean Office action dated Jul. 31, 2025.
U.S. Office action received in co-pending U.S. Appl. No. 17/824,175, dated Dec. 12, 2025.
U.S. Office action received in co-pending U.S. Appl. No. 17/824,175 mailed Apr. 23, 2026.
U.S. Office action received in copending related U.S. Appl. No. 17/824,175 mailed Sep. 17, 2026.

* cited by examiner

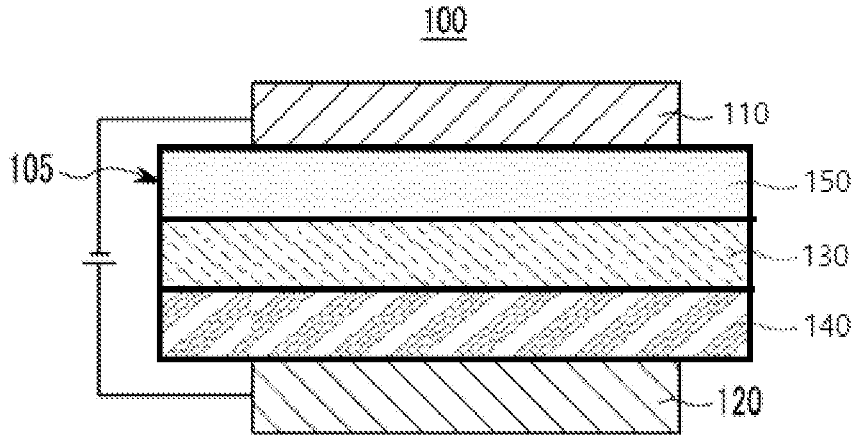
100
110
105
150
130
140
120

COMPOSITION FOR ORGANIC OPTOELECTRONIC DEVICE, ORGANIC OPTOELECTRONIC DEVICE AND DISPLAY DEVICE

CROSS-REFERENCE TO RELATED APPLICATION

This application claims priority to and the benefit of Korean Patent Application No. 10-2021-0064311 filed in the Korean Intellectual Property Office on May 18, 2021, and Korean Patent Application No. 10-2022-0059688 filed in the Korean Intellectual Property Office on May 16, 2022, the entire contents of which are incorporated herein by reference.

BACKGROUND

1. Field

Embodiments relate to a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

An organic optoelectronic device may be classified as follows in accordance with its driving principles. One is a photoelectric device that generates electrical energy by separating excitons formed by light energy into electrons and holes, and transferring the electrons and holes to different electrodes, respectively and the other is light emitting device that generates light energy from electrical energy by supplying voltage or current to the electrodes.

Examples of the organic optoelectronic device may include an organic photoelectric element, an organic light emitting diode, an organic solar cell, and an organic photo conductor drum.

Of these, an organic light emitting diode (OLED) has recently drawn attention due to an increase in demand for flat panel displays. The organic light emitting diode is a device that converts electrical energy into light, and the performance of the organic light emitting diode is greatly influenced by an organic material between electrodes.

SUMMARY

The embodiments may be realized by providing a composition for an organic optoelectronic device, the composition including a first compound represented by Chemical Formula 1, and a second compound represented by Chemical Formula 4,

[Chemical Formula 1]

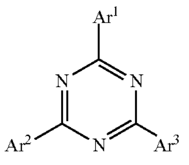

wherein in Chemical Formula 1, $Ar^1$ is a substituted or unsubstituted C6 to C20 aryl group, $Ar^2$ is a group represented by Chemical Formula 2-1, Chemical Formula 2-2, or Chemical Formula 2-3, and $Ar^3$ is a group represented by Chemical Formula 3-1, Chemical Formula 3-2, or Chemical Formula 3-3,

[Chemical Formula 2-1]

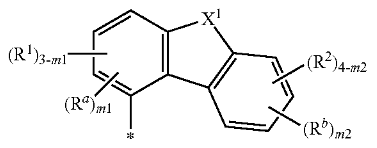

[Chemical Formula 2-2]

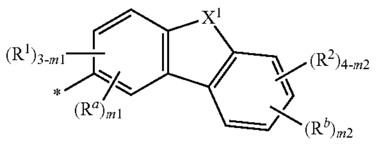

[Chemical Formula 2-3]

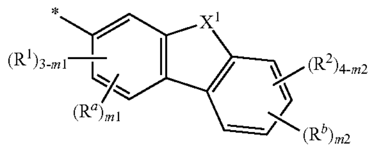

[Chemical Formula 3-1]

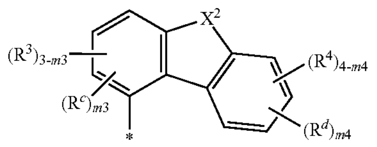

[Chemical Formula 3-2]

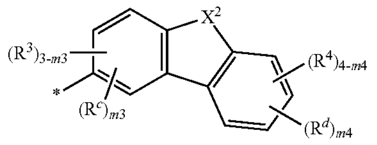

[Chemical Formula 3-3]

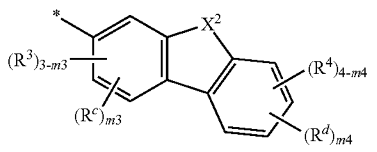

in Chemical Formula 2-1, Chemical Formula 2-2, Chemical Formula 2-3, Chemical Formula 3-1, Chemical Formula 3-2, and Chemical Formula 3-3, $X^1$ and $X^2$ are each independently O or S, $R^1$ to $R^4$ are each independently hydrogen, deuterium, a cyano group, a halogen, a substituted or unsubstituted C1 to C20 alkyl group, or a substituted or unsubstituted C6 to C20 aryl group, $R^a$, $R^b$, $R^c$, and $R^d$ are each independently a substituted or unsubstituted C6 to C20 aryl group that does not include a fused ring, m1 and m3 are each independently an integer of 0 to 3, m2 and m4 are each independently an integer of 0 to 4, and satisfy the following relation: $m1+m2+m3+m4 \geq 1$, and * is a linking point;

[Chemical Formula 4]

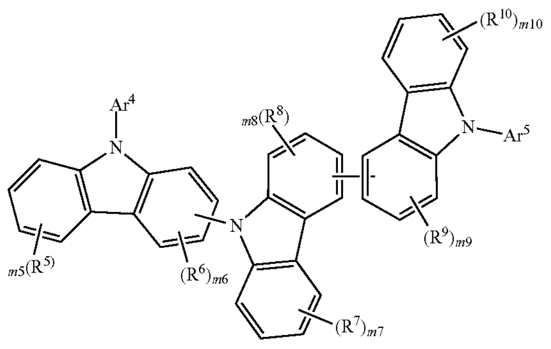

in Chemical Formula 4, $Ar^4$ and $Ar^5$ are each independently a substituted or unsubstituted C6 to C20 aryl group, $R^5$ to $R^{10}$ are each independently hydrogen, deuterium, a cyano group, a halogen, a substituted or unsubstituted C1 to C30 alkyl group, or a substituted or unsubstituted C6 to C30 aryl group, and m5, m7 and m10 are each independently an integer of 1 to 4, m6, m8 and m9 are each independently an integer of 1 to 3.

The embodiments may be realized by providing an organic optoelectronic device including an anode and a cathode facing each other, and at least one organic layer between the anode and the cathode, wherein the at least one organic layer includes a light emitting layer, and the light emitting layer includes the composition for an organic optoelectronic device according to an embodiment.

The embodiments may be realized by providing a display device including the organic optoelectronic device according to an embodiment.

BRIEF DESCRIPTION OF THE DRAWING

Features will be apparent to those of skill in the art by describing in detail exemplary embodiments with reference to the attached drawing, in which:

The FIGURE is a cross-sectional view of an organic light emitting diode according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

In one example of the present disclosure, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof. As used herein, the term "or" is not an exclusive term, e.g., "A or B" would include A, B, or A and B.

In specific example of the present disclosure, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In specific example of the present disclosure, the "substituted" refers to replacement of at least one hydrogen of a substituent or a compound by deuterium, a C1 to C20 alkyl group, a C6 to C30 aryl group, or a cyano group. In specific example of the present disclosure, the "substituted" refers to replacement of at least one hydrogen of a substituent or a compound by deuterium, a C1 to C5 alkyl group, a C6 to C18 aryl group, or a cyano group. In specific example of the present disclosure, the "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, "unsubstituted" refers to hydrogen remaining without substituting to or replacing with any other substituents.

As used herein, "hydrogen substitution (—H)" may also include "deuterium substitution (-D)" or "tritium substitution (-T)".

As used herein, when a definition is not otherwise provided, "hetero" refers to one including one to three heteroatoms selected from N, O, S, P, and Si, and remaining carbons in one functional group.

As used herein, "an aryl group" refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic, or fused ring polycyclic (i.e., rings sharing adjacent pairs of carbon atoms) functional group.

As used herein, "a heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "a heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused.

When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectronic device according to an embodiment is described.

A composition for an organic optoelectronic device according to an embodiment may include, e.g., a first compound represented by Chemical Formula 1, and a second compound represented by Chemical Formula 4.

[Chemical Formula 1]

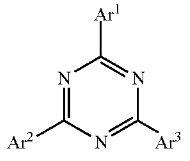

In Chemical Formula 1, $Ar^1$ may be or may include, e.g., a substituted or unsubstituted C6 to C20 aryl group.

$Ar^2$ may be, e.g., a group represented by Chemical Formula 2-1, Chemical Formula 2-2, or Chemical Formula 2-3.

$Ar^3$ may be, e.g., a group represented by Chemical Formula 3-1, Chemical Formula 3-2, or Chemical Formula 3-3.

[Chemical Formula 2-1]

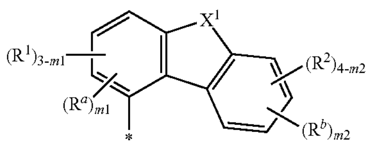

[Chemical Formula 2-2]

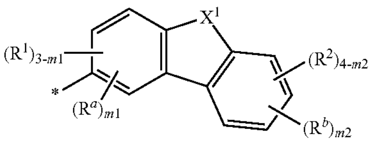

[Chemical Formula 2-3]

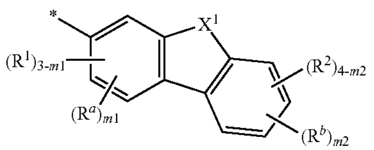

[Chemical Formula 3-1]

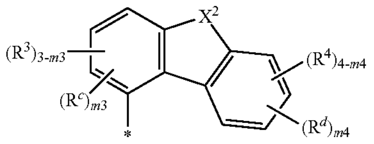

[Chemical Formula 3-2]

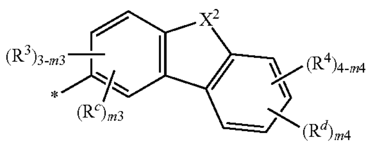

[Chemical Formula 3-3]

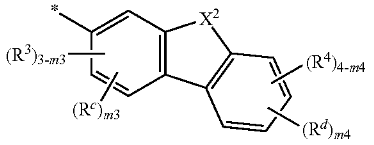

In Chemical Formula 2-1, Chemical Formula 2-2, Chemical Formula 2-3, Chemical Formula 3-1, Chemical Formula 3-2 and Chemical Formula 3-3, $X^1$ and $X^2$ may each independently be, e.g., O or S.

$R^1$ to $R^4$ are each independently hydrogen, deuterium, a cyano group, a halogen, a substituted or unsubstituted C1 to C20 alkyl group, or a substituted or unsubstituted C6 to C20 aryl group.

$R^a$, $R^b$, $R^c$, and $R^d$ may each independently be or include, e.g., a substituted or unsubstituted C6 to C20 aryl group. In an implementation, $R^a$, $R^b$, $R^c$, and $R^d$ may not include a fused ring.

m1 and m3 are each independently an integer of 0 to 3, m2 and m4 are each independently an integer of 0 to 4, and may satisfy the following relation: $m1+m2+m3+m4 \geq 1$.

* is a linking point.

[Chemical Formula 4]

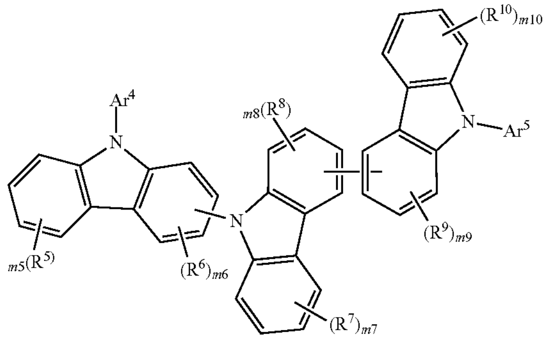

In Chemical Formula 4, $Ar^4$ and $Ar^5$ may each independently be or include, e.g., a substituted or unsubstituted C6 to C20 aryl group.

$R^5$ to $R^{10}$ may each independently be or include, e.g., hydrogen, deuterium, a cyano group, a halogen, a substituted or unsubstituted C1 to C30 alkyl group, or a substituted or unsubstituted C6 to C30 aryl group.

m5, m7 and m10 may each independently be, e.g., an integer of 1 to 4.

m6, m8 and m9 may each independently be, e.g., an integer of 1 to 3.

The first compound may have two dibenzofuran or dibenzothiophene rings as substituents on a center or core of triazine. In an implementation, at least one of the two dibenzofuran or dibenzothiophene rings is necessarily substituted with an aryl group and the aryl group substituted on the dibenzofuran or dibenzothiophene ring may not include a fused aryl group. By having two dibenzofuran or dibenzothiophene rings as substituents on the triazine core, a low-actuation and high-efficiency device may be manufactured due to the effect of improving electron mobility. In addition, at least one of the two dibenzofuran or dibenzothiophene rings is necessarily substituted with an aryl group, and the aryl group substituted on the dibenzofuran or dibenzothiophene ring may not include a fused aryl group. Thereby, a deposition temperature and a glass transition temperature may be finely tuned, and thus, it is possible to synthesize a material having a low deposition temperature and a high glass transition temperature compared to the same molecular weight. The fused aryl group may be an aryl group sharing a carbon-carbon bond (e.g., in which different rings share a carbon-carbon bond), and may refer to an aryl group such as a naphthyl group.

In an implementation, the second compound may have a structure in which a carbazolyl group is substituted at a N-position of a bicarbazole skeleton.

By having a structure in which three carbazoles are linked as described above, compared to other materials having one or two carbazoles, a material with improved hole transport properties may be implemented, thereby lowering the driving voltage. In addition, a balance of electrons and holes is improved, enabling high efficiency and long life-span.

In an implementation, $Ar^2$ in Chemical Formula 1 may be, e.g., a substituent of Group IA or Group II.

$Ar^3$ may be, e.g., a substituent of Group IB or Group III.

In an implementation, $Ar^2$ and $Ar^3$ may not be substituents of Group IA and Group IB, respectively, at the same time. For example, when $Ar^2$ is a substituent of Group IA, $Ar^3$ may not be a substituent of Group IB, and vice versa.

[Group IA]

[Chemical Formula 1-1]

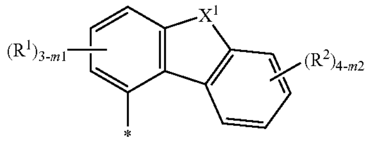

[Chemical Formula 1-2]

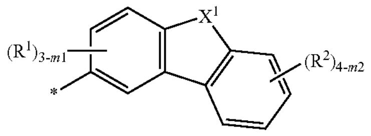

[Chemical Formula 1-3]

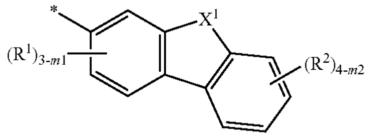

[Group IB]

[Chemical Formula 1-4]

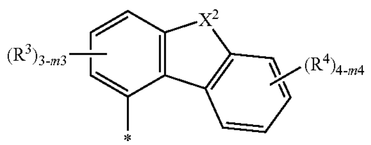

[Chemical Formula 1-5]

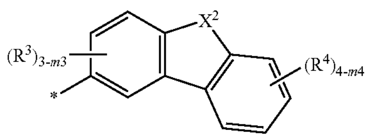

[Chemical Formula 1-6]

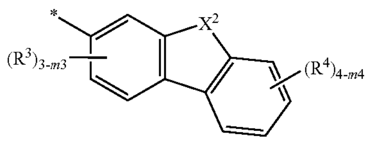

-continued
[Group II]
[Chemical Formula 2-4]
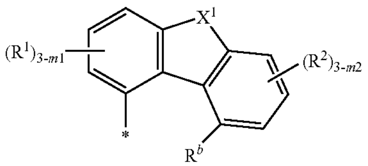
[Chemical Formula 2-5]
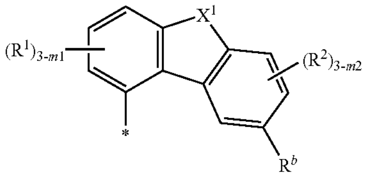
[Chemical Formula 2-6]
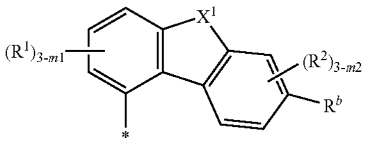
[Chemical Formula 2-7]
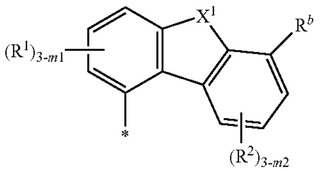
[Chemical Formula 2-8]
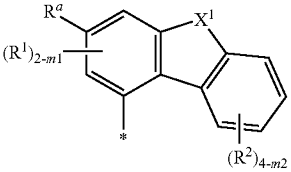
[Chemical Formula 2-9]
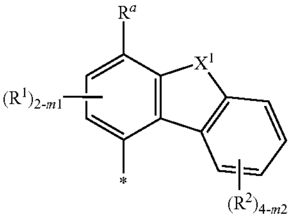
[Chemical Formula 2-10]
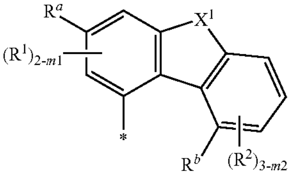
-continued
[Chemical Formula 2-11]
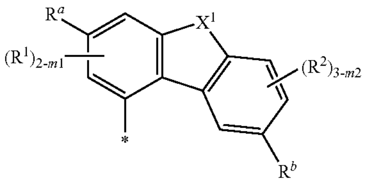
[Chemical Formula 2-12]
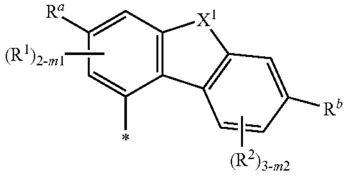
[Chemical Formula 2-13]
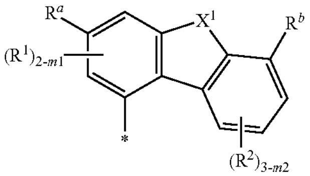
[Chemical Formula 2-14]
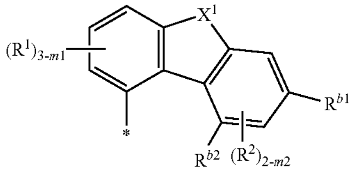
[Chemical Formula 2-15]
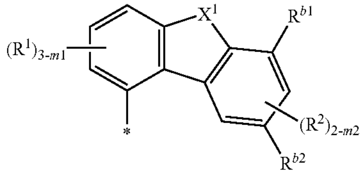
[Chemical Formula 2-16]
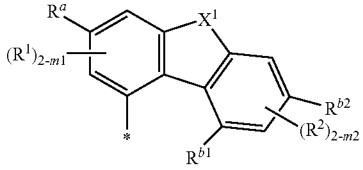
[Chemical Formula 2-17]
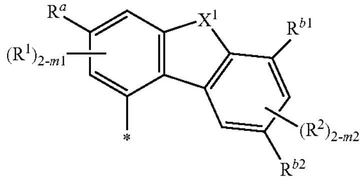
[Chemical Formula 2-18]
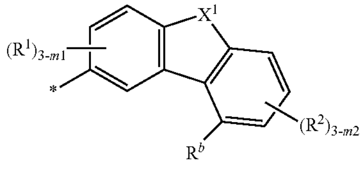

-continued
[Chemical Formula 2-19]
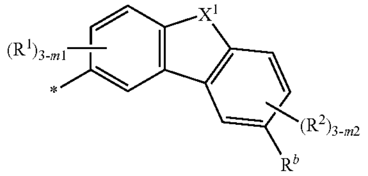
[Chemical Formula 2-20]
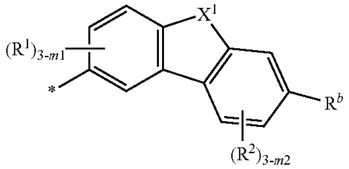
[Chemical Formula 2-21]
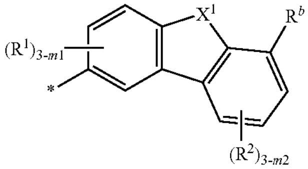
[Chemical Formula 2-22]
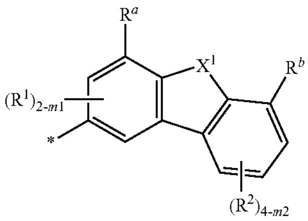
[Chemical Formula 2-23]
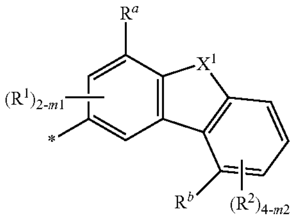
[Chemical Formula 2-24]
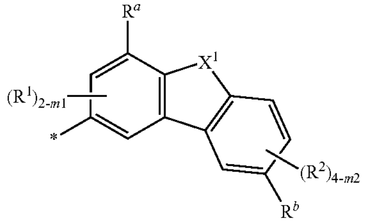
[Chemical Formula 2-25]
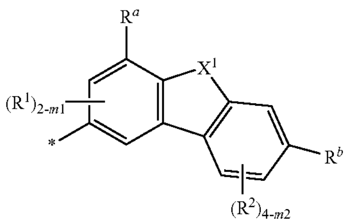
-continued
[Chemical Formula 2-26]
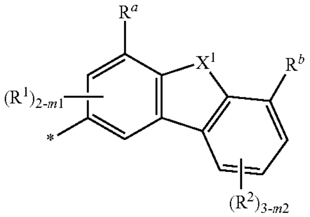
[Chemical Formula 2-27]
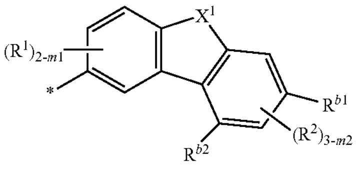
[Chemical Formula 2-28]
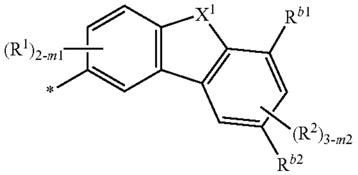
[Chemical Formula 2-29]
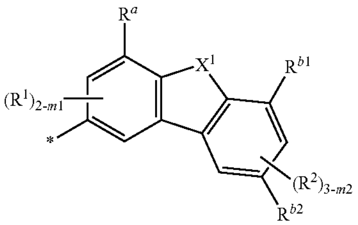
[Chemical Formula 2-30]
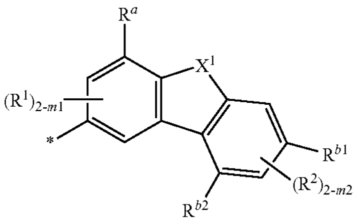
[Chemical Formula 2-31]
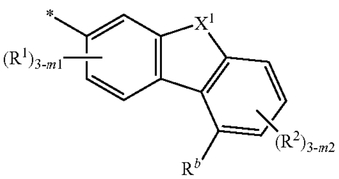
[Chemical Formula 2-32]
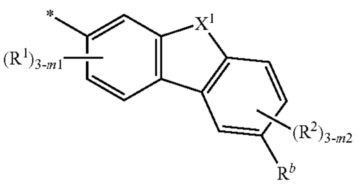

-continued
[Chemical Formula 2-33]
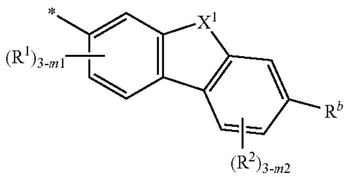
[Chemical Formula 2-34]
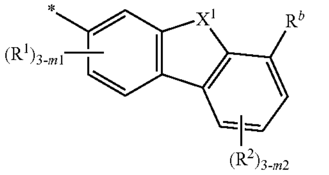
[Chemical Formula 2-35]
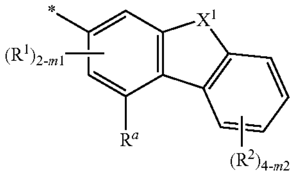
[Chemical Formula 2-36]
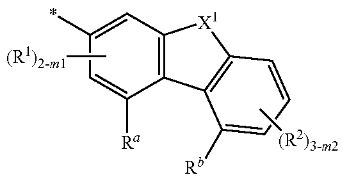
[Chemical Formula 2-37]
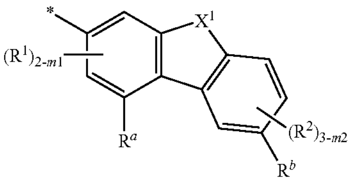
[Chemical Formula 2-38]
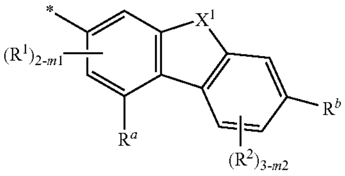
[Chemical Formula 2-39]
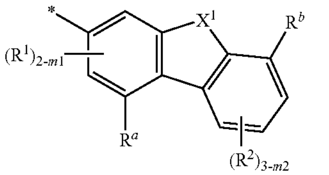
[Chemical Formula 2-40]
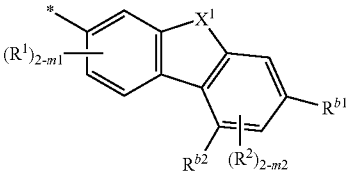
-continued
[Chemical Formula 2-41]
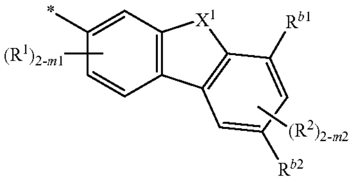
[Chemical Formula 2-42]
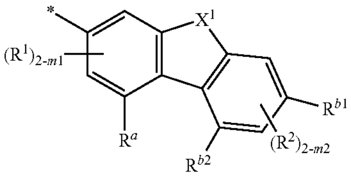
[Chemical Formula 2-43]
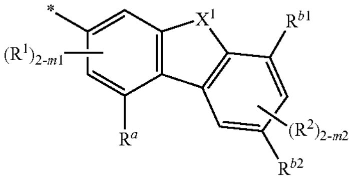
[Group III]
[Chemical Formula 3-4]
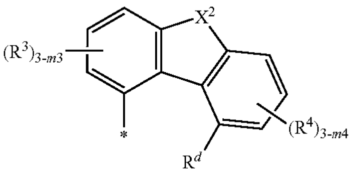
[Chemical Formula 3-5]
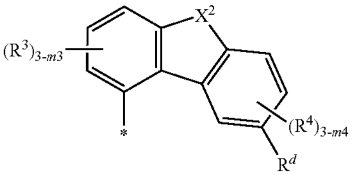
[Chemical Formula 3-6]
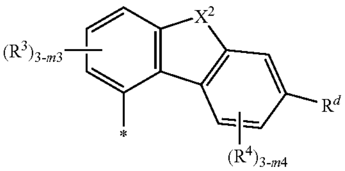
[Chemical Formula 3-7]
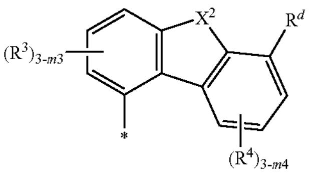
[Chemical Formula 3-8]
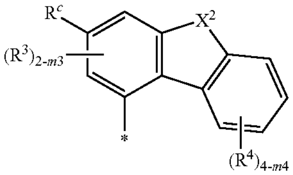

-continued
[Chemical Formula 3-9]
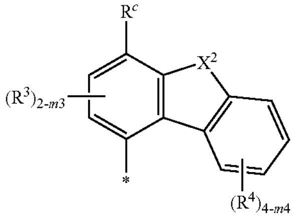
[Chemical Formula 3-10]
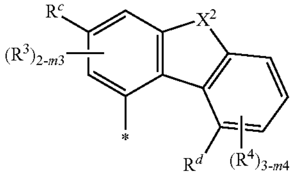
[Chemical Formula 3-11]
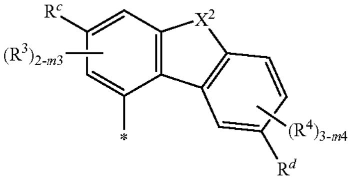
[Chemical Formula 3-12]
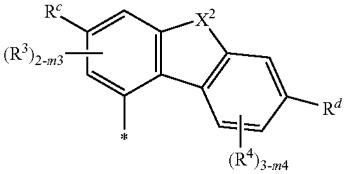
[Chemical Formula 3-13]
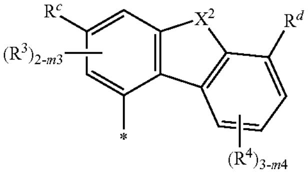
[Chemical Formula 3-14]
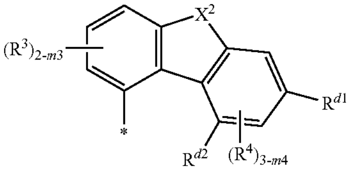
[Chemical Formula 3-15]
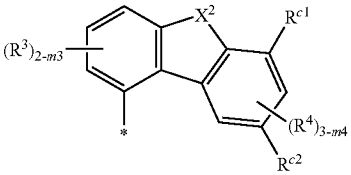
[Chemical Formula 3-16]
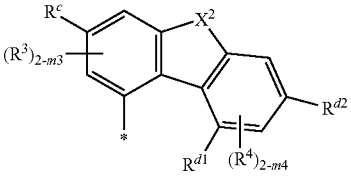
-continued
[Chemical Formula 3-17]
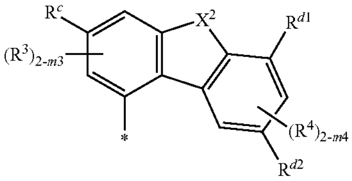
[Chemical Formula 3-18]
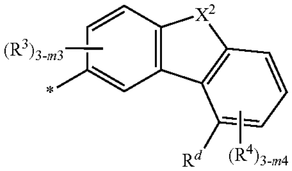
[Chemical Formula 3-19]
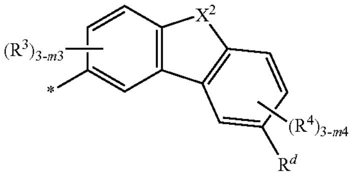
[Chemical Formula 3-20]
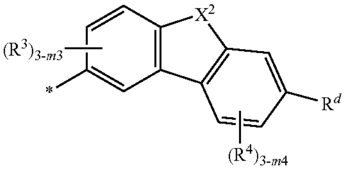
[Chemical Formula 3-21]
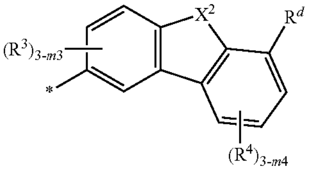
[Chemical Formula 3-22]
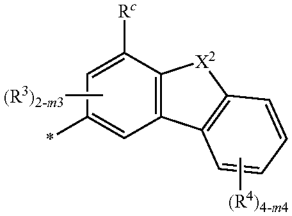
[Chemical Formula 3-23]
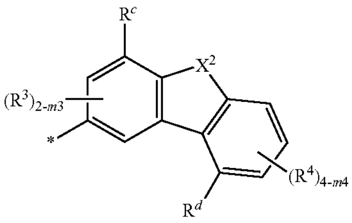

-continued
[Chemical Formula 3-24]
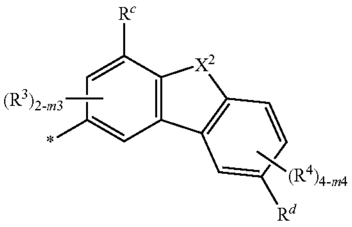
[Chemical Formula 3-25]
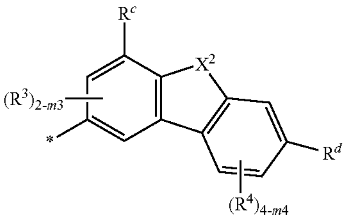
[Chemical Formula 3-26]
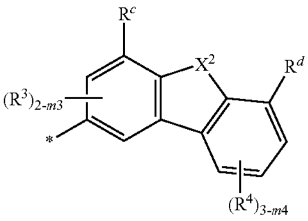
[Chemical Formula 3-27]
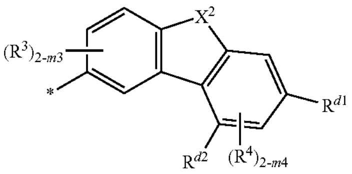
[Chemical Formula 3-28]
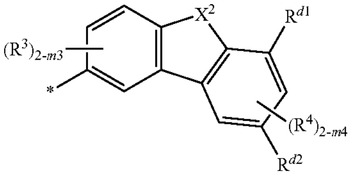
[Chemical Formula 3-29]
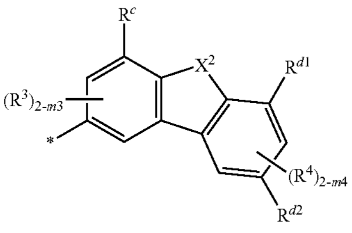
[Chemical Formula 3-30]
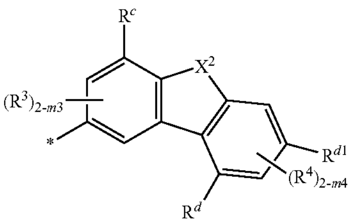
-continued
[Chemical Formula 3-31]
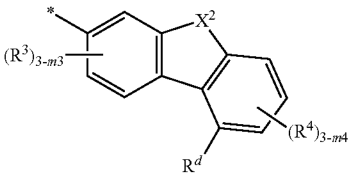
[Chemical Formula 3-32]
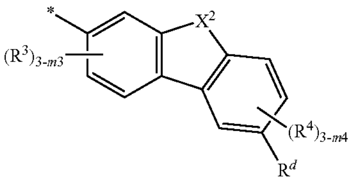
[Chemical Formula 3-33]
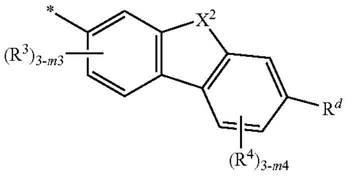
[Chemical Formula 3-34]
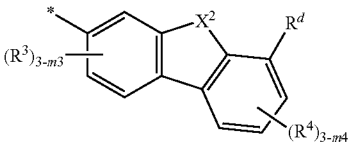
[Chemical Formula 3-35]
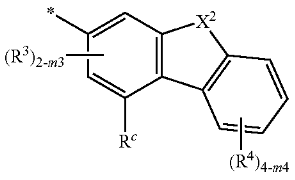
[Chemical Formula 3-36]
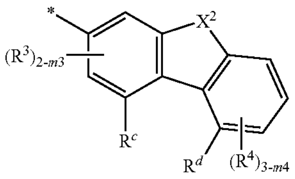
[Chemical Formula 3-37]
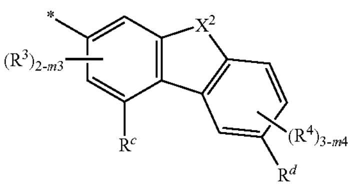
[Chemical Formula 3-38]
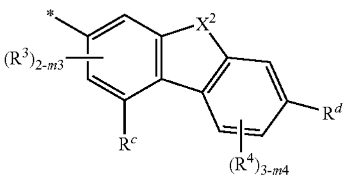

-continued

[Chemical Formula 3-39]

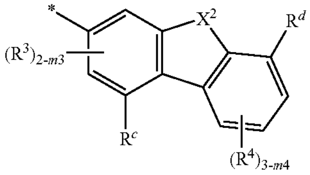

[Chemical Formula 3-40]

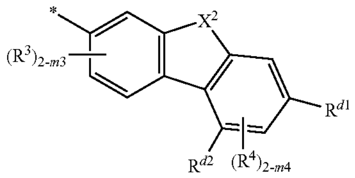

[Chemical Formula 3-41]

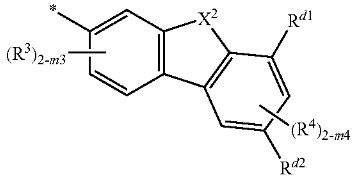

[Chemical Formula 3-42]

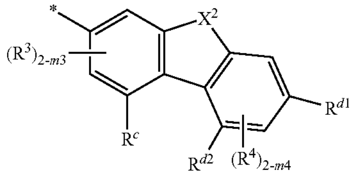

[Chemical Formula 3-43]

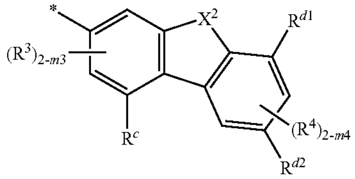

In Group IA, Group IB, Group II, and Group III, $X^1$, $X^2$, $R^1$ to $R^4$, $R^aR^b$, $R^c$, and $R^d$ may be defined the same as those described above (e.g., in Chemical Formula 1).

$R^{b1}$, $R^{b2}$, $R^{d1}$, and $R^{d2}$ may each independently be, e.g., a substituted or unsubstituted C6 to C20 aryl group. In an implementation, $R^{b1}$, $R^{b2}$, $R^{d1}$ and $R^{d2}$ may not be or include a fused ring.

* is a linking point.

In an implementation, m1 to m4 may each independently be 0 or 1, and may satisfy the following relation: 1≤m1+m2+m3+m4≤3.

In an implementation, $R^a$, $R^b$, $R^{b1}$, $R^{b2}$, $R^c$, $R^d$, $R^{d1}$, and $R^{d2}$ may each independently be, e.g., a substituted or unsubstituted C6 to C12 aryl group.

In an implementation, $R^a$, $R^b$, $R^{b1}$, $R^{b2}$, $R^c$, $R^d$, $R^{d1}$, and $R^{d2}$ may each independently be, e.g., a substituted or unsubstituted phenyl group or a substituted or unsubstituted biphenyl group.

In an implementation, each of $R^a$, $R^b$, $R^{b1}$, $R^{b2}$, $R^c$, $R^d$, $R^{d1}$ and $R^{d2}$ may independently be, e.g., a substituent of Group IV.

[Group IV]

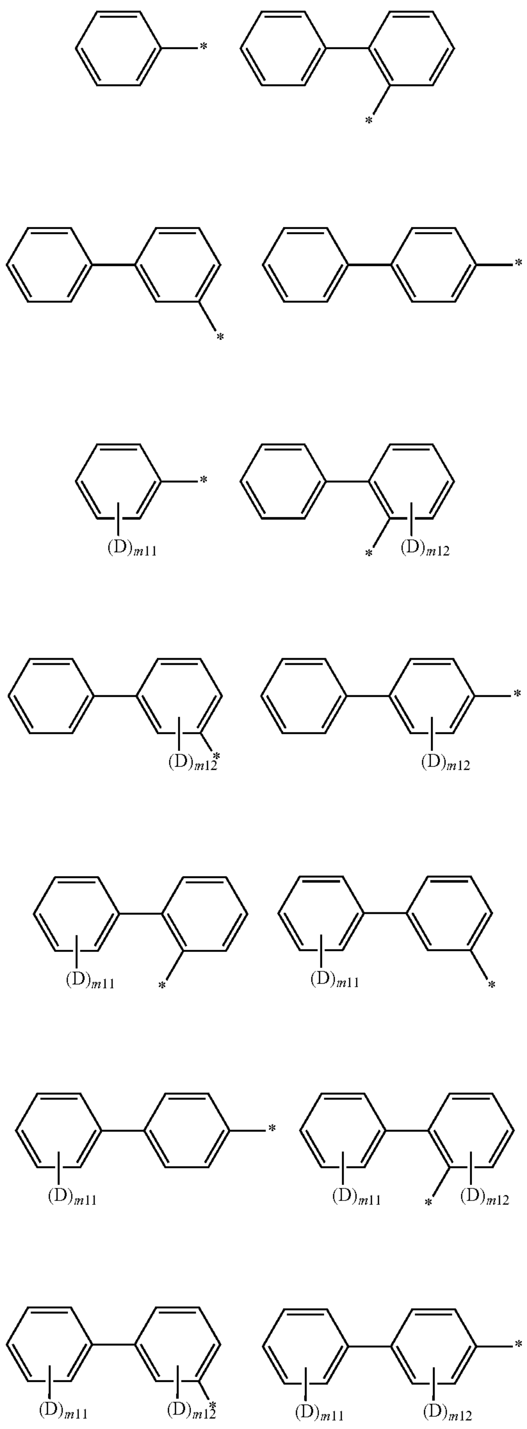

In Group IV, D is deuterium.

m11 may be, e.g., an integer of 1 to 5.

m12 may be, e.g., an integer of 1 to 4.

* is a linking point.

In an implementation, $Ar^1$ may be, e.g., a substituted or unsubstituted C6 to C18 aryl group.

In an implementation, $Ar^1$ may be, e.g., a substituted or unsubstituted phenyl group, a substituted or unsubstituted biphenyl group, or a substituted or unsubstituted terphenyl group.

In an implementation, the first compound may be a compound of Group 1.
[Group 1]
1
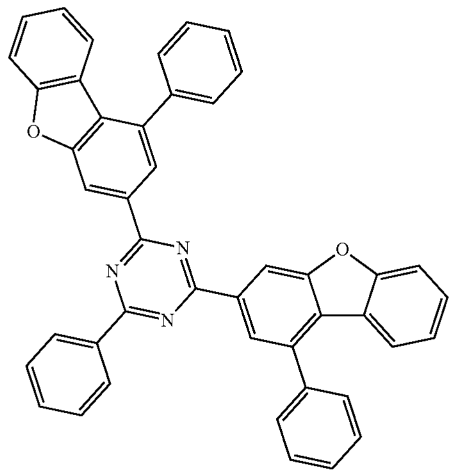
2
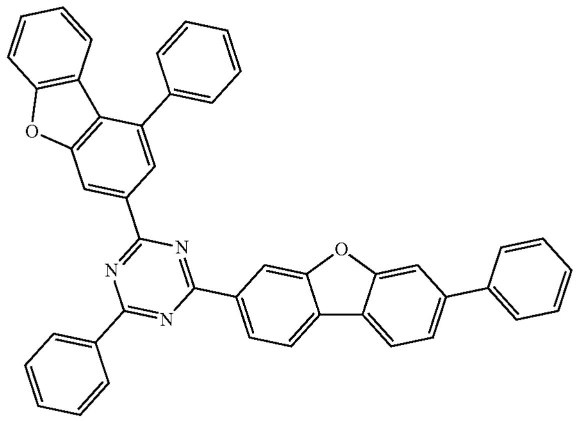
3
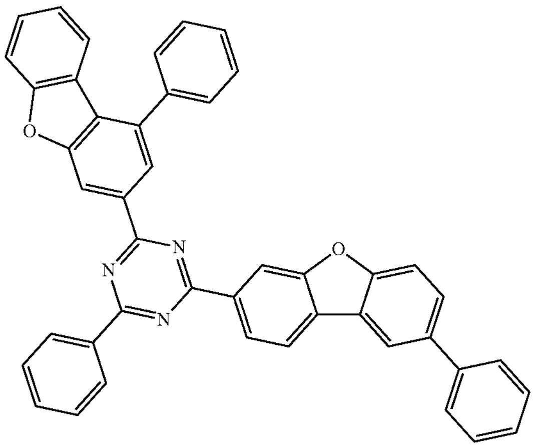
-continued
4
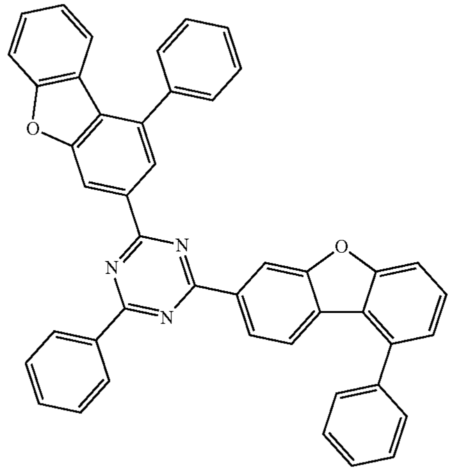
5
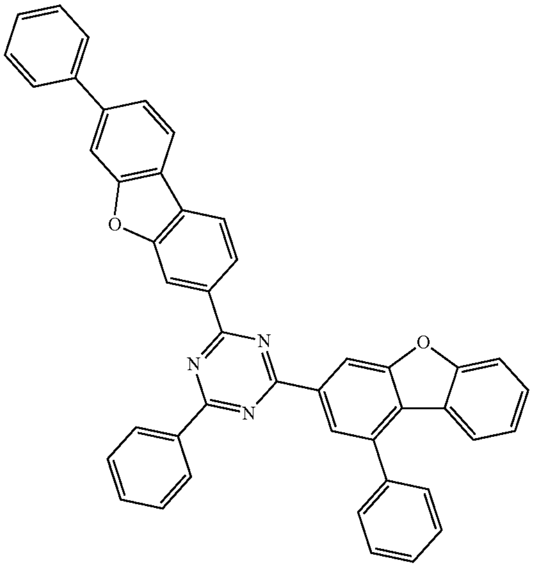
6
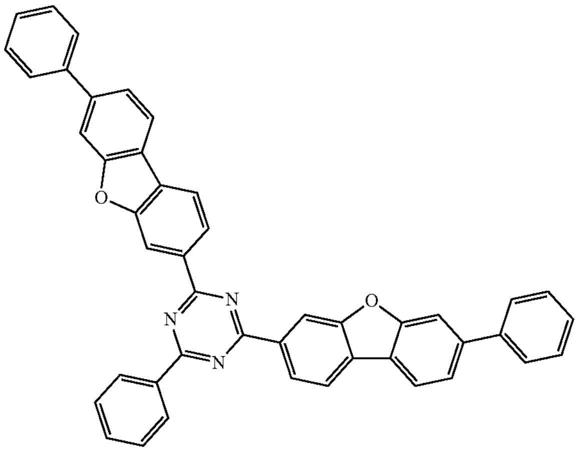

7
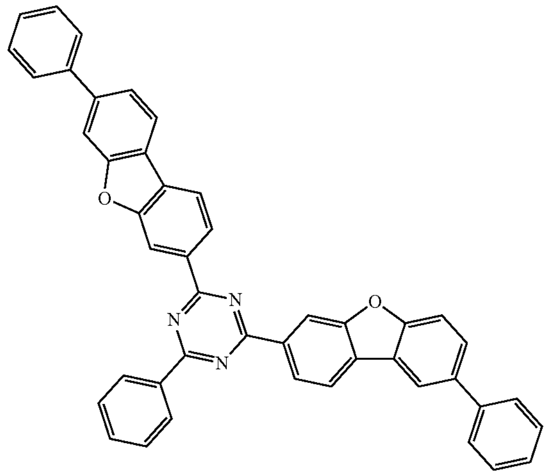
8
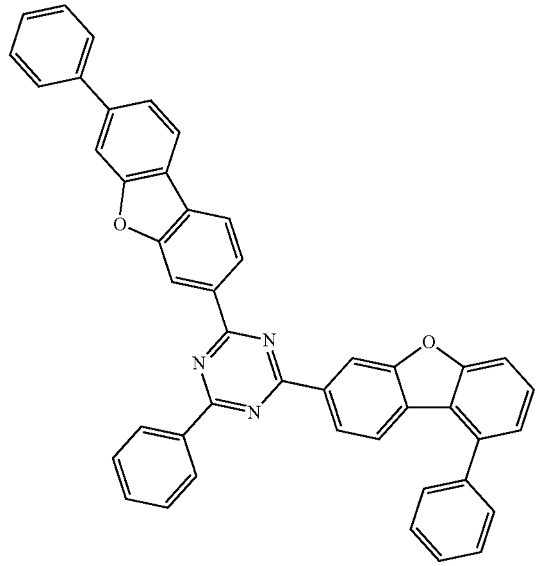
9
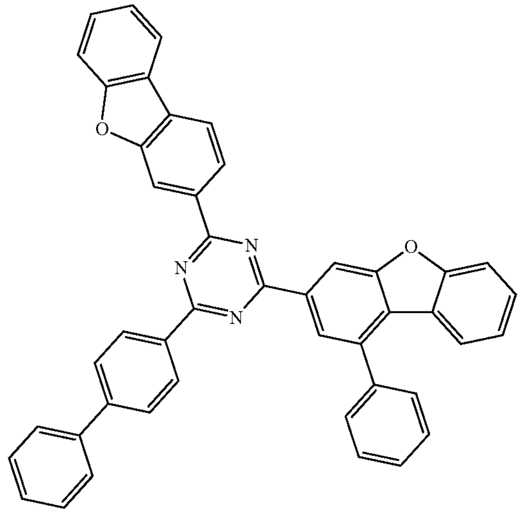
10
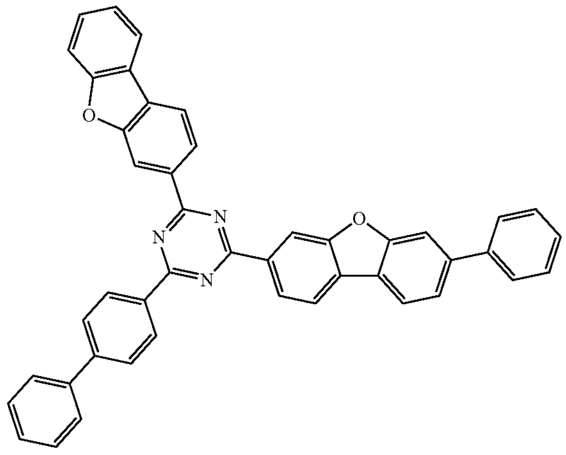
11
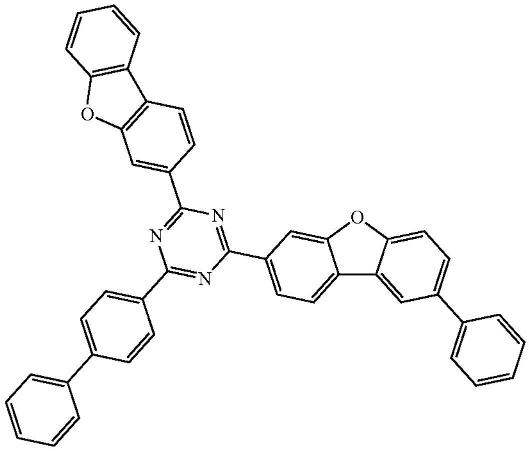
12
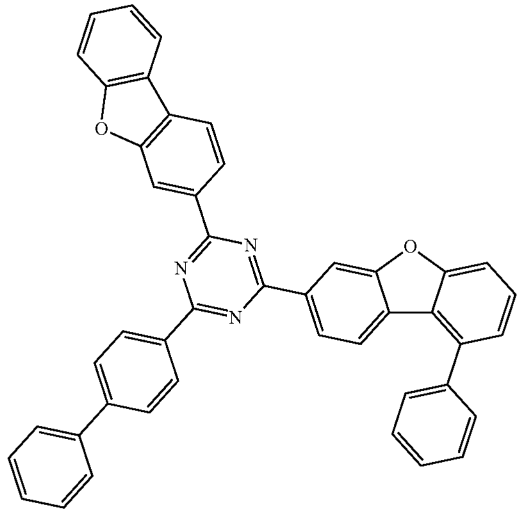

-continued
13
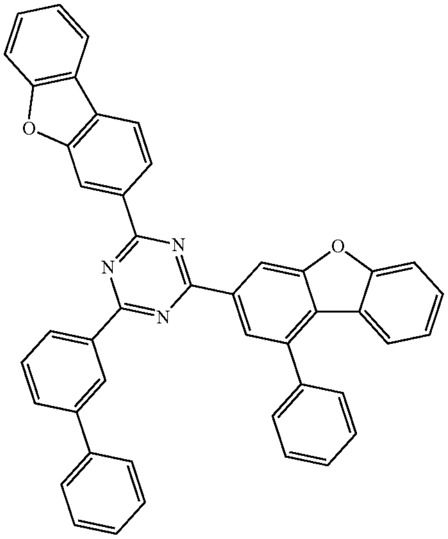
14
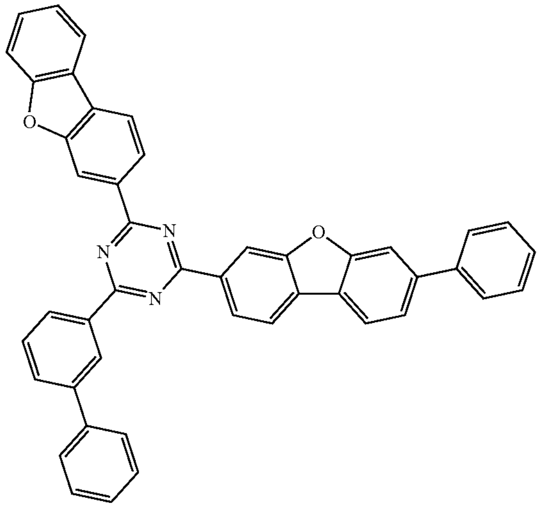
15
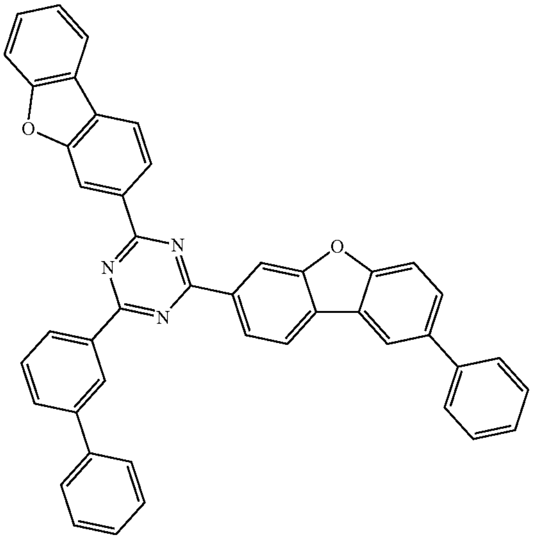
-continued
16
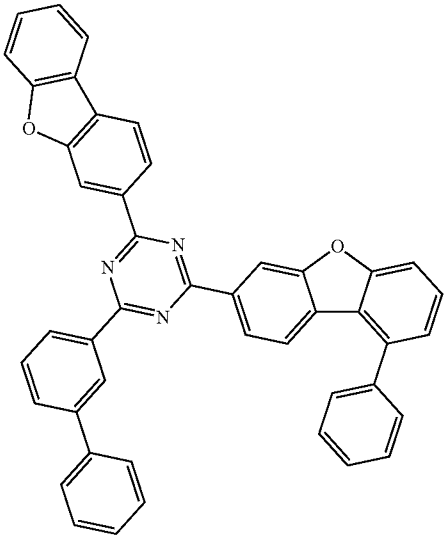
17
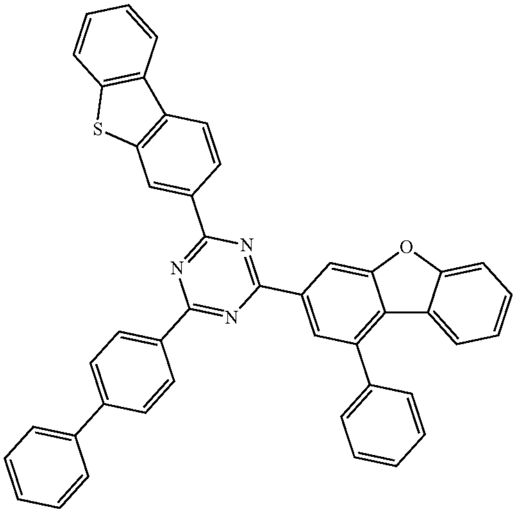
18
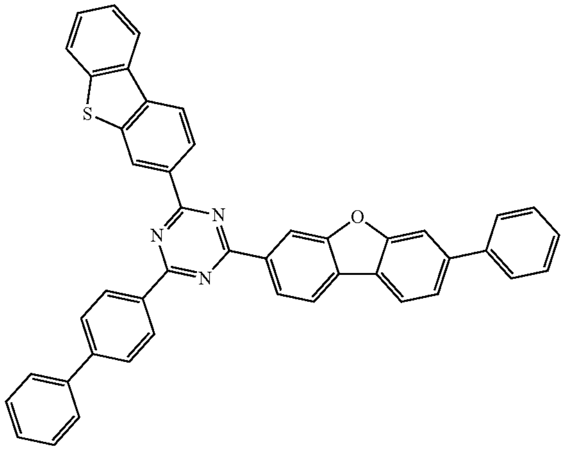

-continued
19
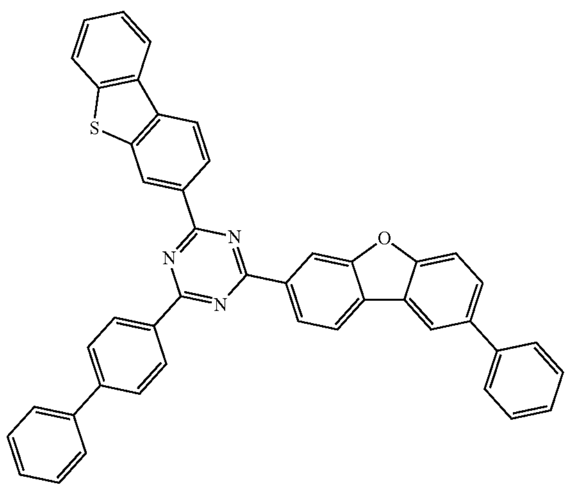
20
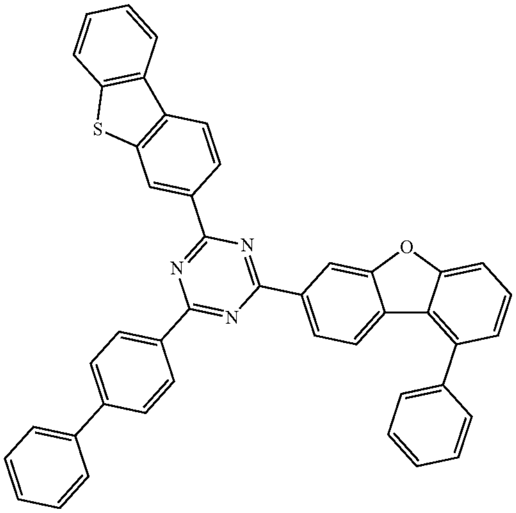
21
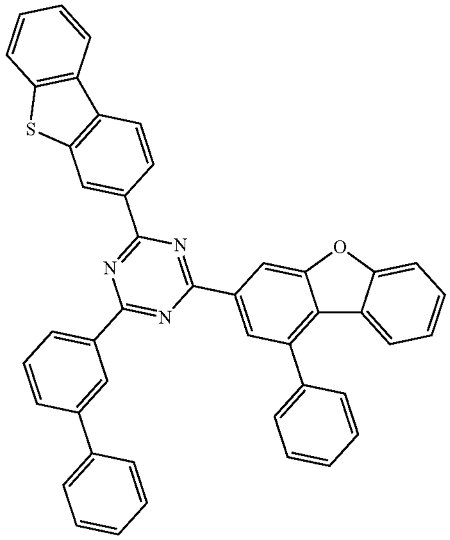
-continued
22
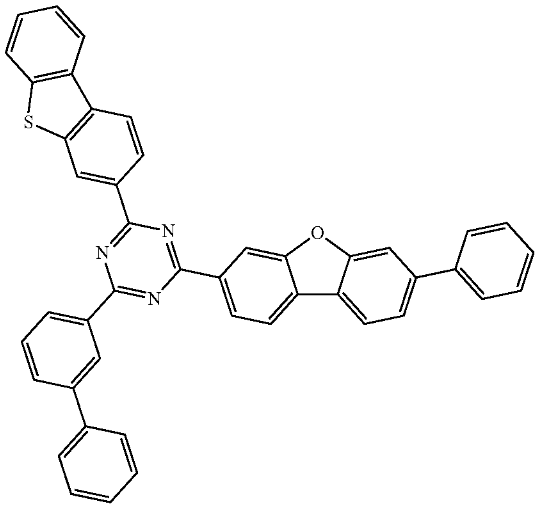
23
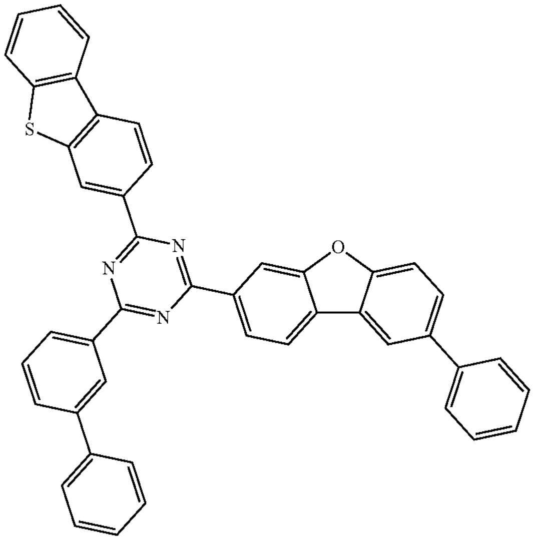
24
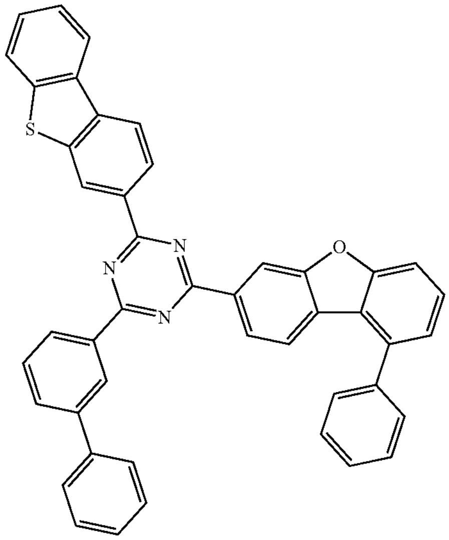

-continued
25
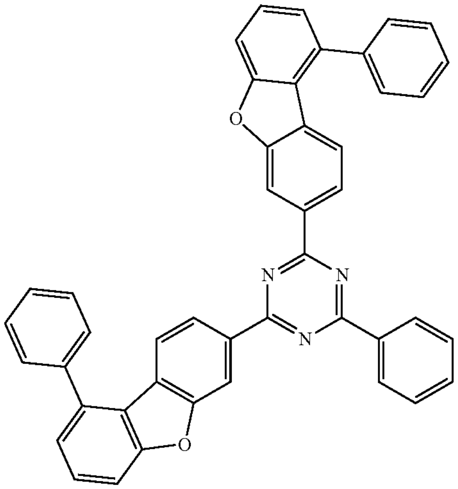
26
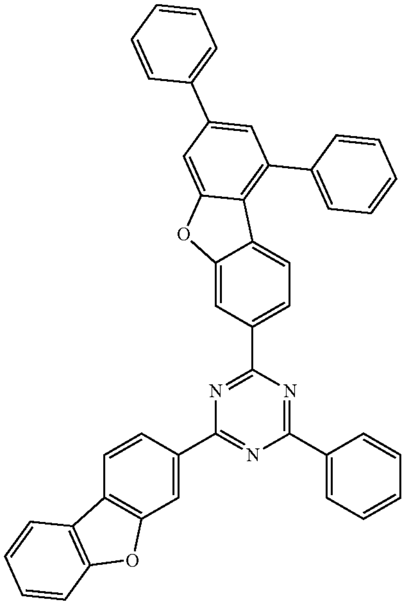
27
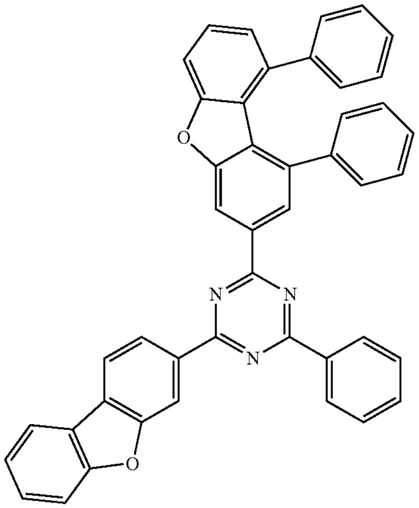
-continued
28
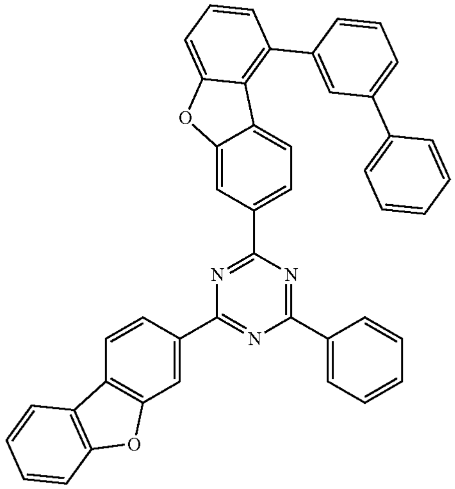
29
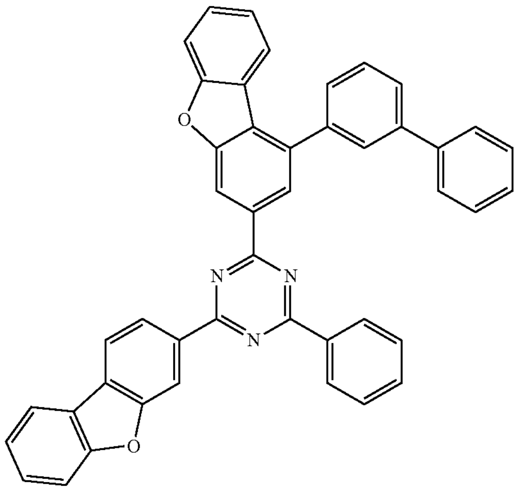
30
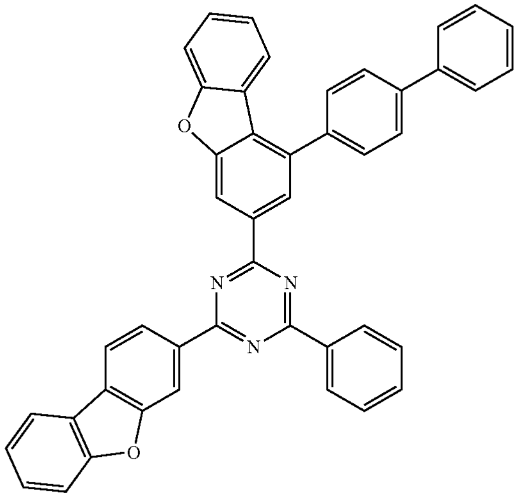

-continued
31
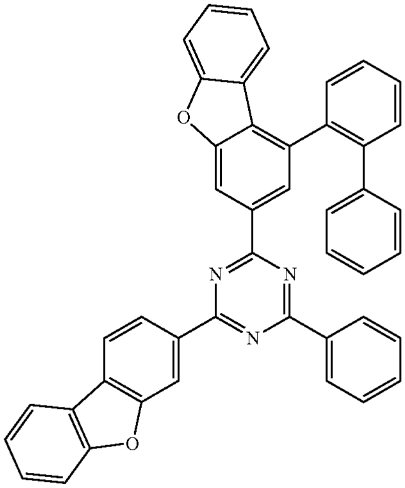
32
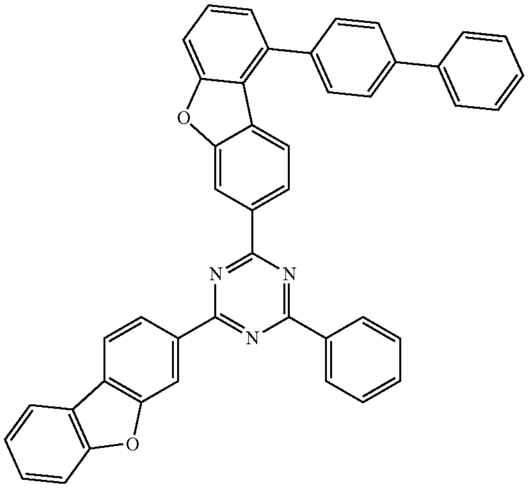
33
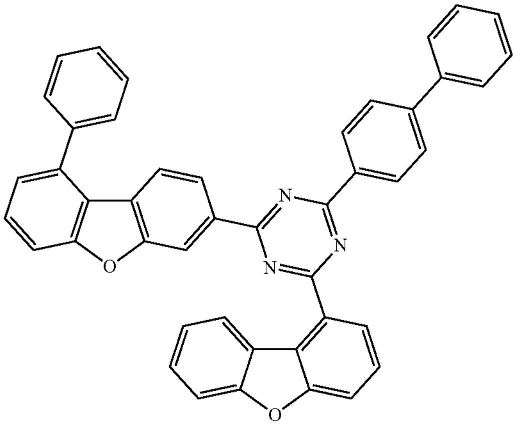
-continued
34
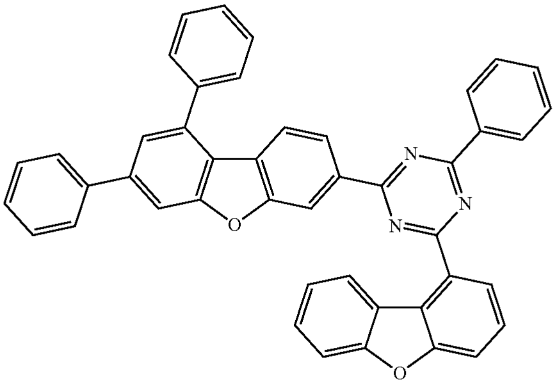
35
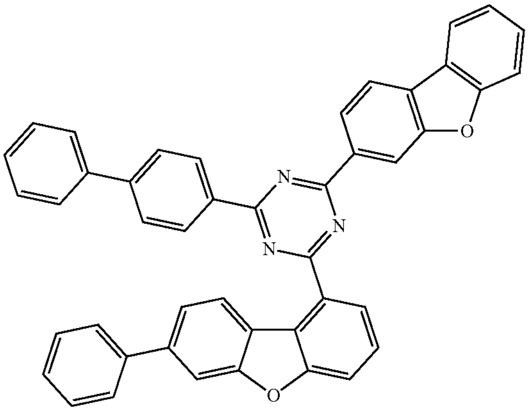
36
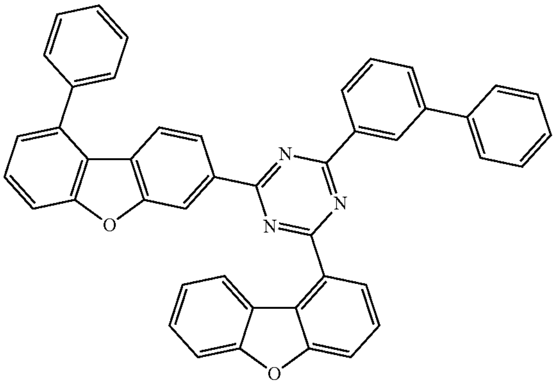
37
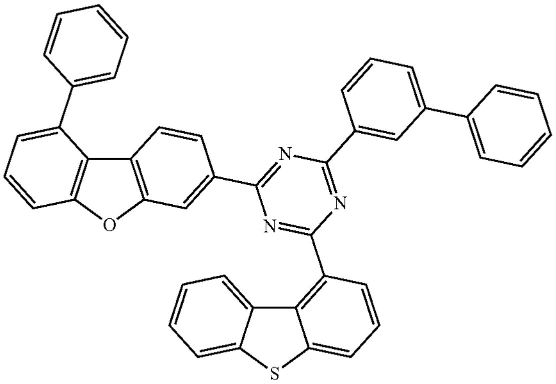

-continued
38
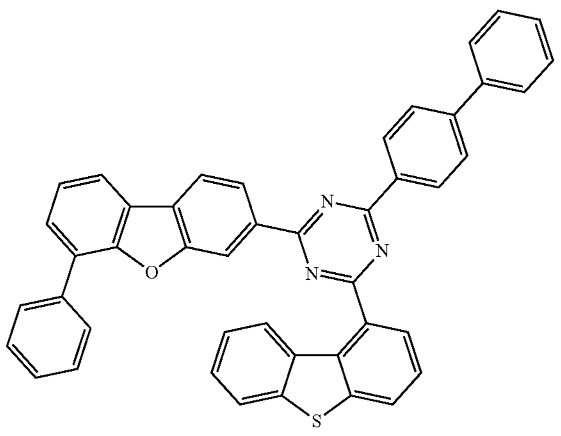
39
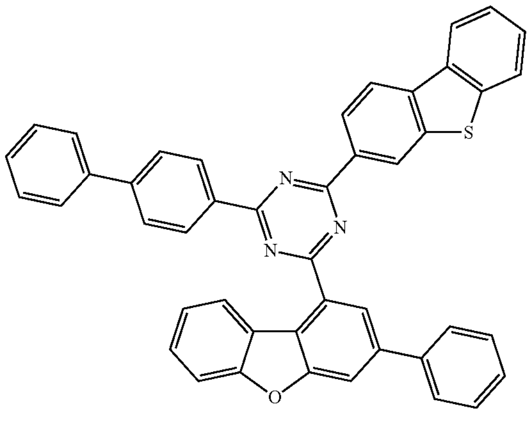
40
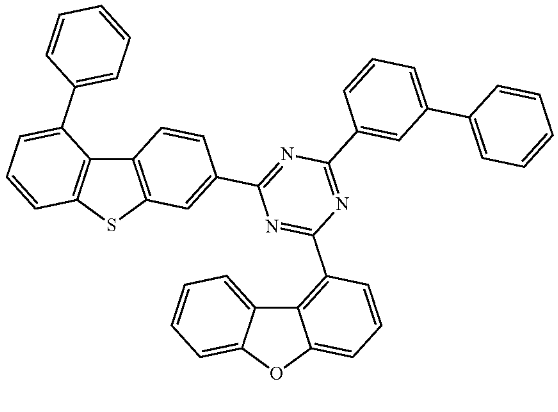
-continued
41
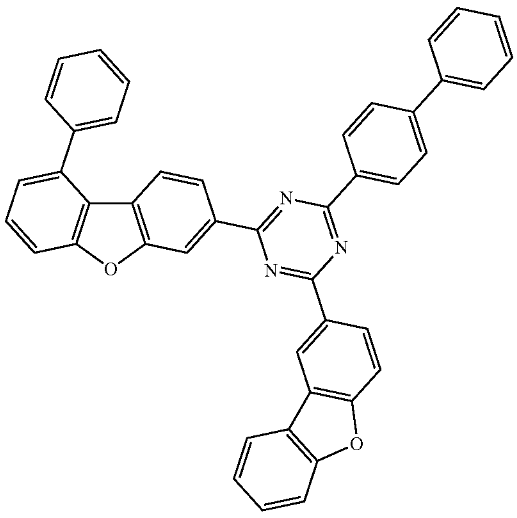
42
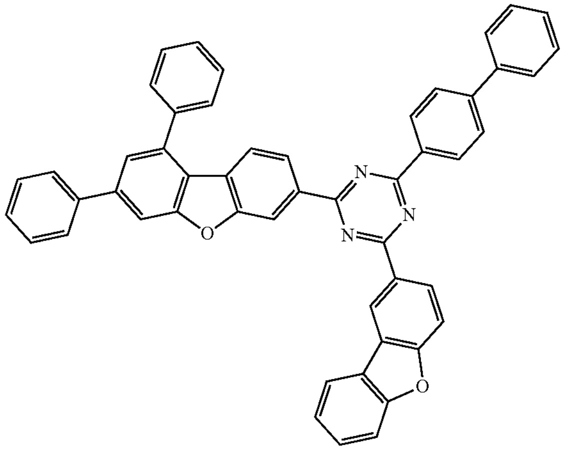
43
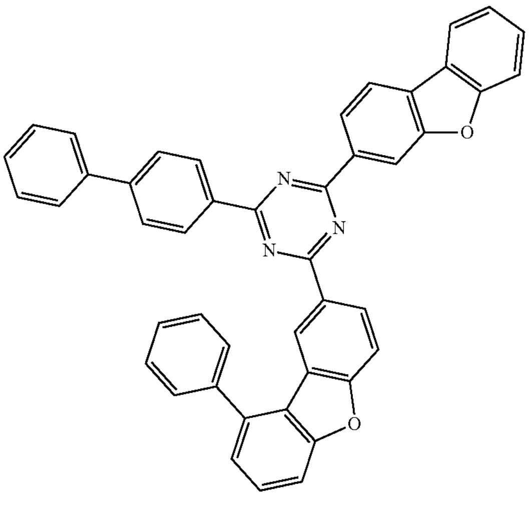

-continued
44
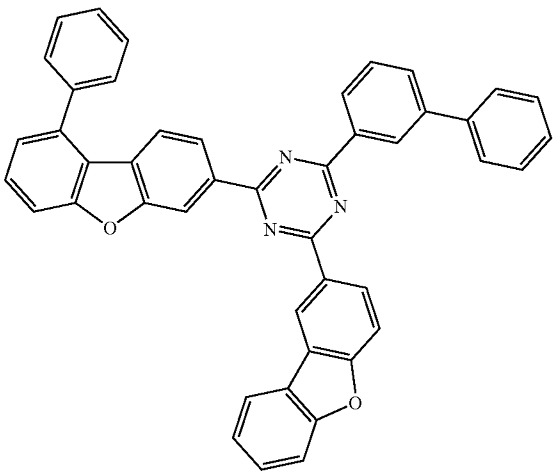
45
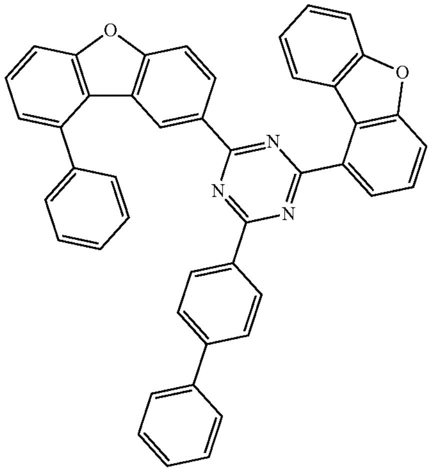
46
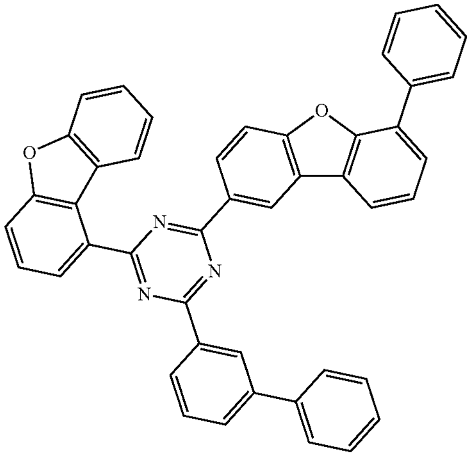
-continued
47
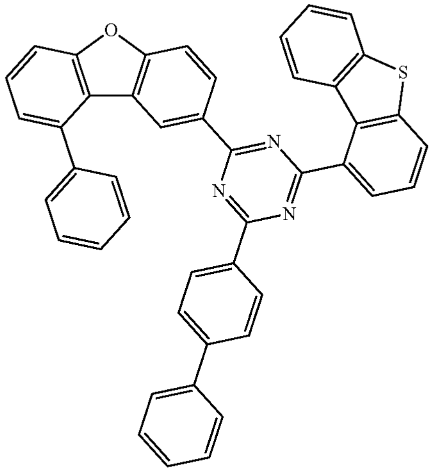
48
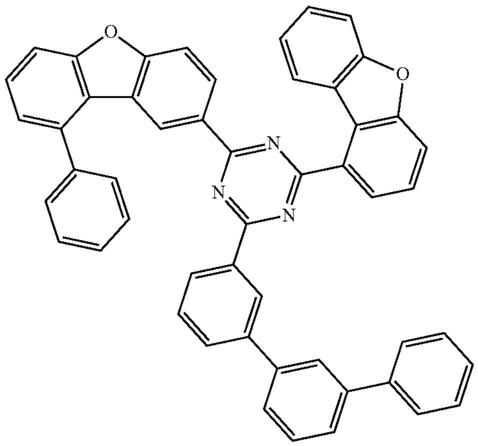
49
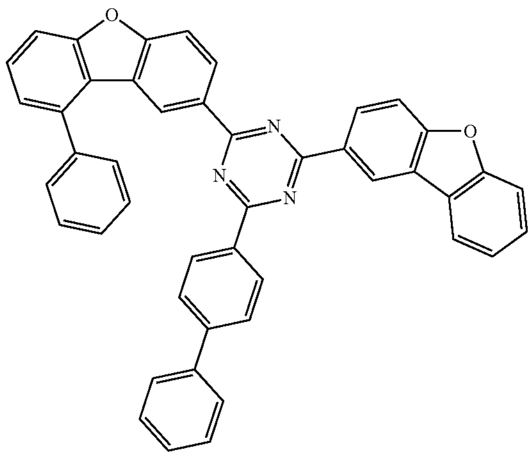

-continued
50
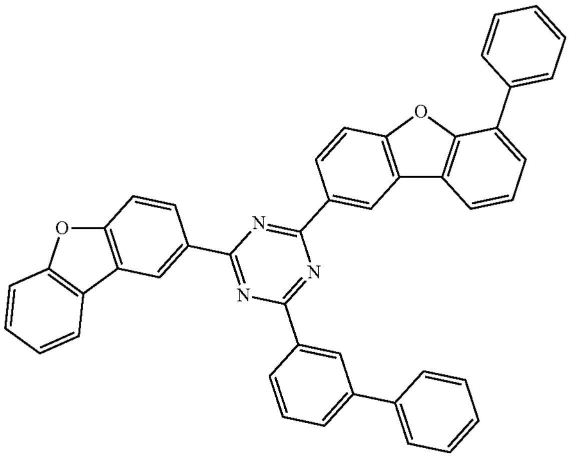
51
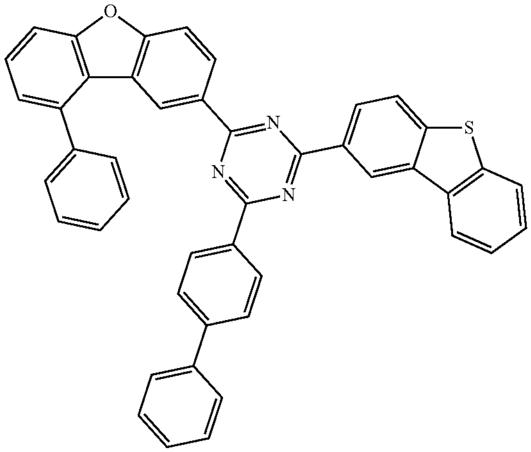
52
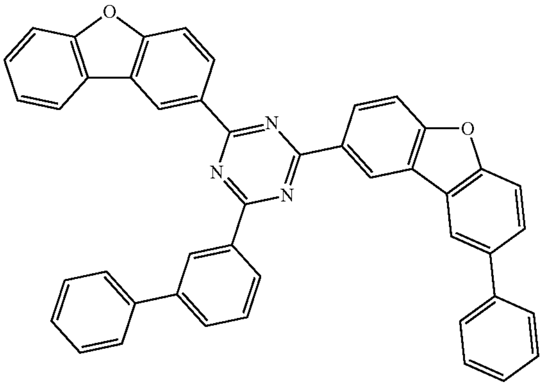
-continued
53
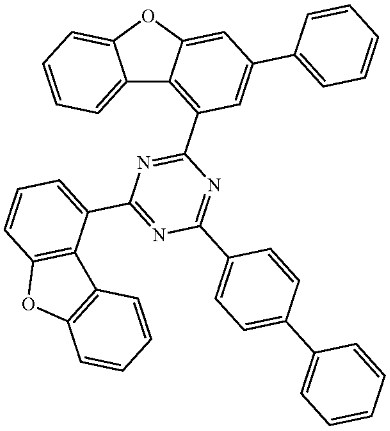
54
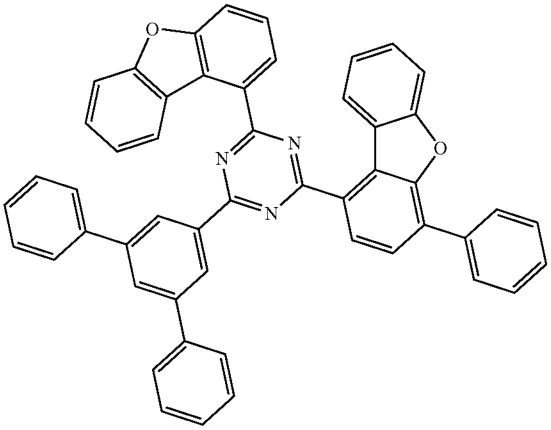
55
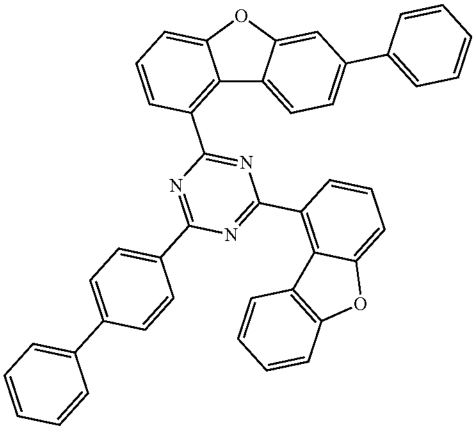

-continued
56
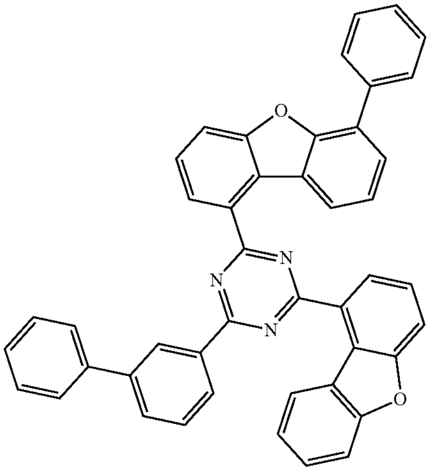
57
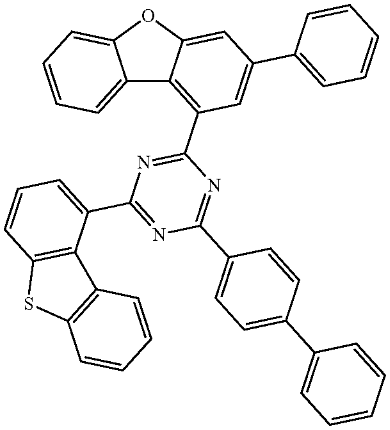
58
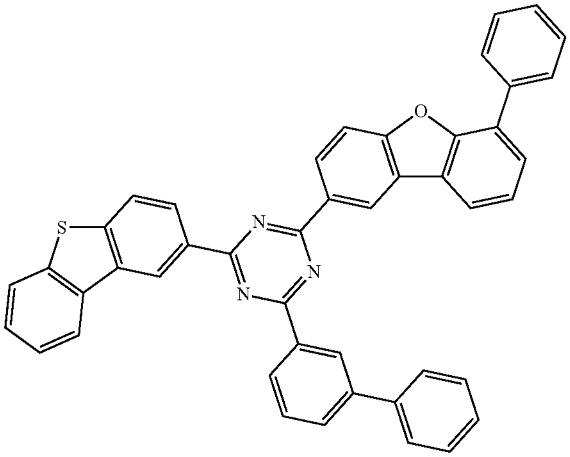
-continued
59
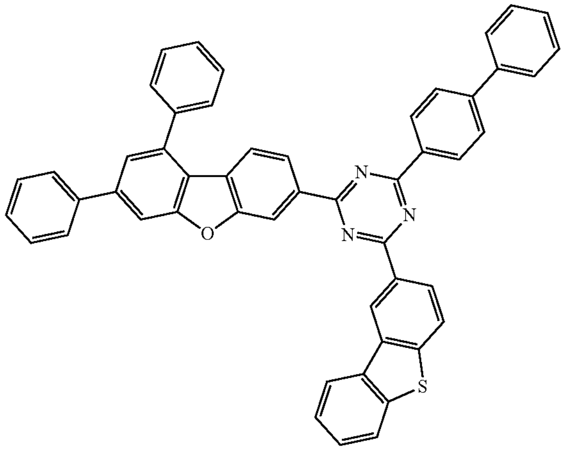
60
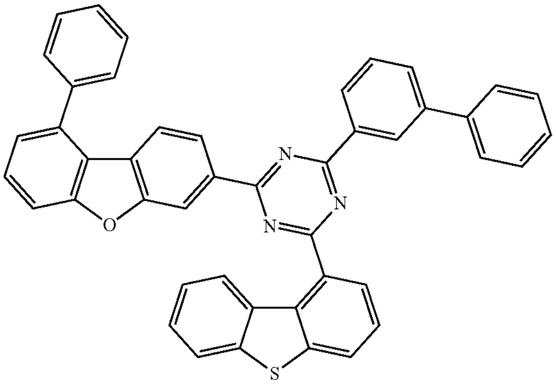
61
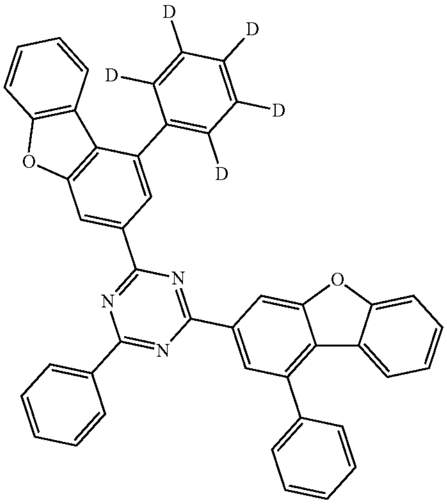

-continued
62
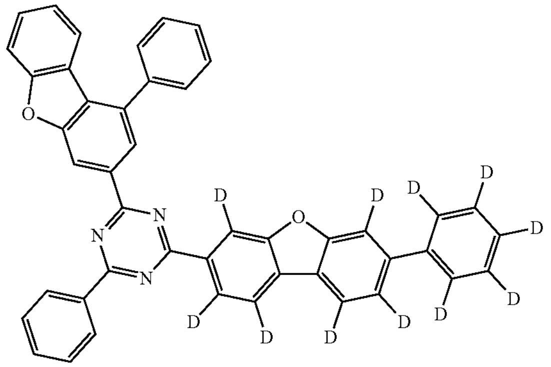
63
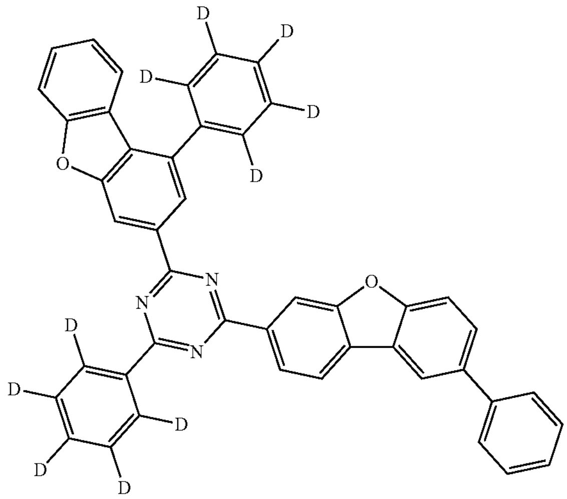
64
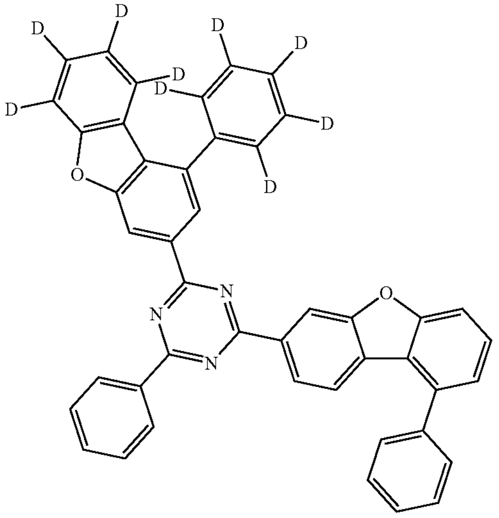
-continued
65
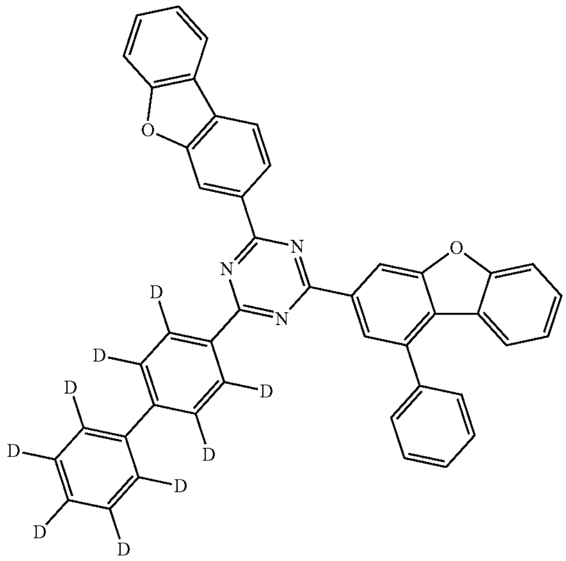
66
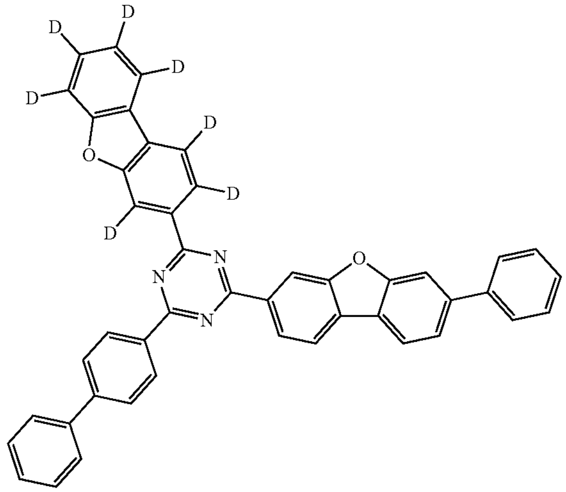
67
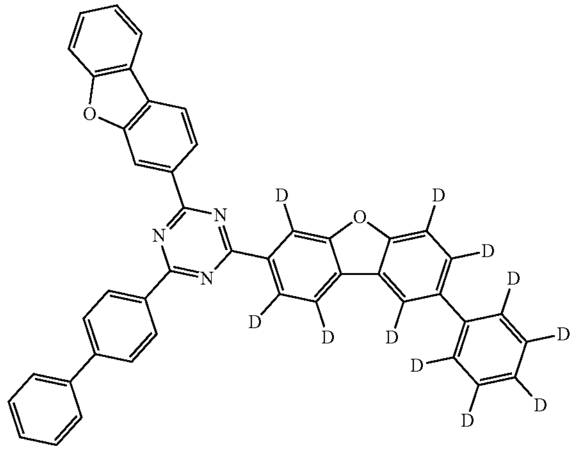

-continued
68
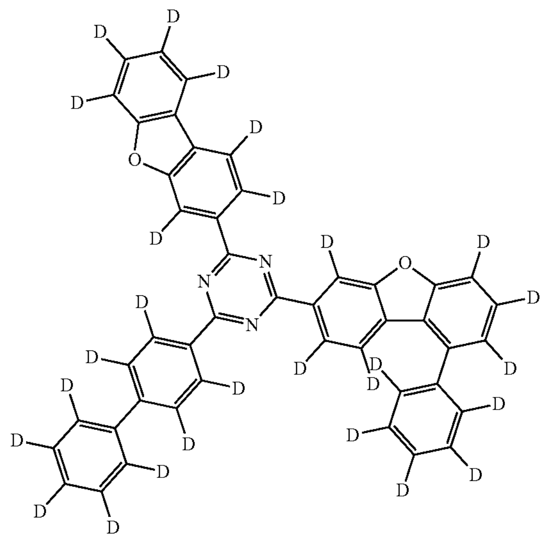
69
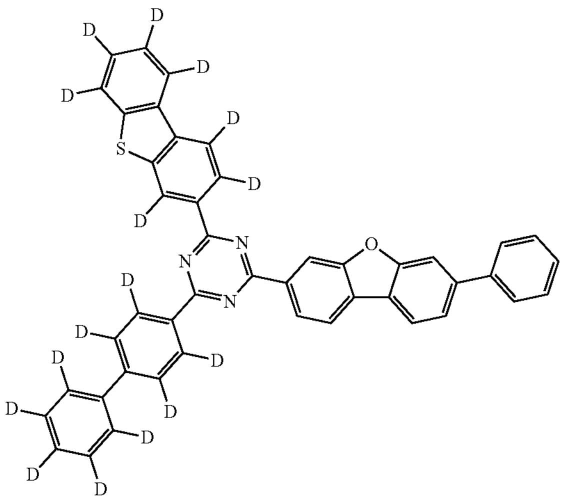
70
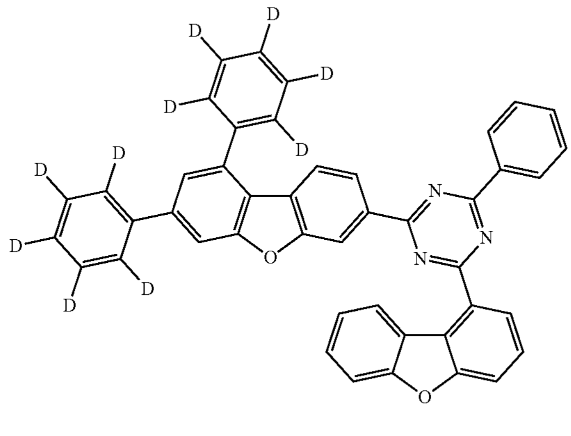
-continued
71
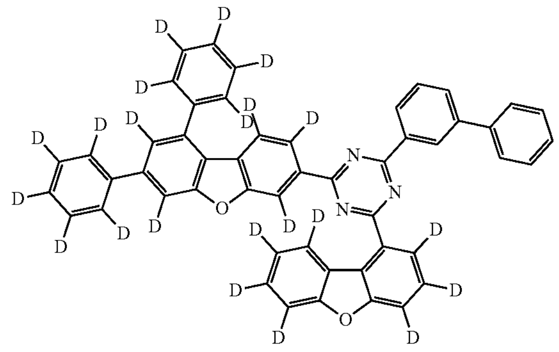
72
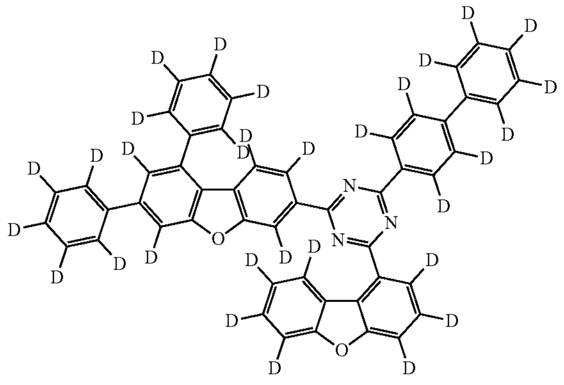
In an implementation, the second compound represented by Chemical Formula 4 may be, e.g., a compound of the Chemical Formulae of Group V.
[Group V]
[Chemical Formula 4-1]
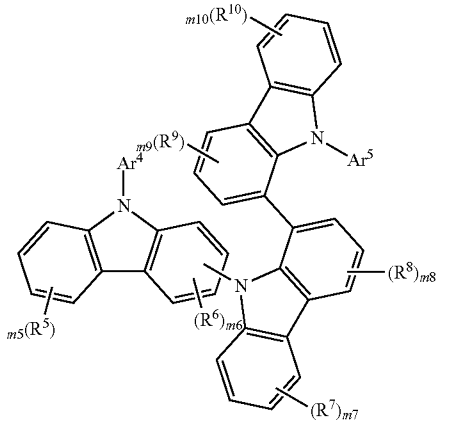

-continued
[Chemical Formula 4-2]
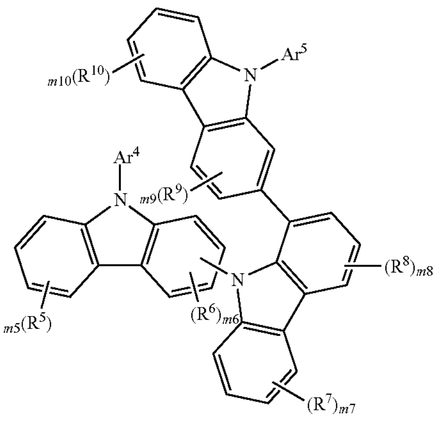
[Chemical Formula 4-3]
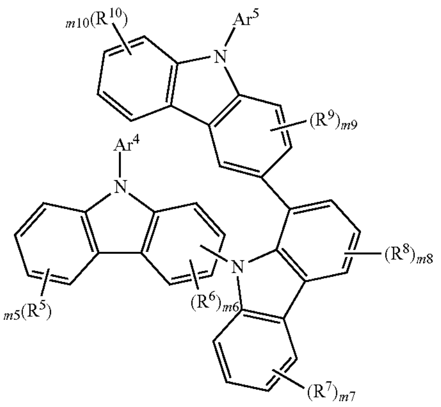
[Chemical Formula 4-4]
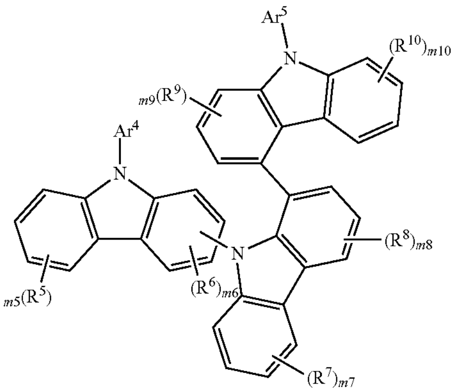
-continued
[Chemical Formula 4-5]
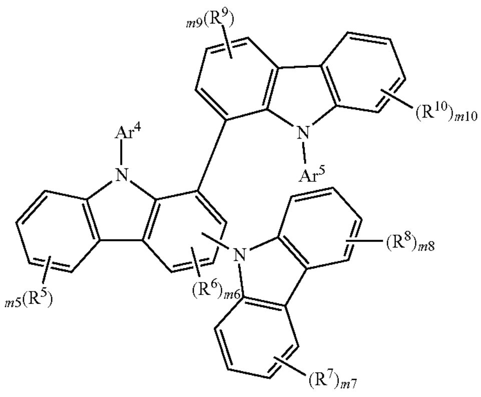
[Chemical Formula 4-6]
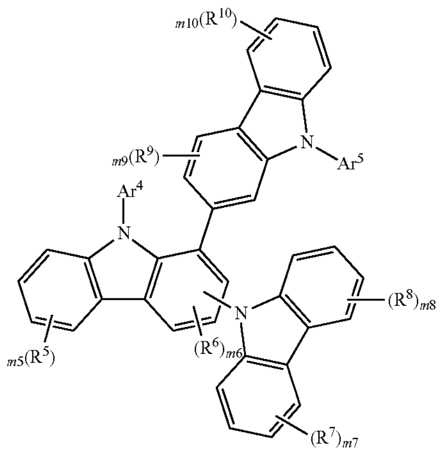
[Chemical Formula 4-7]
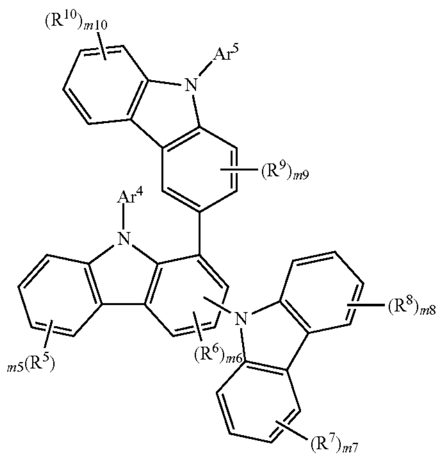

-continued
[Chemical Formula 4-8]
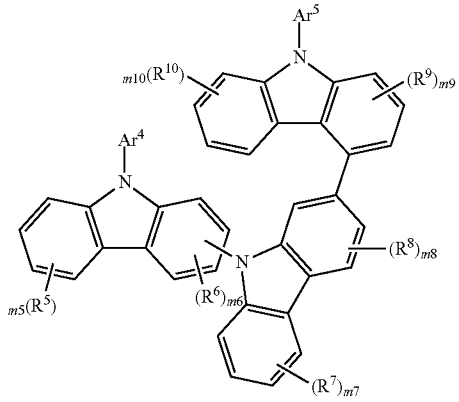
[Chemical Formula 4-9]
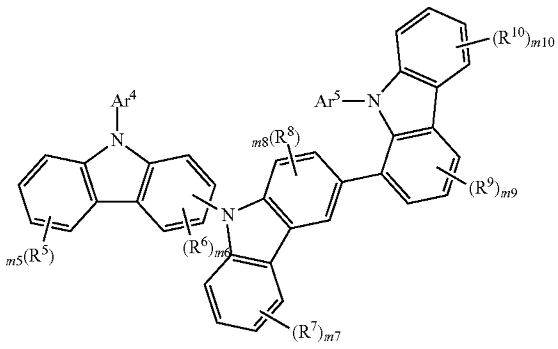
[Chemical Formula 4-10]
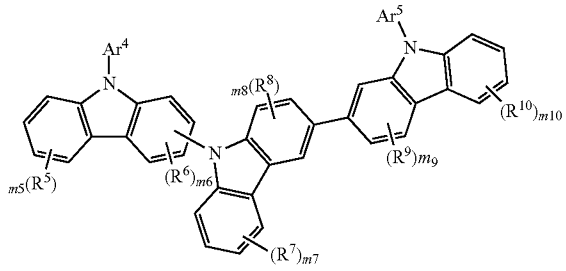
[Chemical Formula 4-11]
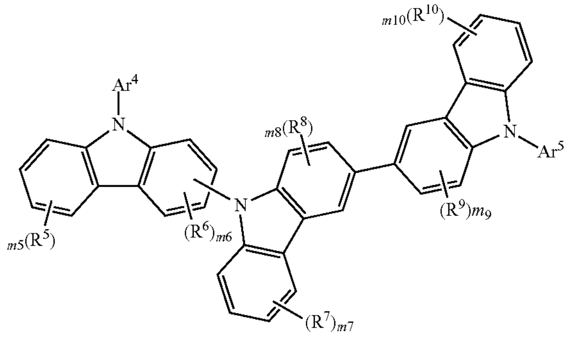
-continued
[Chemical Formula 4-12]
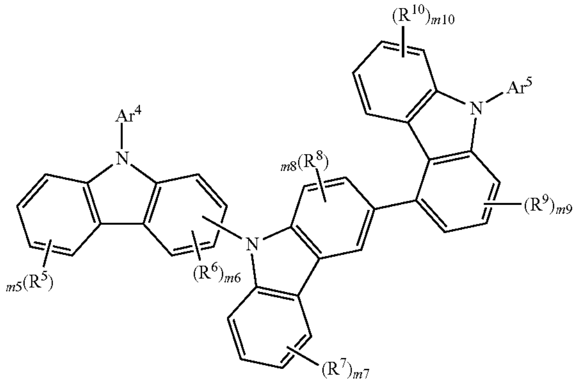
[Chemical Formula 4-13]
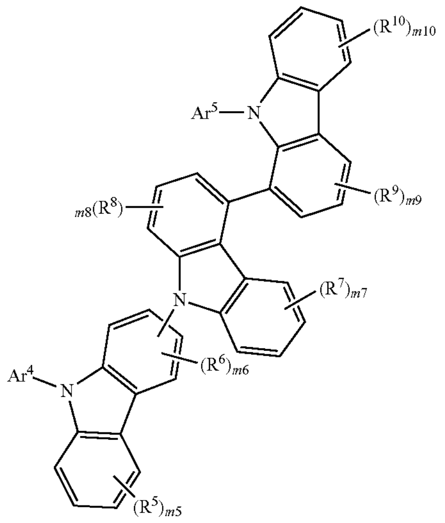
[Chemical Formula 4-14]
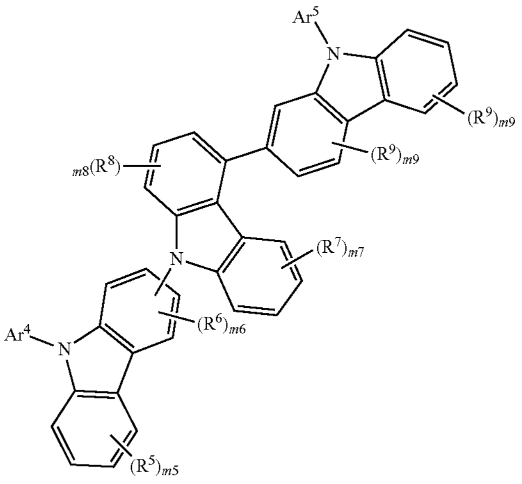

-continued

[Chemical Formula 4-15]

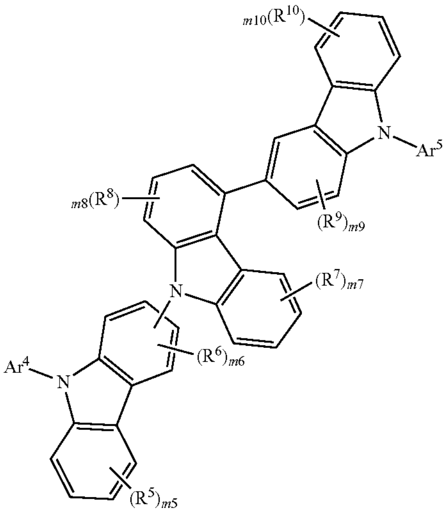

[Chemical Formula 4-16]

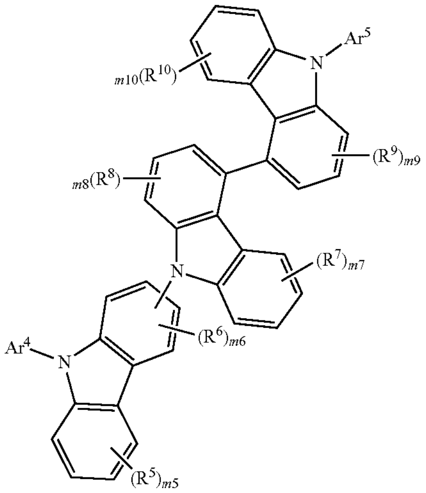

In Group V, $Ar^4$, $Ar^5$, $R^5$ to $R^{10}$ and m5 to m10 may be defined the same as those described above.

In an implementation, $Ar^4$ and $Ar^5$ may each independently be, e.g., a substituted or unsubstituted C6 to C12 aryl group.

In an implementation, $Ar^4$ and $Ar^5$ may each independently be, e.g., a substituted or unsubstituted phenyl group or a substituted or unsubstituted biphenyl group.

In an implementation, $Ar^4$ and $Ar^5$ may each independently, e.g., a substituent of Group VI.

[Group VI]

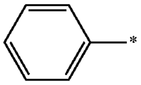

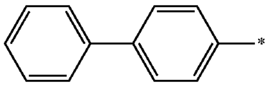

-continued

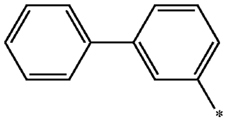

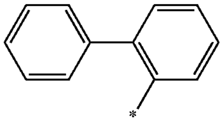

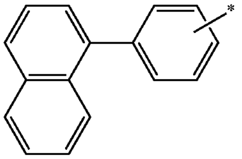

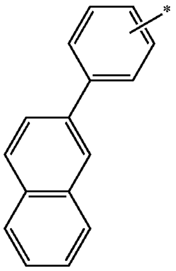

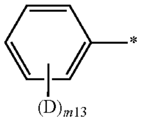

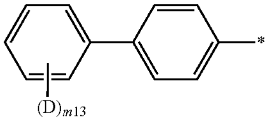

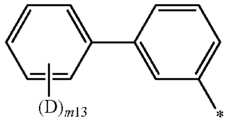

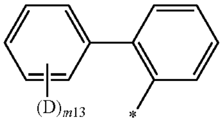

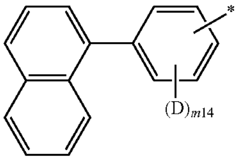

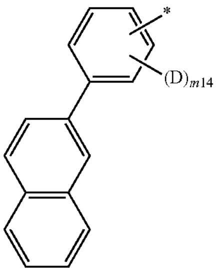

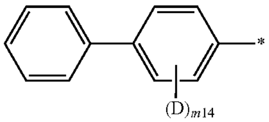

-continued

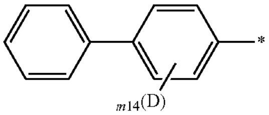

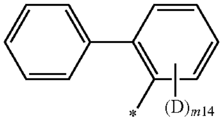

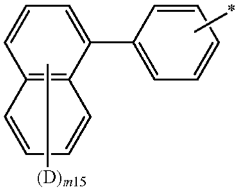

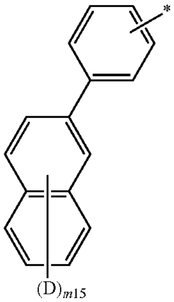

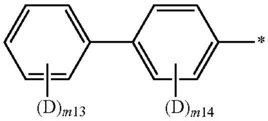

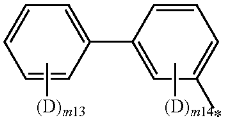

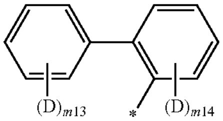

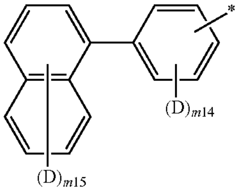

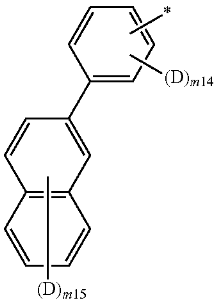

In Group VI, D is deuterium.
m13 may be, e.g., an integer of 1 to 5.
m14 may be, e.g., an integer of 1 to 4.
m15 may be, e.g., an integer of 1 to 7.
* is a linking point.

In an implementation, $R^5$ to $R^{10}$ of Chemical Formula 4 may each independently be, e.g., hydrogen, deuterium, a substituted or unsubstituted C1 to C10 alkyl group, or a substituted or unsubstituted C6 to C12 aryl group.

In an implementation, $R^5$ to $R^{10}$ of Chemical Formula 4 may each independently be, e.g., hydrogen or deuterium.

In an implementation, the second compound may be, e.g., a compound of Group 2.

[Group 2]

B-1

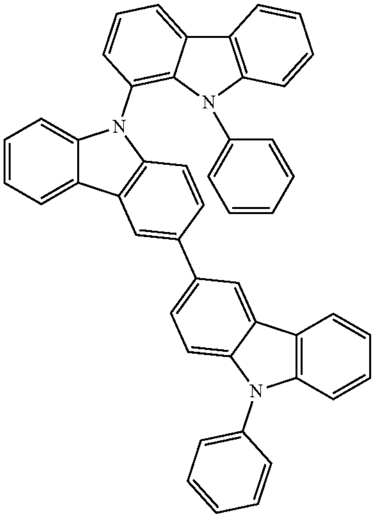

B-2

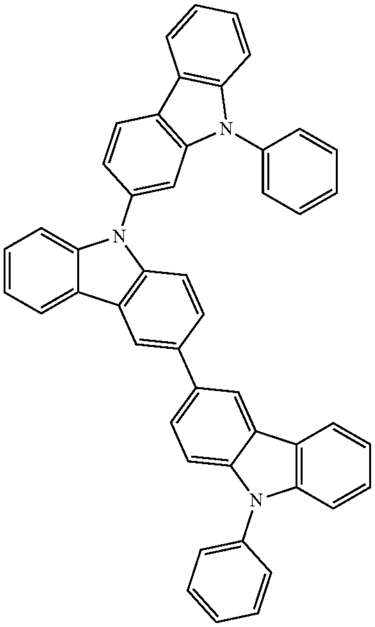

-continued
B-3
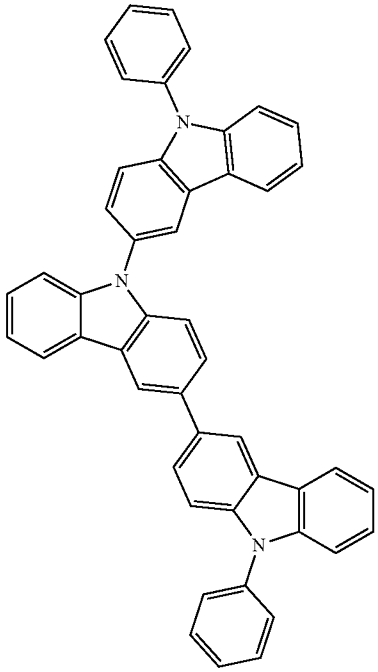
B-4
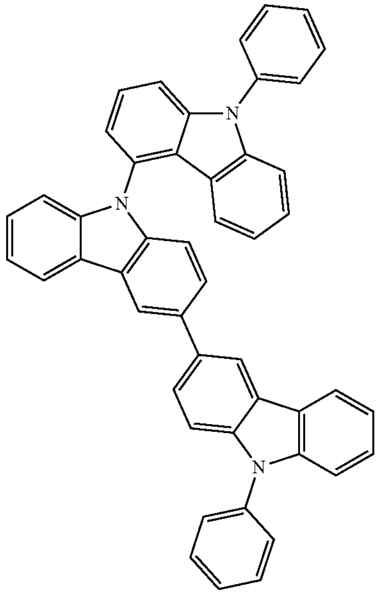
-continued
B-5
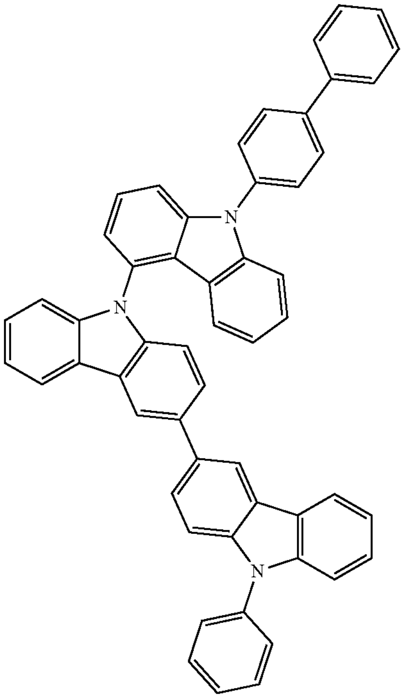
B-6
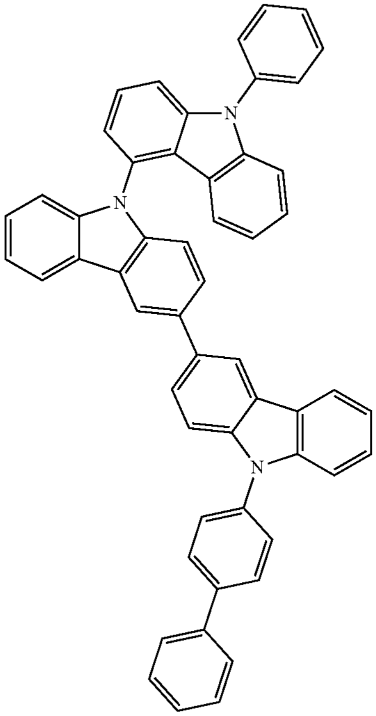

-continued
B-7
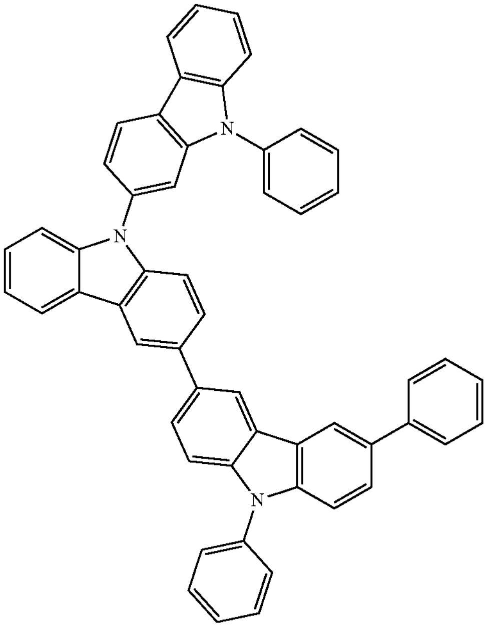
B-8
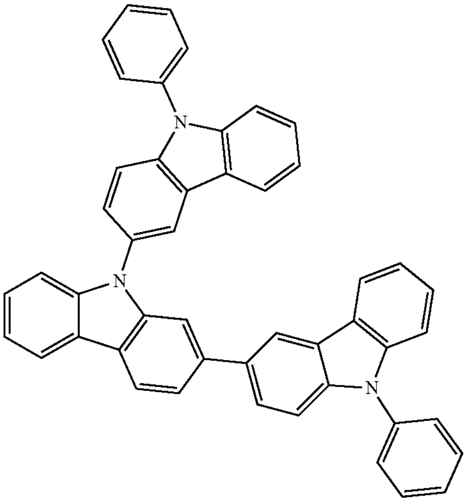
B-9
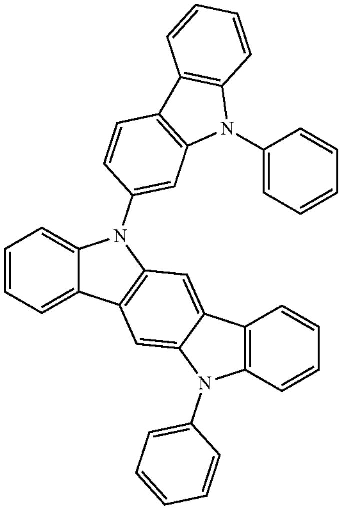
-continued
B-10
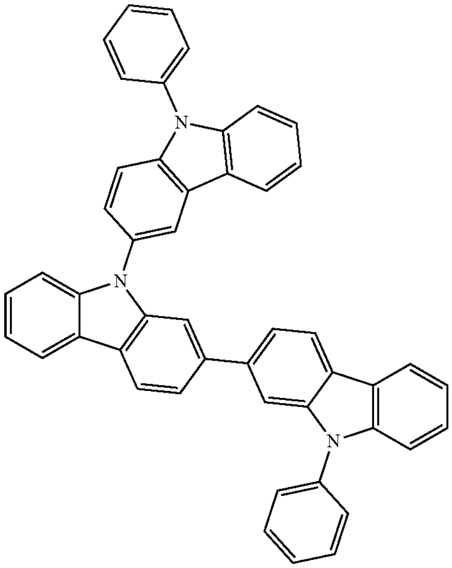
B-11
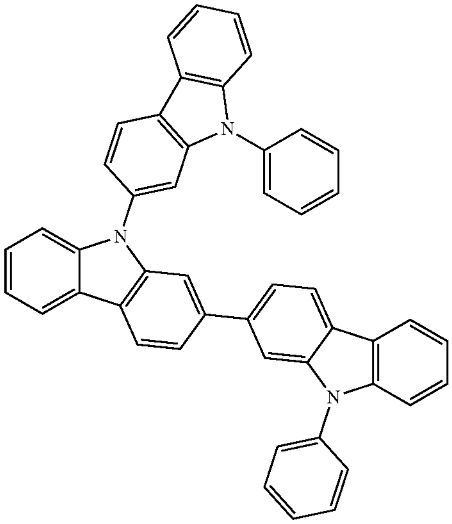

-continued
B-12
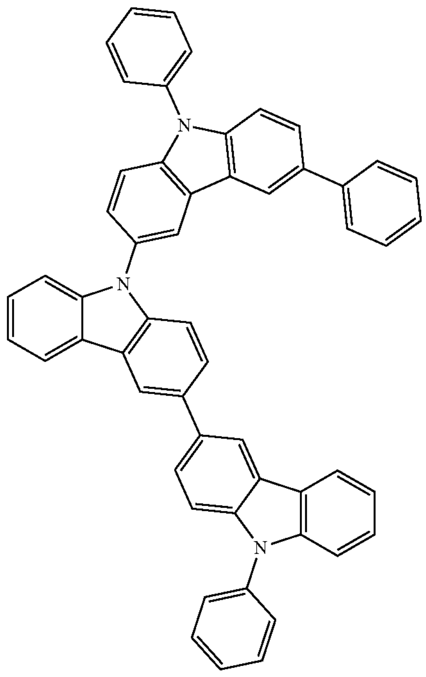
B-13
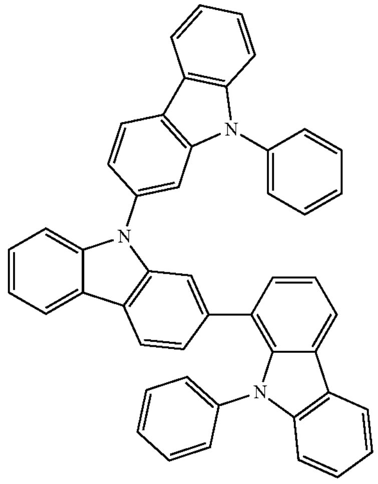
-continued
B-14
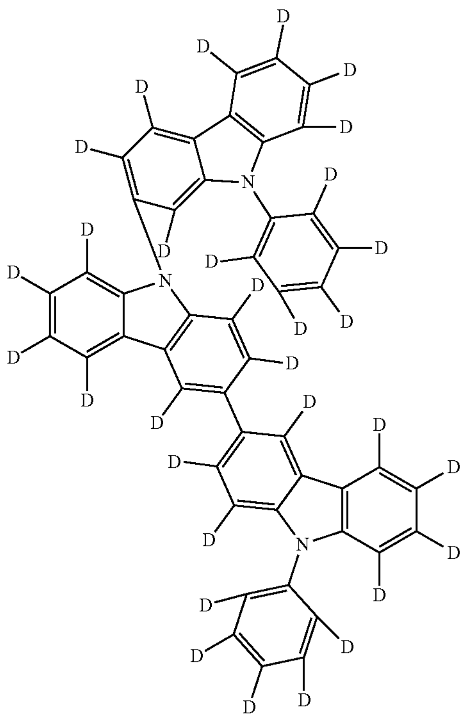
B-15
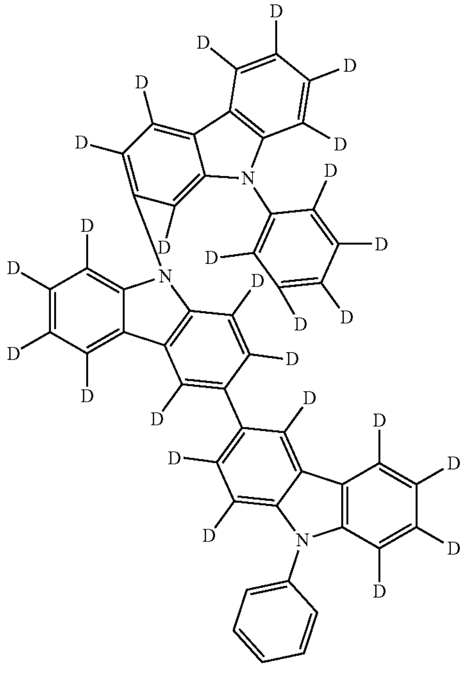

-continued
B-16
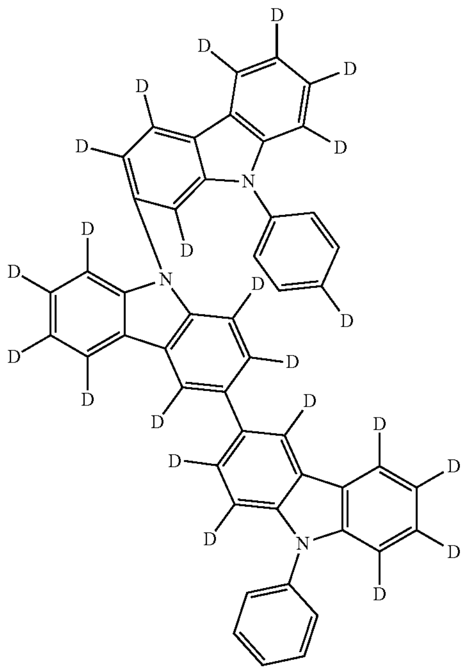
B-17
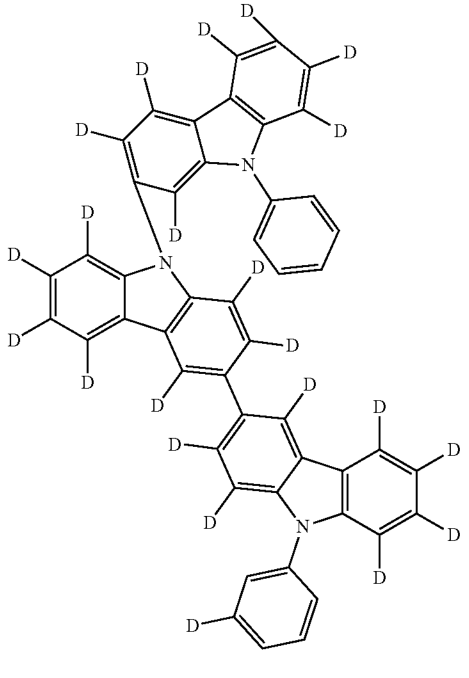
-continued
B-18
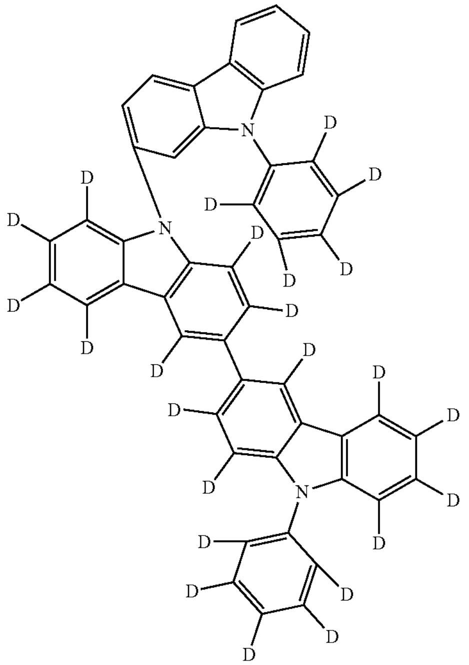
B-19
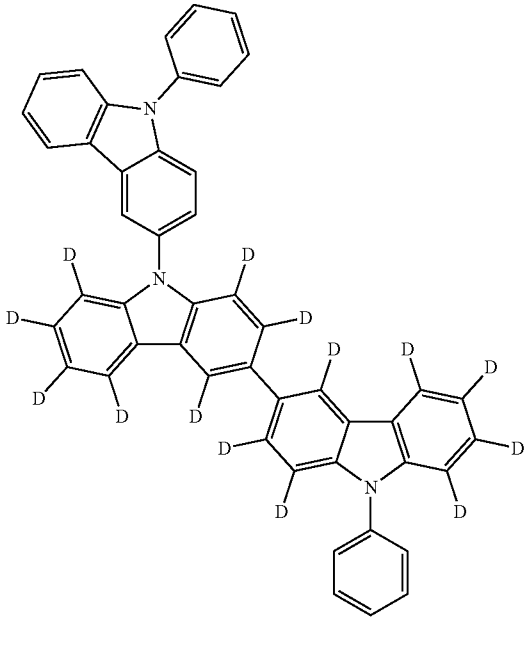

-continued

B-20

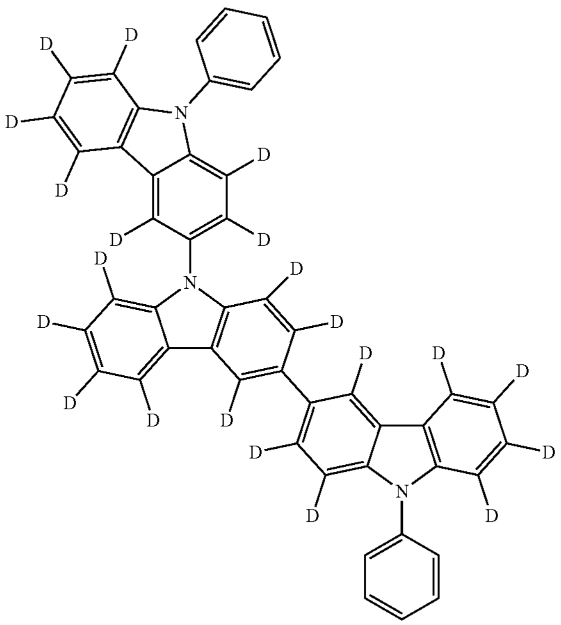

B-21

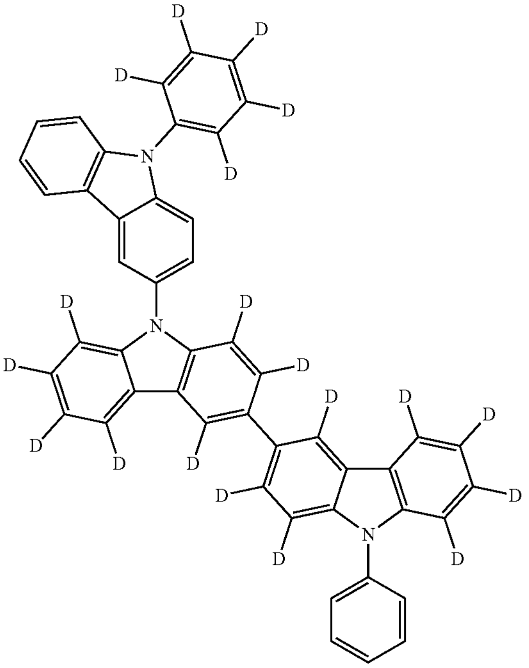

-continued

B-22

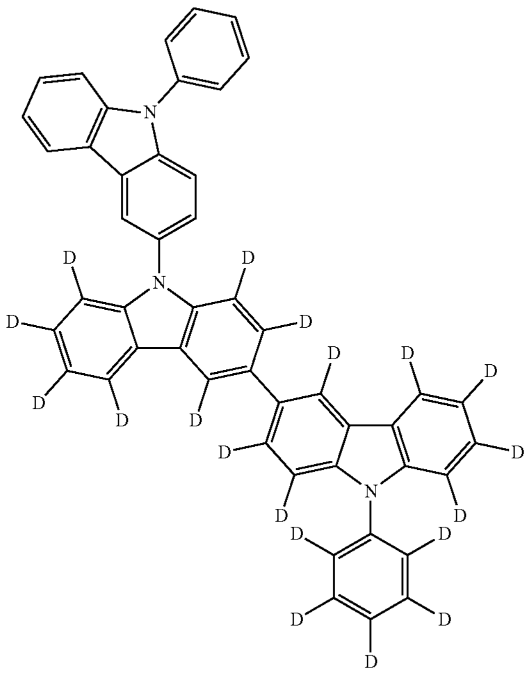

B-23

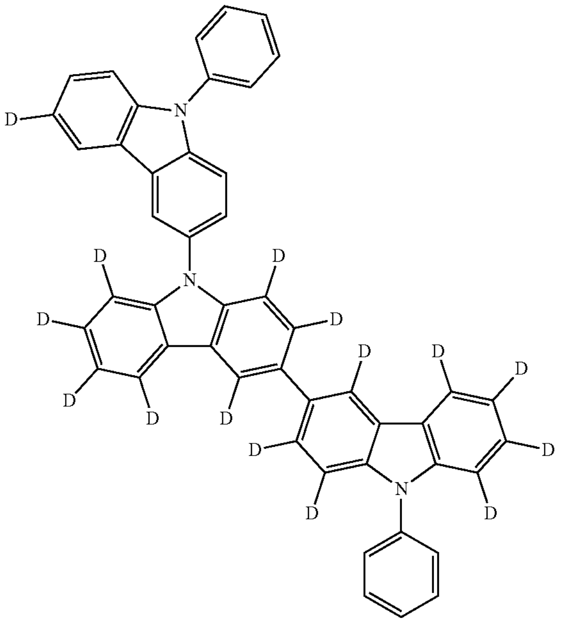

In an implementation, the composition for an organic optoelectronic device may include, e.g., a first compound in which Are of Chemical Formula 1 is represented by Chemical Formula 2-3 and $Ar^3$ is represented by Chemical Formula 3-3 and a second compound represented by Chemical Formula 4-5, Chemical Formula 4-6, 4-7, Chemical Formula 4-11, or Chemical Formula 4-16.

In an implementation, the composition for an organic optoelectronic device may include, e.g., a first compound in which $Ar^2$ of Chemical Formula 1 is represented by Chemical Formula 1-1, Chemical Formula 1-3, Chemical Formula 2-33, or Chemical Formula 2-35, and $Ar^3$ is represented by Chemical Formula 1-4, Chemical Formula 1-6, Chemical Formula 3-31, Chemical Formula 3-32, Chemical Formula 3-33 or Chemical Formula 3-35, provided that when $Ar^2$ is Chemical Formula 1-1 or Chemical Formula 1-3, $Ar^3$ is not Chemical Formula 1-4 or Chemical Formula 1-6, and when $Ar^3$ is Chemical Formula 1-4 or Chemical Formula 1-6, $Ar^2$ is not Chemical Formula 1-1 and Chemical Formula 1-3, and the second compound represented by Chemical Formula 4-11.

In an implementation, the composition for an organic optoelectronic device may include, e.g., a first compound in which $Ar^2$ of Chemical Formula 1 is represented by Chemical Formula 1-1, Chemical Formula 1-3, Chemical Formula 2-31, Chemical Formula 2-32, Chemical Formula 2-33, or Chemical Formula 2-35, $Ar^3$ is represented by Chemical Formula 1-4, Chemical Formula 1-6, Chemical Formula 3-33, or Chemical Formula 3-35, provided that when $Ar^2$ is Chemical Formula 1-1 or Chemical Formula 1-3, $Ar^3$ is not Chemical Formula 1-4 or Chemical Formula 1-6, and when $Ar^3$ is Chemical Formula 1-4 or Chemical Formula 1-6, $Ar^2$ is not Chemical Formula 1-1 and Chemical Formula 1-3, and the second compound represented by Chemical Formula 4-11.

In an implementation, in the first compound included in the composition for an organic optoelectronic device, $Ar^2$ of Chemical Formula 1 may be represented by Chemical Formula 1-3 and $Ar^3$ may be represented by Chemical Formula 3-31, or $Ar^2$ of Chemical Formula 1 may be represented by Chemical Formula 2-31 and $Ar^3$ may be represented by Chemical Formula 1-6.

The first compound and the second compound may be included (e.g., mixed) in a weight ratio of, e.g., about 1:99 to about 99:1. Within the above range, bipolar characteristics may be implemented by adjusting the weight ratio using the hole transport capability of the first compound and the electron transport capability of the second compound, so that efficiency and life-span may be improved. Within the above range, the first compound and the second compound may be, e.g., included in a weight ratio of about 90:10 to about 10:90, about 80:20 to about 10:90, about 70:30 to about 10:90, or about 60:40 to about 10:90. In an implementation, they may be included in a weight ratio of about 50:50 to about 10:90, e.g., about 40:60 to about 10:90.

In an implementation, they may be included in a weight ratio of about 30:70 to about 10:90.

In an implementation, the first compound and the second compound may each be included as a host of a light emitting layer, e.g., a phosphorescent host.

Hereinafter, an organic optoelectronic device including the aforementioned composition for an organic optoelectronic device is described.

The organic optoelectronic device may be a suitable device to convert electrical energy into photoenergy and vice versa, and may be, e.g., an organic photoelectric device, an organic light emitting diode, an organic solar cell, or an organic photoconductor drum.

Herein, an organic light emitting diode as one example of an organic optoelectronic device is described referring to the drawing.

The FIGURE is a cross-sectional view of an organic light emitting diode according to an embodiment.

Referring to the FIGURE, an organic light emitting diode 100 according to an embodiment may include an anode 120 and a cathode 110 facing each other and an organic layer 105 between the anode 120 and cathode 110.

The anode 120 may be made of a conductor having a large work function to help hole injection, and may be, e.g., a metal, a metal oxide, or a conductive polymer. The anode 120 may be, e.g., a metal such as nickel, platinum, vanadium, chromium, copper, zinc, gold, or the like, or an alloy thereof; a metal oxide such as zinc oxide, indium oxide, indium tin oxide (ITO), indium zinc oxide (IZO), and the like; a combination of a metal and an oxide such as ZnO and Al or $SnO_2$ and Sb; a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be, e.g., a metal such as magnesium, calcium, sodium, potassium, titanium, indium, yttrium, lithium, gadolinium, aluminum silver, tin, lead, cesium, barium, or the like, or an alloy thereof; or a multi-layer structure material such as LiF/Al, $LiO_2$/Al, LiF/Ca, LiF/Al, or $BaF_2$/Ca.

The organic layer 105 may include the aforementioned composition for an organic optoelectronic device.

The organic layer 105 may include, e.g., the light emitting layer 130, and the light emitting layer 130 may include, e.g., the aforementioned composition for an organic optoelectronic device.

The light emitting layer 130 may include, e.g., the aforementioned composition for an organic optoelectronic device as a phosphorescent host.

In addition to the aforementioned host, the light emitting layer may further include one or more compounds.

The light emitting layer may further include a dopant. The dopant may be, e.g., a phosphorescent dopant, such as a red, green or blue phosphorescent dopant, and may be, e.g., a red phosphorescent dopant.

The composition for an organic optoelectronic device further including a dopant may be, e.g., a red-light emitting composition.

A dopant is a material that emits light by being mixed in a small amount with a compound or composition for an organic optoelectronic device. In general, the dopant may be a material such as a metal complex that emits light by multiple excitation into a triplet or more. The dopant may be, for example, an inorganic, organic, or organic-inorganic compound, and may include one or two or more.

An example of the dopant may be a phosphorescent dopant, and examples of the phosphorescent dopant may include an organometallic compound including Ir, Pt, Os, Ti, Zr, Hf, Eu, Tb, Tm, Fe, Co, Ni, Ru, Rh, Pd, or a combination thereof. The phosphorescent dopant may be, e.g., a compound represented by Chemical Formula Z.

$LMX^3$ [Chemical Formula Z]

In Chemical Formula Z, M may be, e.g., a metal, and L and $X^3$ may each independently be, e.g., ligands forming a complex compound with M.

In an implementation, M may be, e.g., Ir, Pt, Os, Ti, Zr, Hf, Eu, Tb, Tm, Fe, Co, Ni, Ru, Rh, Pd, or a combination thereof, and L and $X^3$ may be, e.g., a bidentate ligand.

In an implementation, the ligand represented by L and $X^3$ may be, e.g., a ligand of Group A.

[Group A]

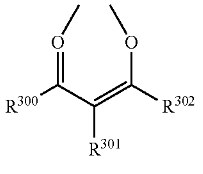

-continued
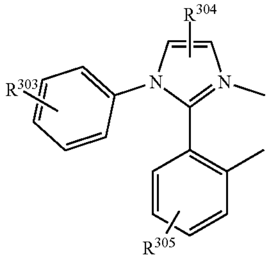
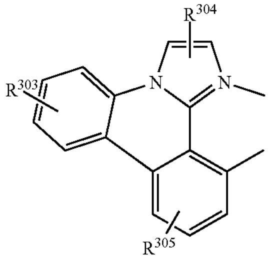
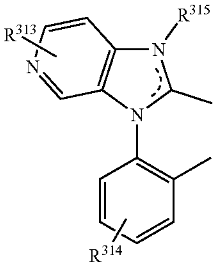
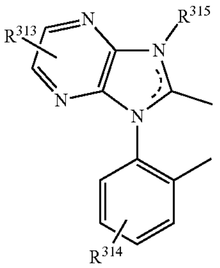
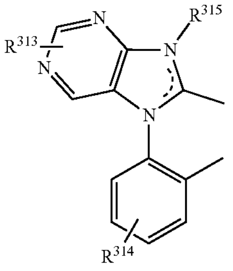
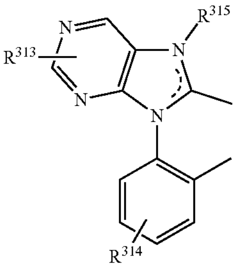
-continued
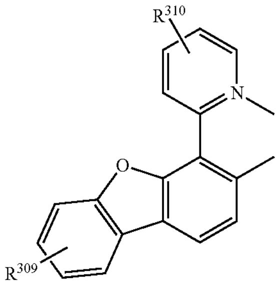
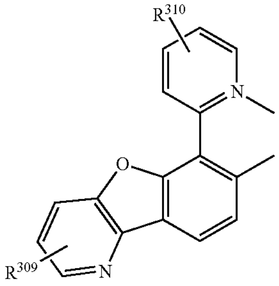
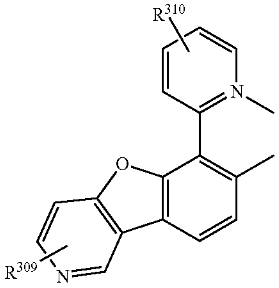
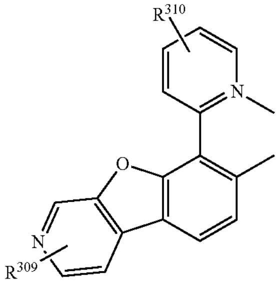
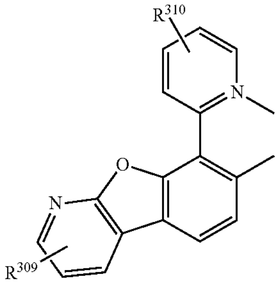

-continued
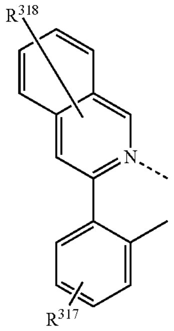
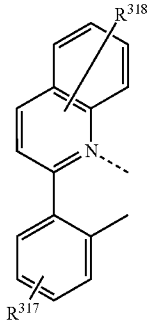
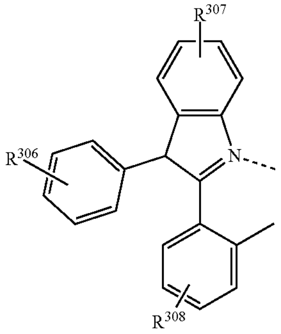
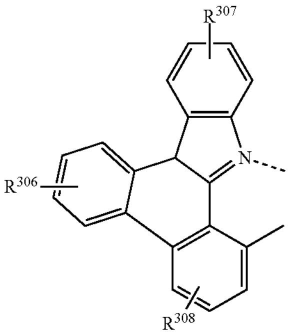
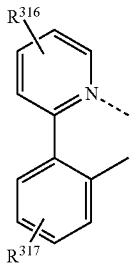
-continued
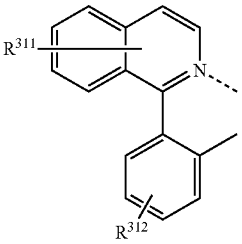
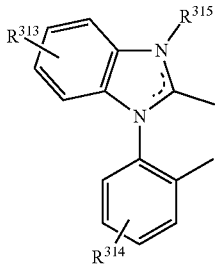
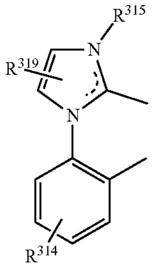
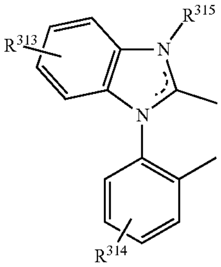
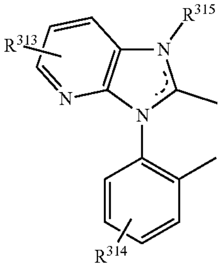
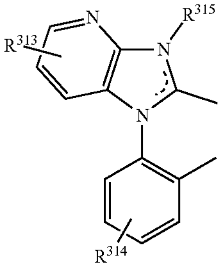

-continued

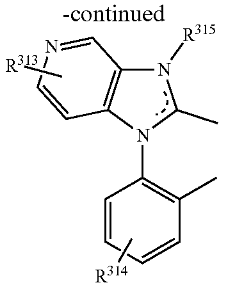

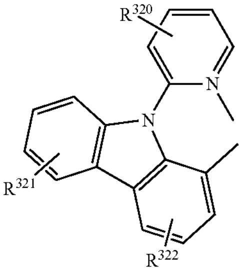

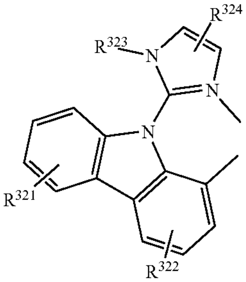

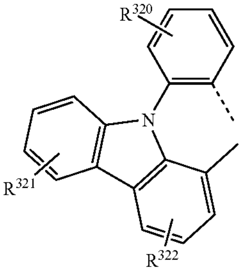

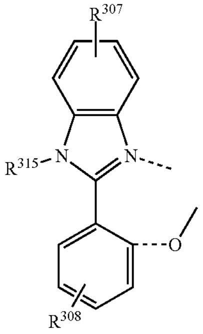

In Group A, $R^{300}$ to $R^{302}$ may each independently be, e.g., hydrogen, deuterium, a C1 to C30 alkyl group substituted or unsubstituted with a halogen, a C6 to C30 aryl group substituted or unsubstituted with a C1 to C30 alkyl group, or a halogen.

$R^{303}$ to $R^{324}$ may each independently be, e.g., hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, a substituted or unsubstituted C6 to C30 arylamino group, $SF_5$, a trialkylsilyl group having a substituted or unsubstituted C1 to C30 alkyl group, a dialkylarylsilyl group having a substituted or unsubstituted C1 to C30 alkyl group and C6 to C30 aryl group, or a triarylsilyl group having a substituted or unsubstituted C6 to C30 aryl group.

In an implementation, the dopant may be represented by Chemical Formula V.

[Chemical Formula V]

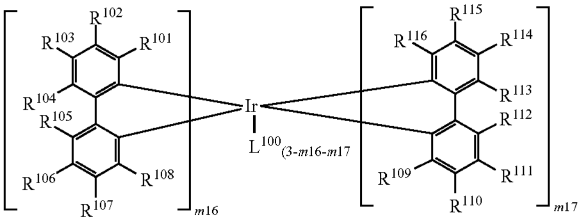

In Chemical Formula V, $R^{101}$ to $R^{116}$ may each independently be, e.g., hydrogen, deuterium, a C1 to C10 alkyl group, substituted or unsubstituted C6 to C30 aryl group, or $SiR^{132}R^{133}R^{134}$.

$R^{132}$ to $R^{134}$ may each independently be, e.g., a substituted or unsubstituted C1 to C6 alkyl group.

In an implementation, at least one of $R^{101}$ to $R^{116}$ may be a functional group represented by Chemical Formula V-1.

$L^{100}$ may be, e.g., bidentate ligand of monovalent anion, or a ligand that coordinates to iridium through a lone pair of electrons on a carbon or heteroatom.

m16 and m17 may each independently be, e.g., an integer of 0 to 3, m16+m17 may be, e.g., an integer of 1 to 3.

[Chemical Formula V-1]

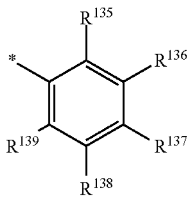

In Chemical Formula V-1, $R^{135}$ to $R^{139}$ may each independently be, e.g., hydrogen, deuterium, a C1 to C10 alkyl group, substituted or unsubstituted C6 to C20 aryl group, or $SiR^{132}R^{133}R^{134}$.

$R^{132}$ to $R^{134}$ may each independently be, e.g., a substituted or unsubstituted C1 to C6 alkyl group.

* indicates a linking point linked to carbon atom.

In an implementation, the dopant may be represented by Chemical Formula Z-1.

[Chemical Formula Z-1]

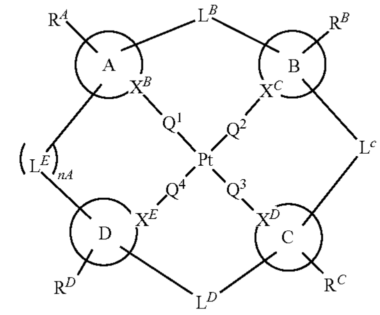

In Chemical Formula Z-1, rings A, B, C, and D may each independently be, e.g., 5- or 6-membered carbocyclic or heterocyclic rings.

$R^A$, $R^B$, $R^c$, and $R^D$ may independently indicate mono-substitution, disubstitution, tri substitution, or tetrasubstitution, or unsubstitution.

$L^B$, $L^c$, and $L^D$ may each independently be, e.g., a direct bond, BR, NR, PR, 0, S, Se, C═O, S═O, $SO_2$, CRR', SiRR', GeRR', or a combination thereof.

In an implementation, when nA is 1, $L^E$ may be, e.g., a direct bond, BR, NR, PR, O, S, Se, C═O, S═O, $SO_2$, CRR', SiRR', GeRR', or a combination thereof; and when nA is 0, $L^E$ is not present;

$R^A$, $R^B$, $R^C$, $R^D$, R, and R' may each independently be, e.g., hydrogen, deuterium, a halogen, an alkyl group, a cycloalkyl group, a heteroalkyl group, an arylalkyl group, an alkoxy group, an aryloxy group, an amino group, a silyl group, an alkenyl group, a cycloalkenyl group, a heteroalkenyl group, an alkynyl group, an aryl group, a heteroaryl group, an acyl group, a carbonyl group, a carboxylic acid group, an ester group, a nitrile group, an isonitrile group, a sulfanyl group, a sulfinyl group, a sulfonyl group, a phosphino group, or a combination thereof. In an implementation, adjacent groups of $R^A$, $R^B$, $R^C$, $R^D$, R, and R' may be arbitrarily linked with each other to form a ring; $X^B$, $X^C$, $X^D$, and $X^E$ may each independently be, e.g., carbon or nitrogen; and $Q^1$, $Q^2$, $Q^3$, and $Q^4$ may each independently be, e.g., oxygen or a direct bond.

In an implementation, the composition for the organic optoelectronic device according to an embodiment may include a dopant represented by Chemical Formula VI.

[Chemical Formula VI]

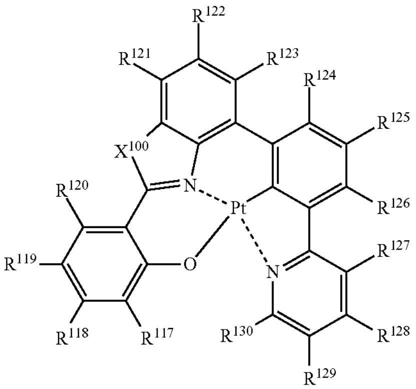

In Chemical Formula VI, $X^{100}$ may be, e.g., O, S, or $NR^{131}$.

$R^{101}$ to $R^{131}$ may each independently be, e.g., hydrogen, deuterium, a substituted or unsubstituted C1 to C10 alkyl group, a substituted or unsubstituted C6 to C20 aryl group, or $—SiR^{132}R^{133}R^{134}$.

$R^{132}$ to $R^{134}$ may each independently be, e.g., C1 to C6 alkyl group.

In an implementation, at least one of $R^{117}$ to $R^{131}$ may be, e.g., $—SiR^{132}R^{133}R^{134}$ or tert-butyl group.

The organic layer may further include a charge transport region in addition to the light emitting layer.

The charge transport region may be, e.g., the hole transport region 140.

The hole transport region 140 may help further increase hole injection and/or hole mobility between the anode 120 and the light emitting layer 130 and block electrons.

In an implementation, the hole transport region 140 may include a hole transport layer between the anode 120 and the light emitting layer 130 and a hole transport auxiliary layer between the light emitting layer 130 and the hole transport layer. In an implementation, a compound of Group B may be included in at least one of the hole transport layer and the hole transport auxiliary layer.

[Group B]
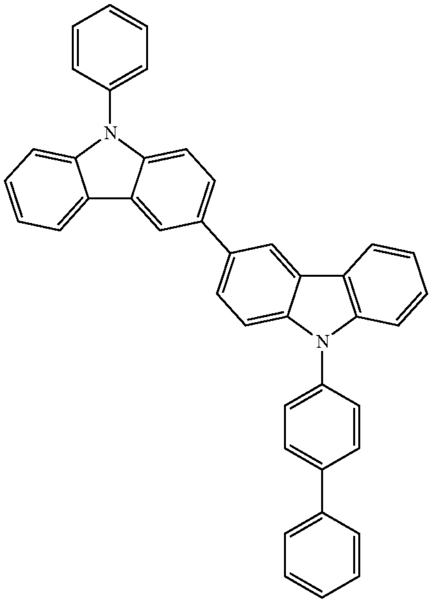
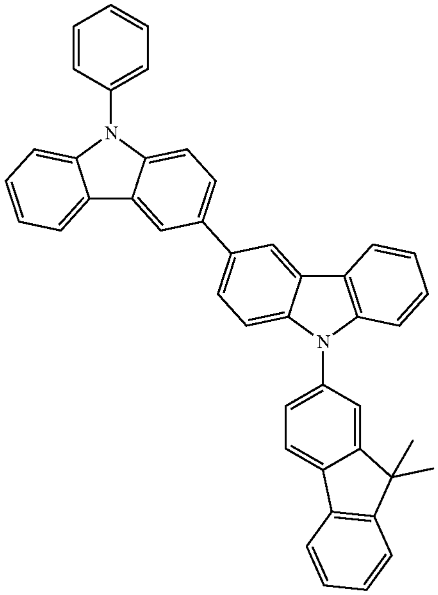
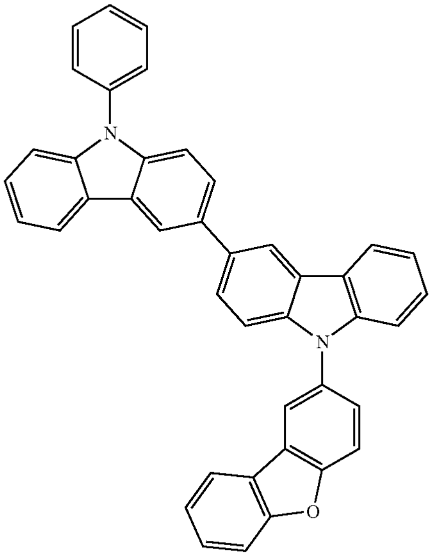
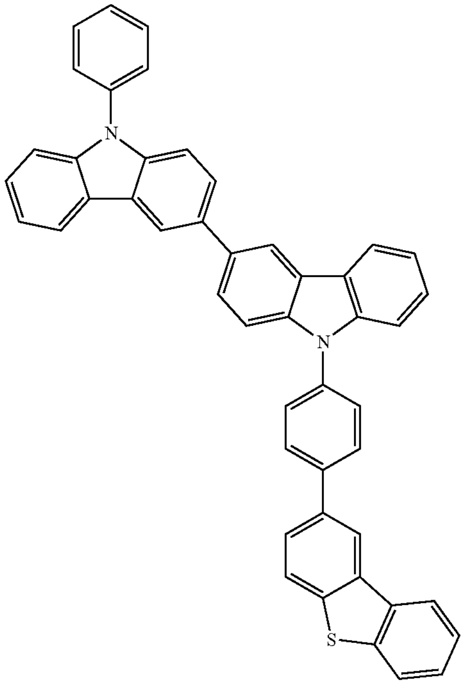

-continued
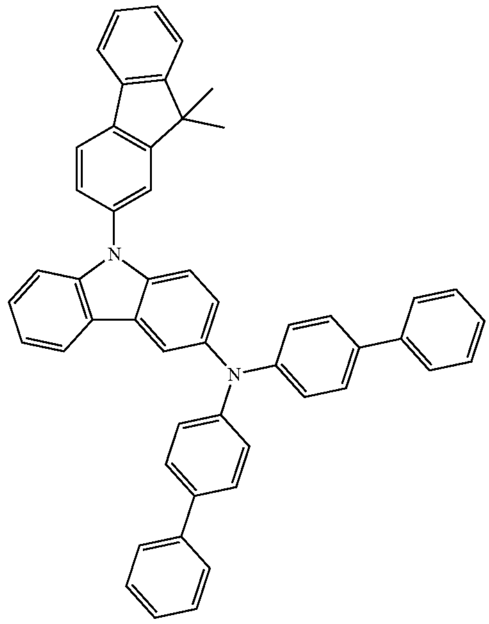
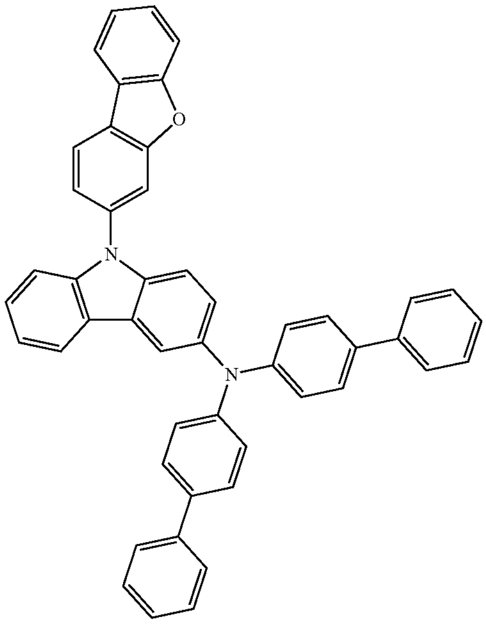
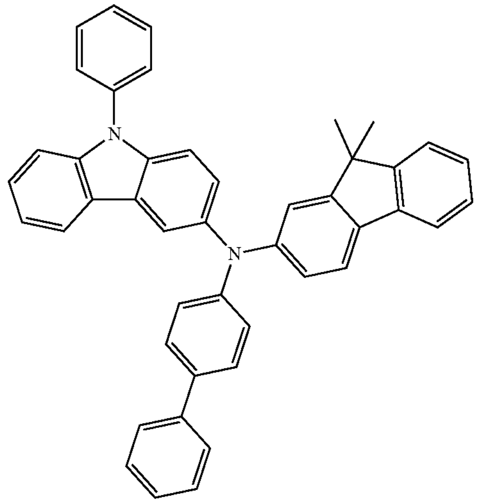
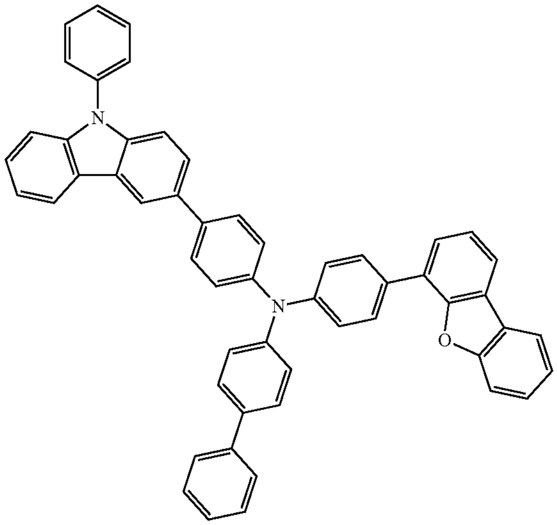
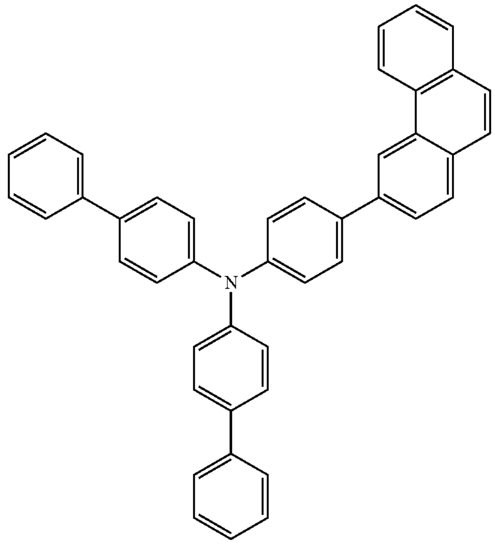
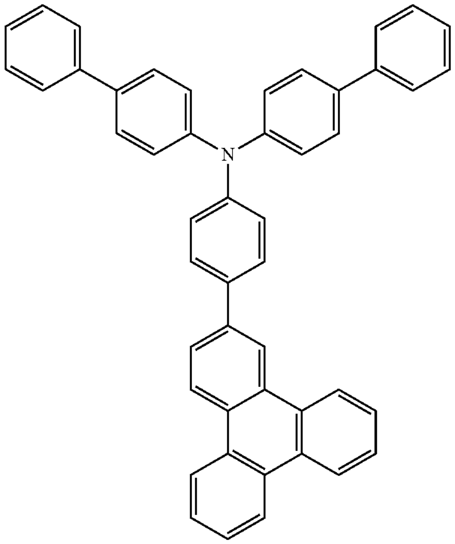

-continued
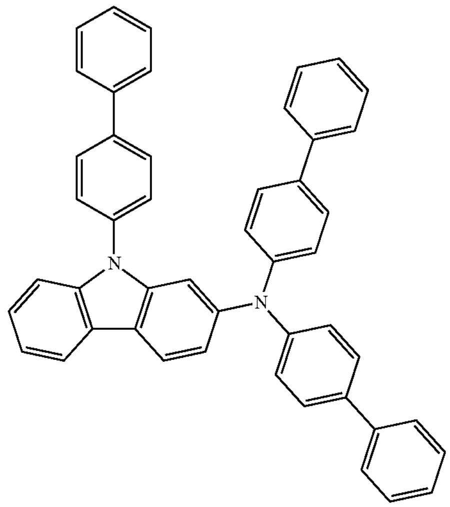
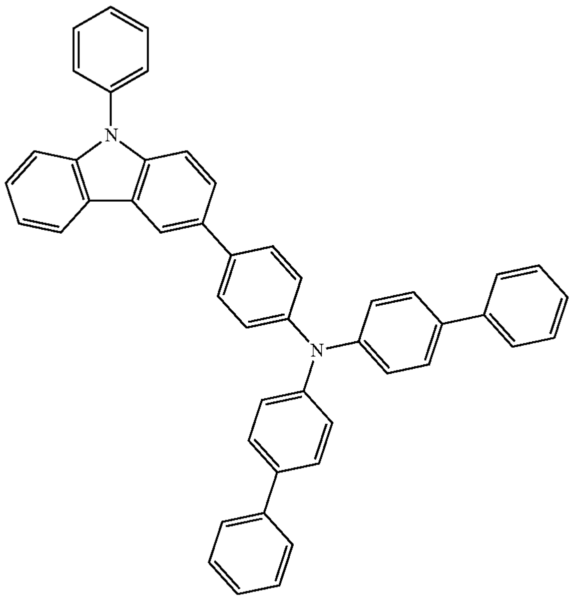
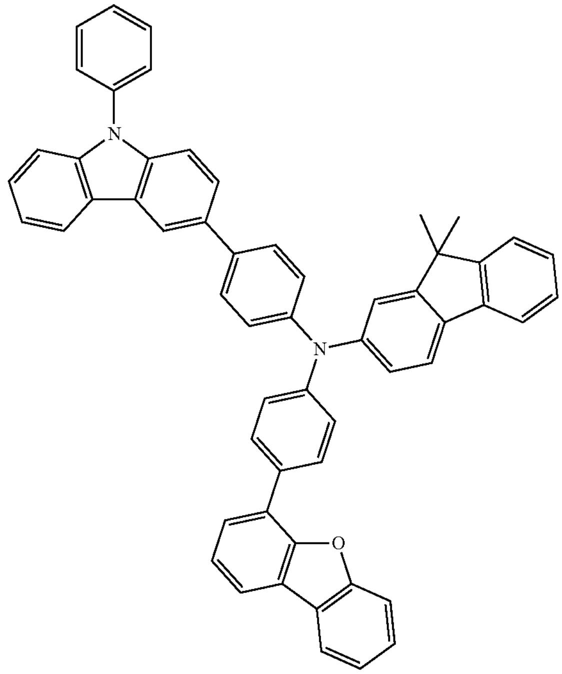
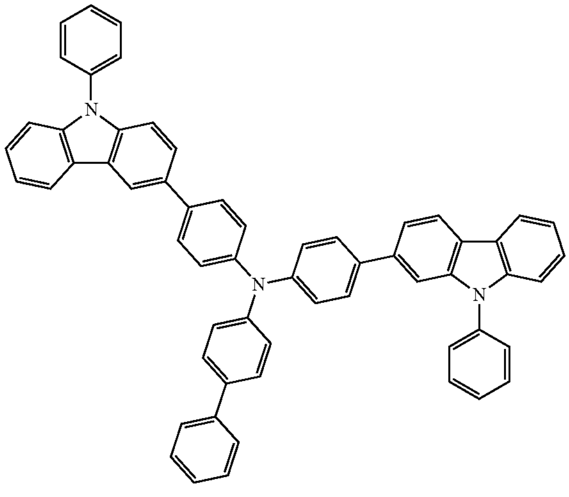

-continued
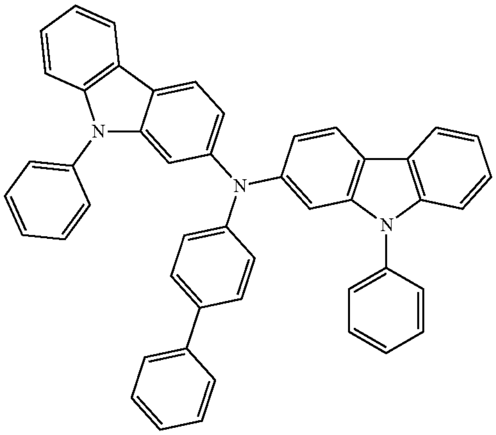
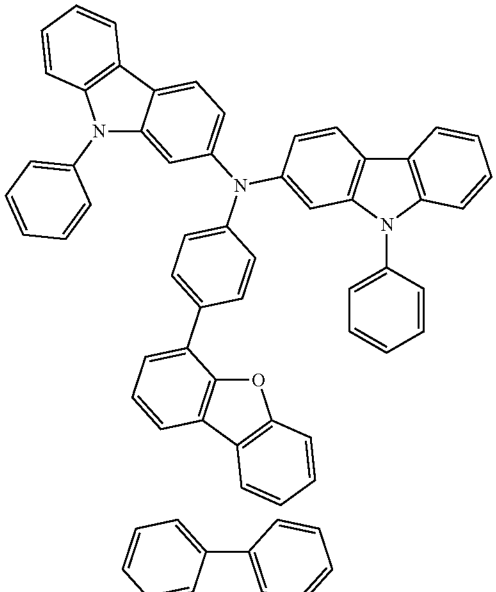
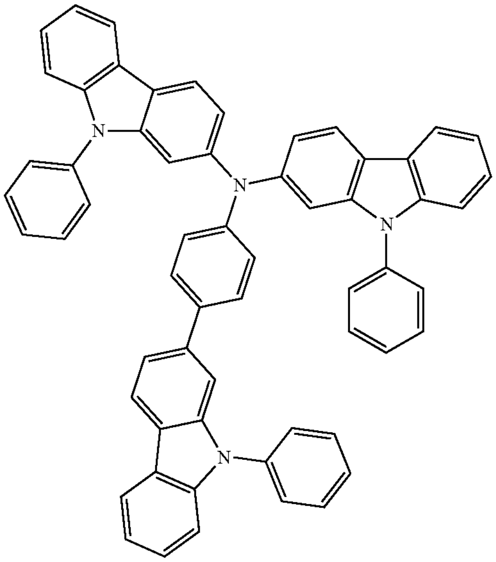
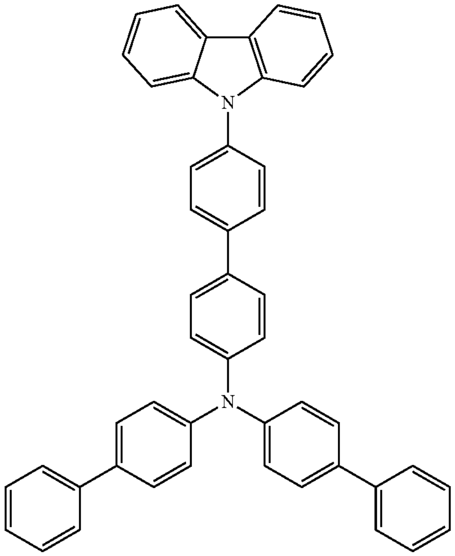
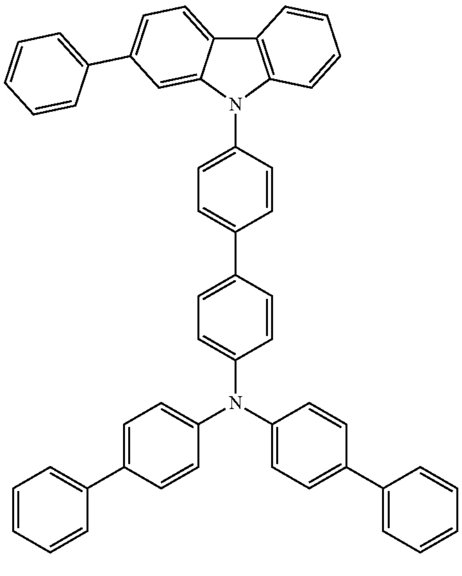
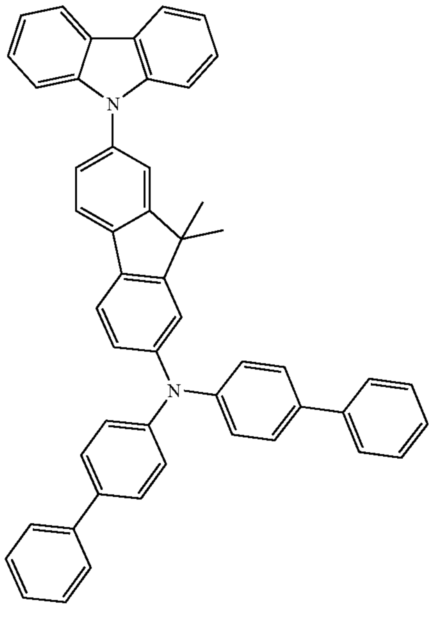

-continued
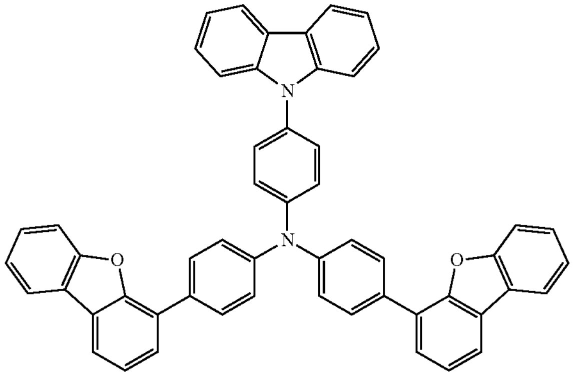
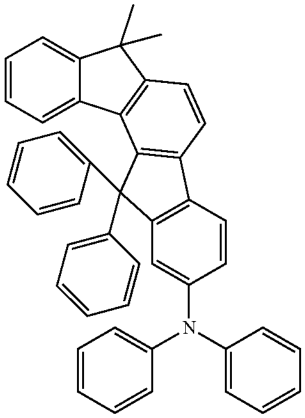
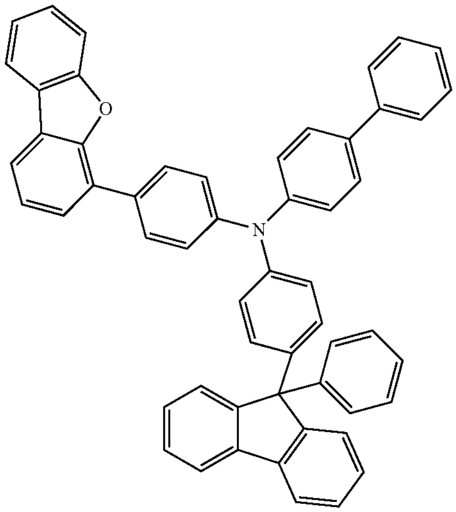
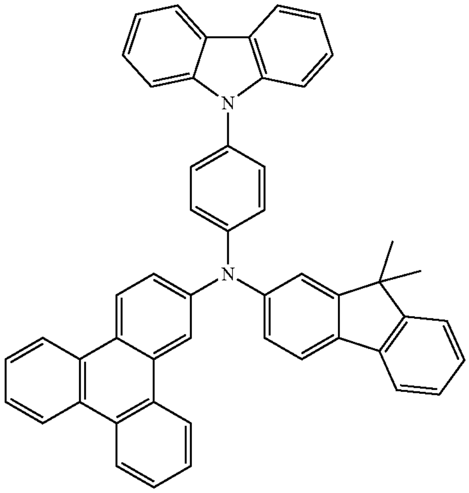
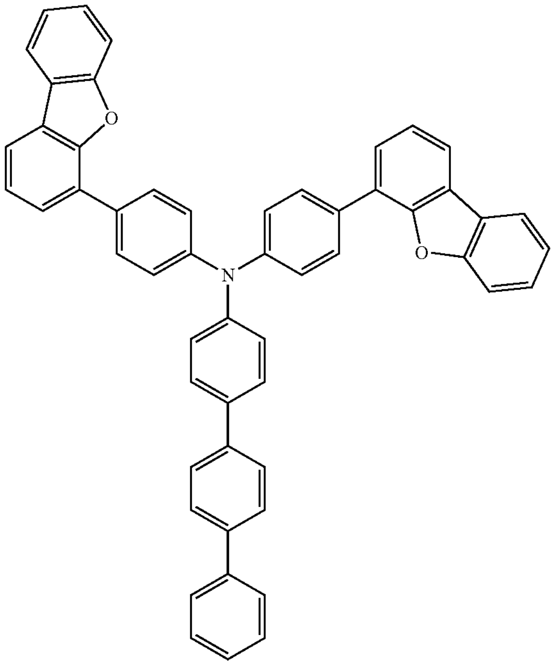
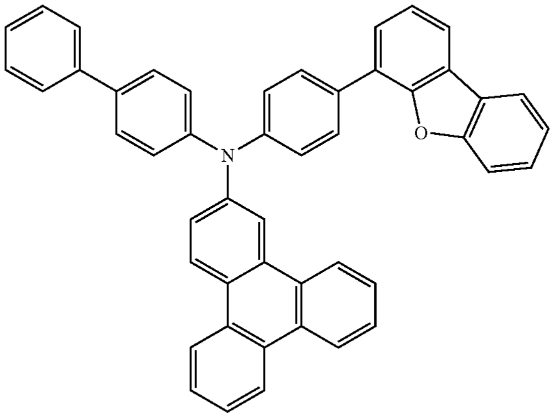

-continued
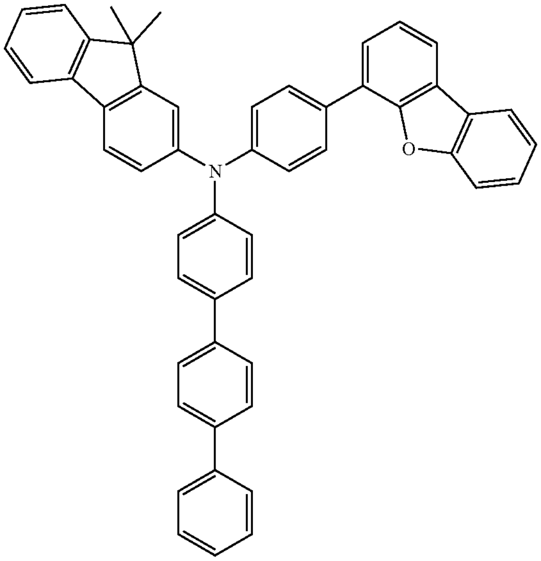
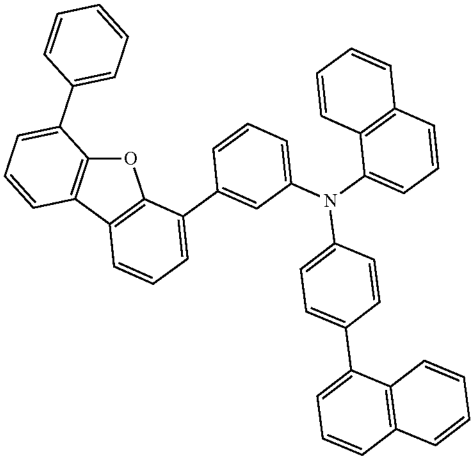
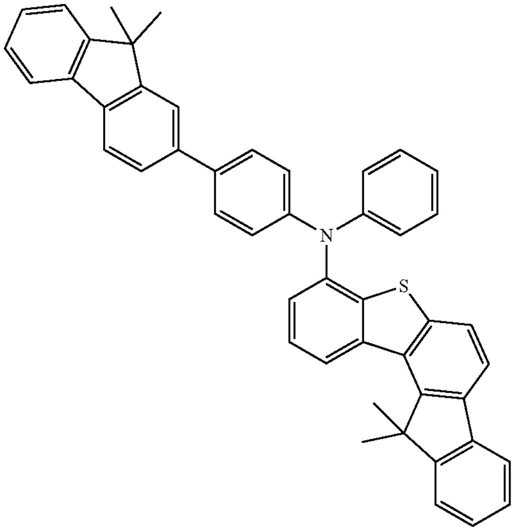
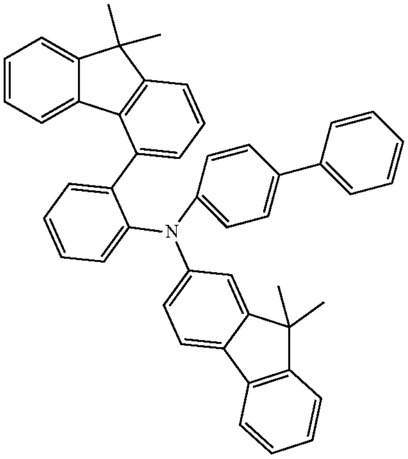
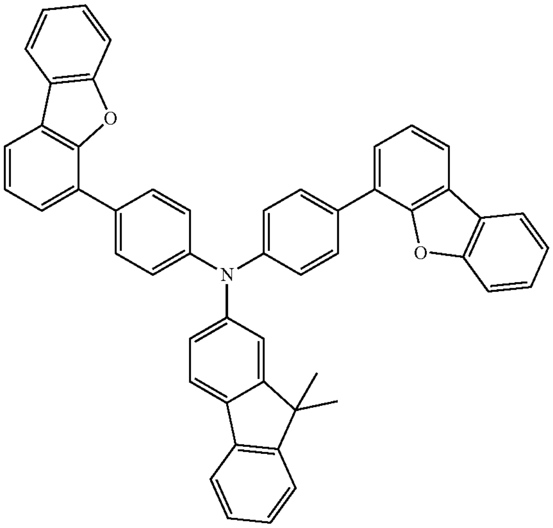
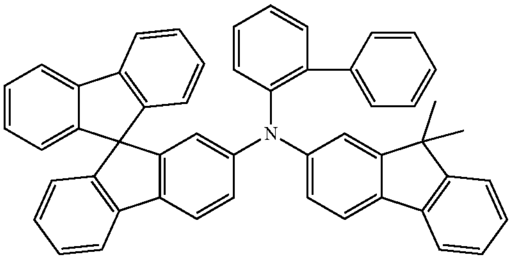

-continued
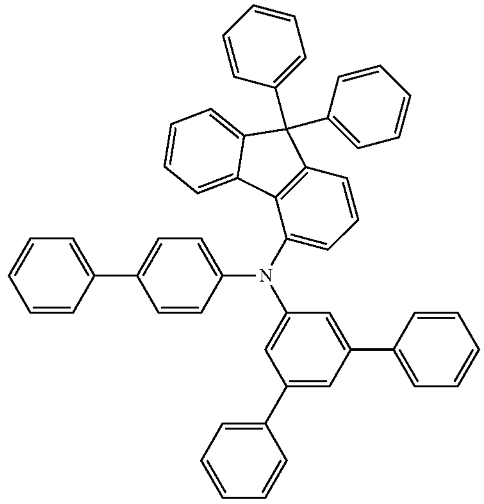
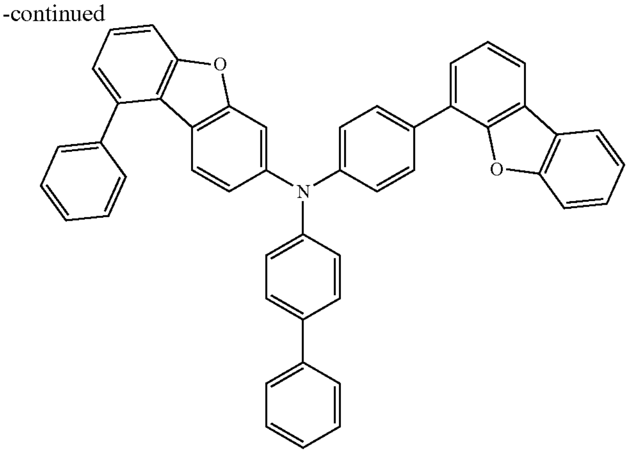
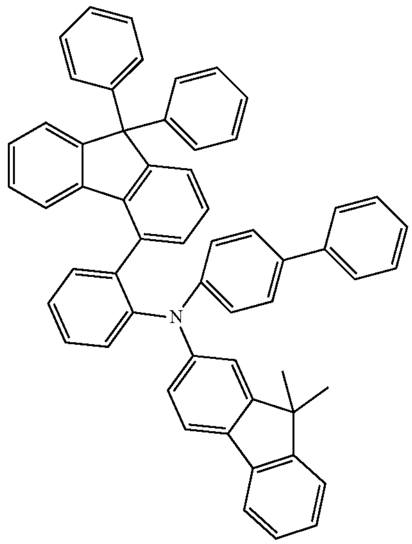
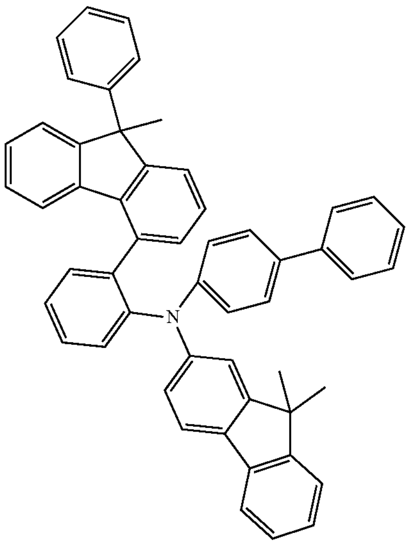
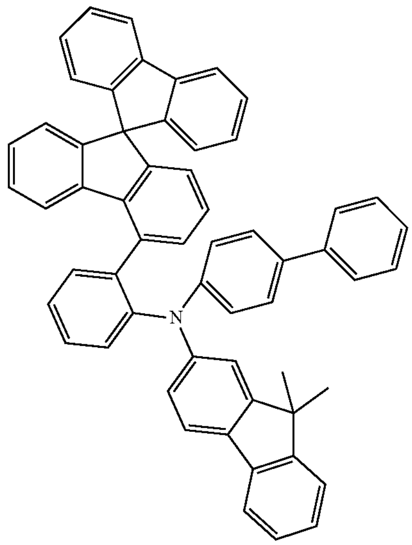
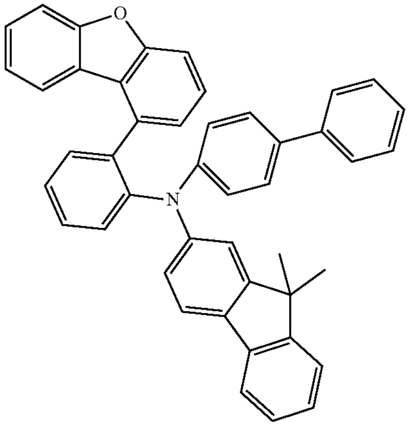

-continued
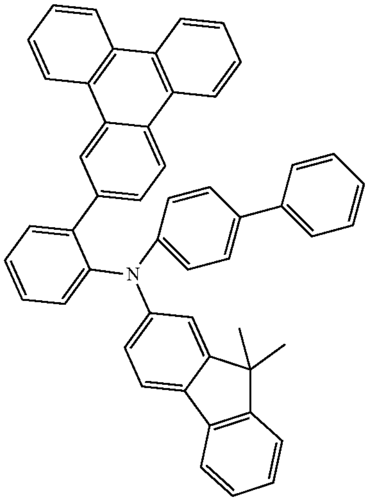
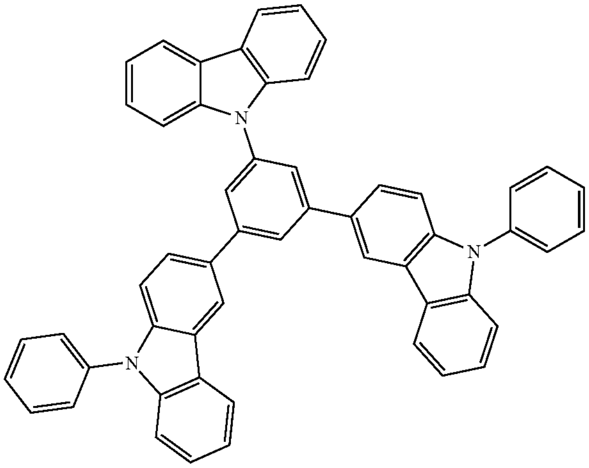
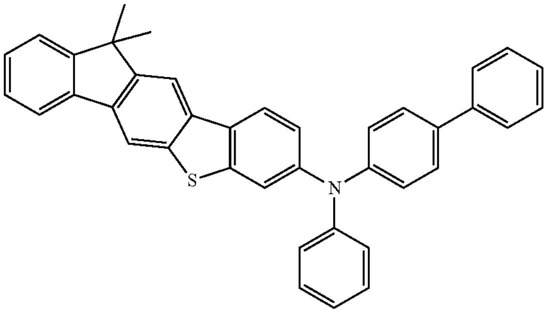
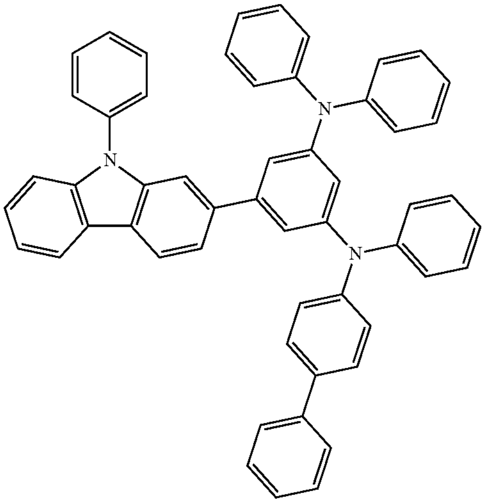
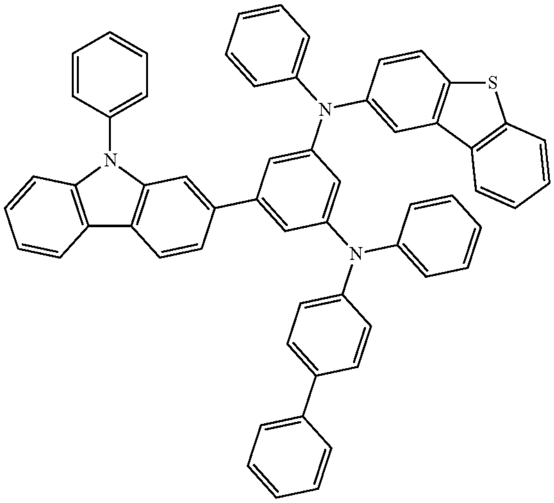
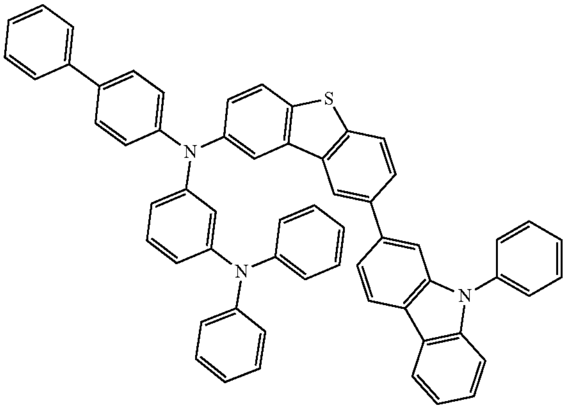

-continued
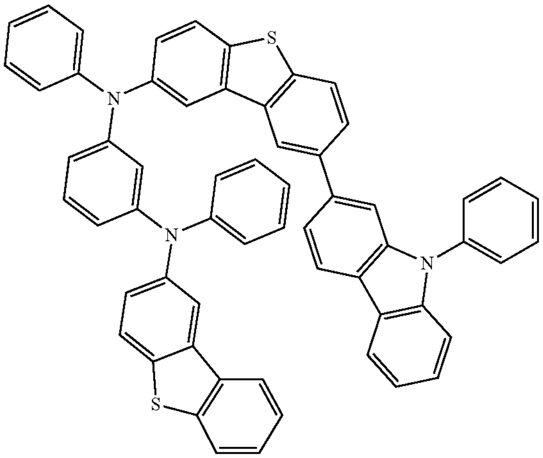
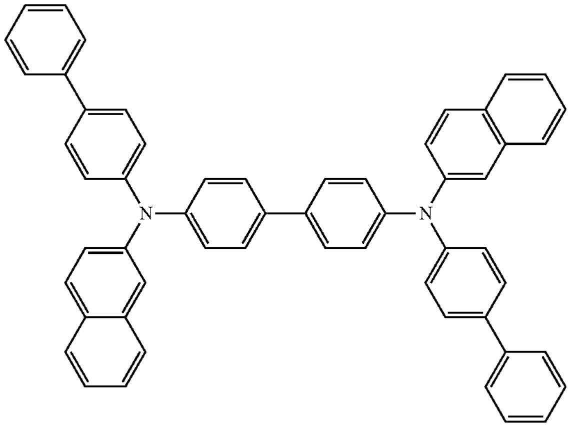
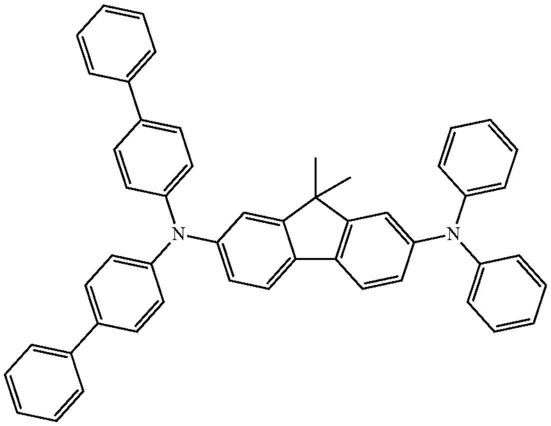
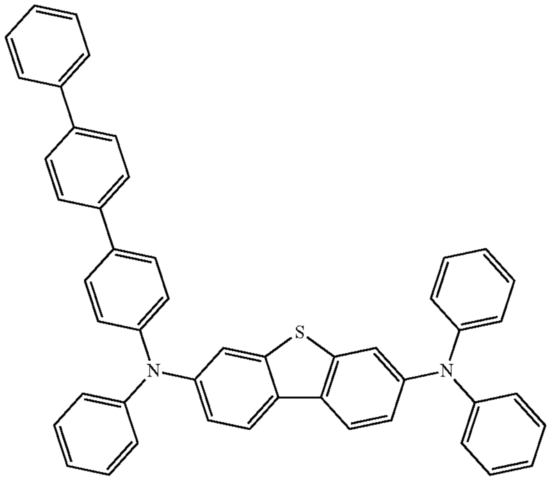
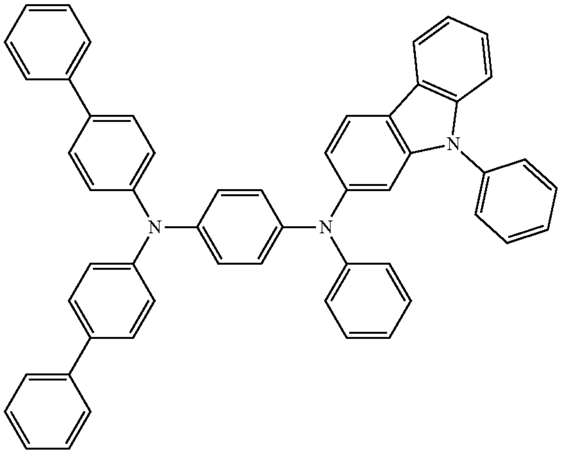
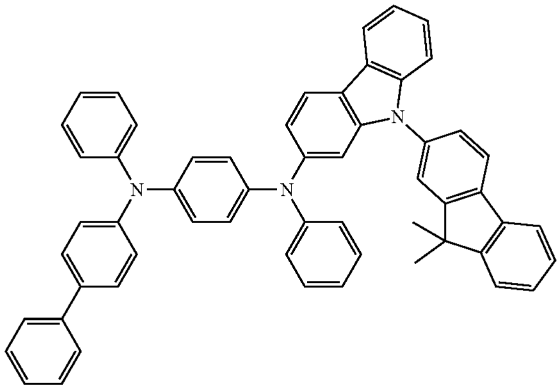

-continued
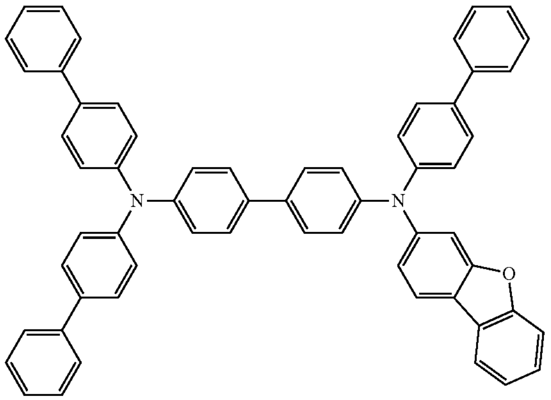
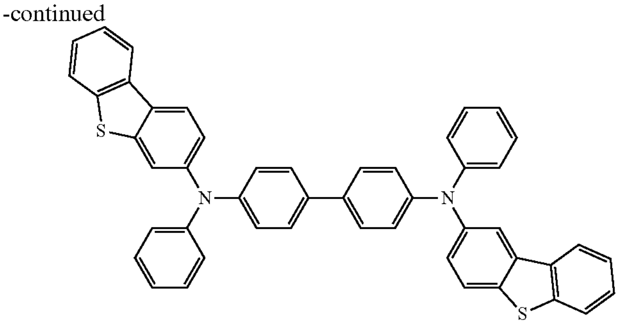
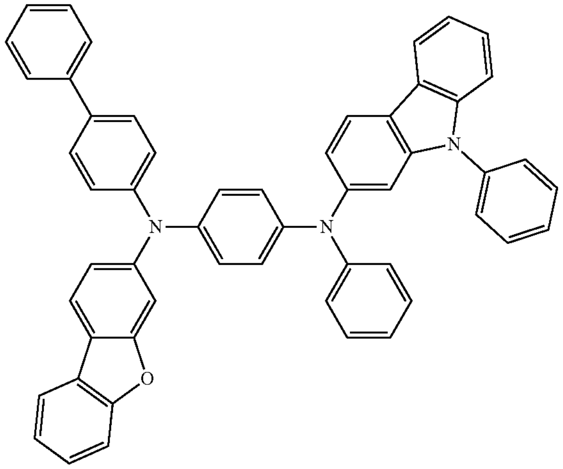
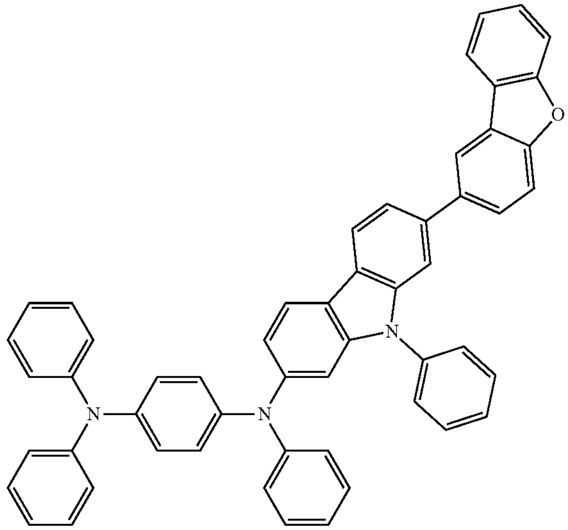
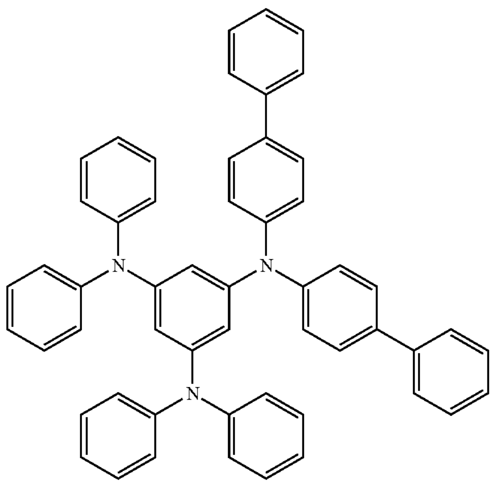
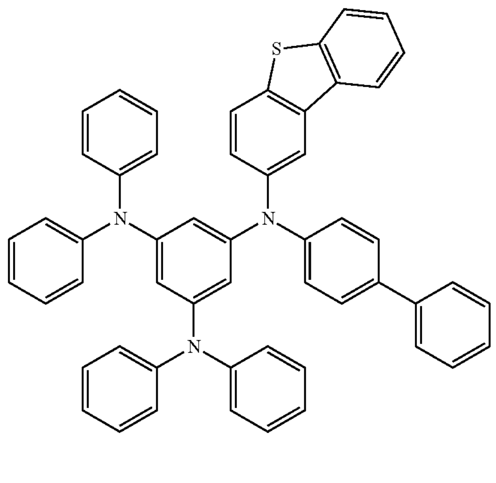

-continued
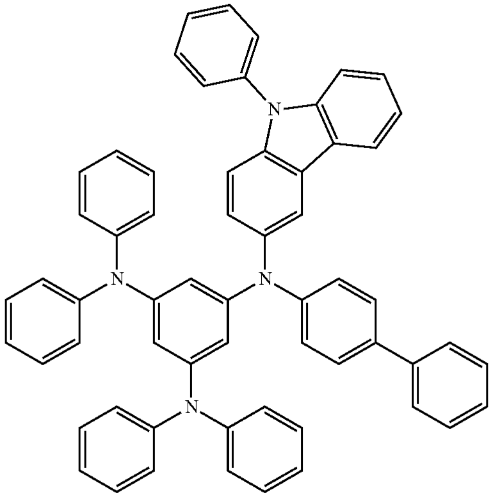
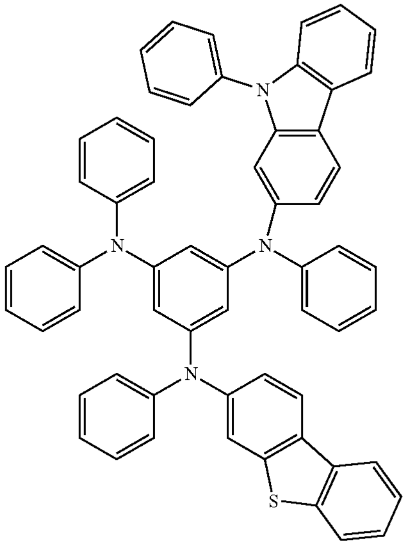
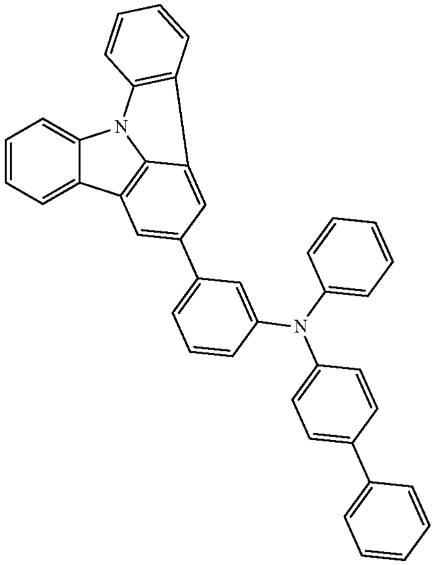
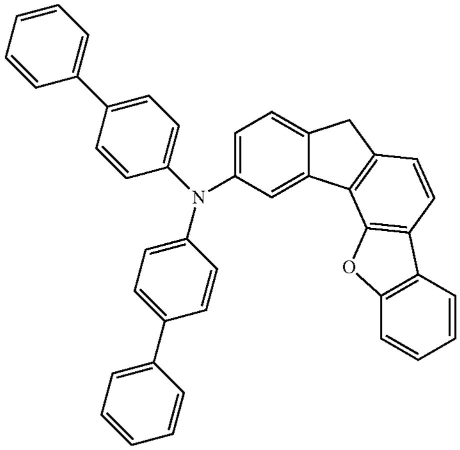
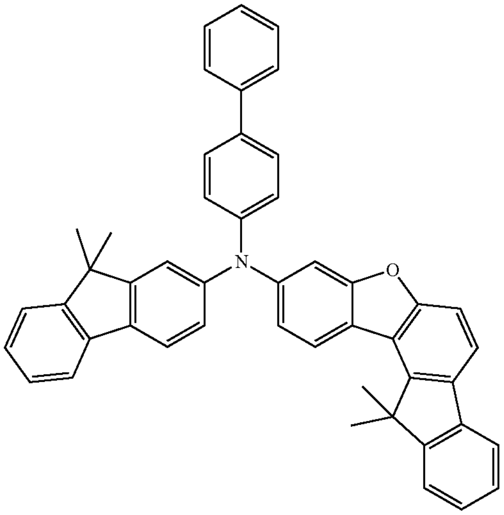
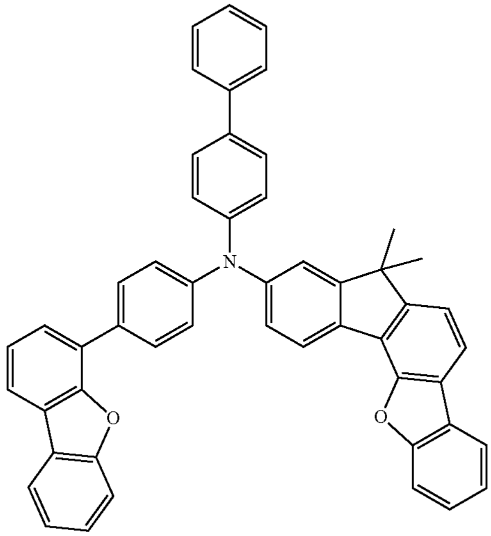

-continued
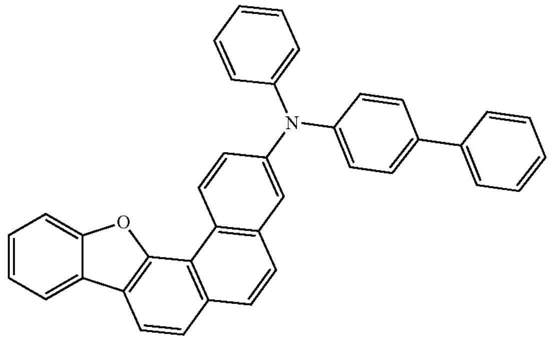
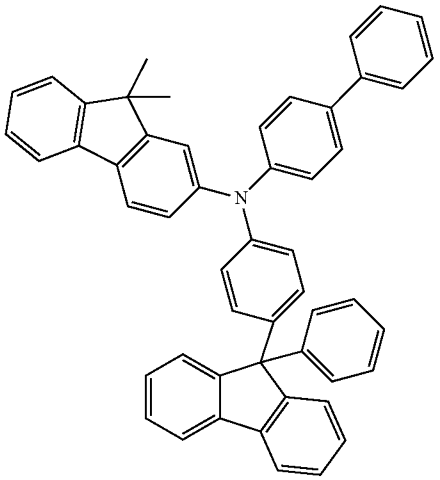
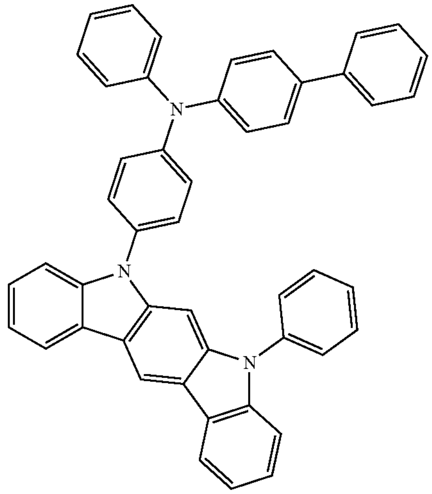
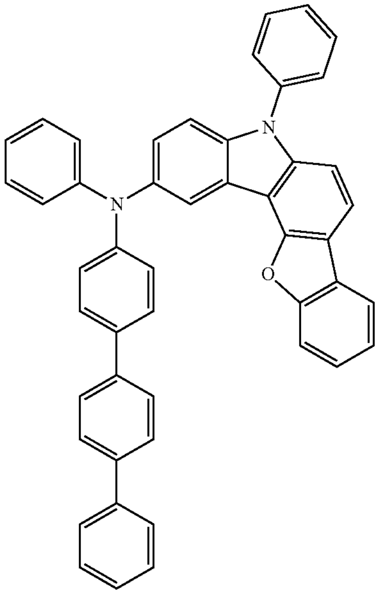
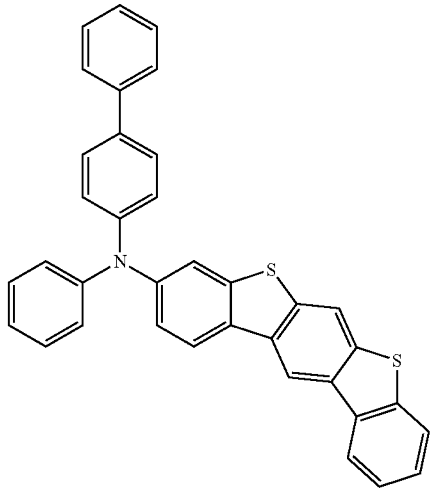
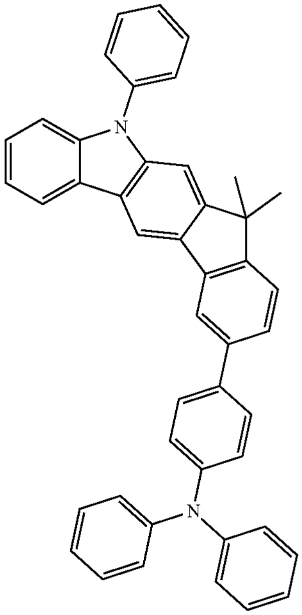

-continued
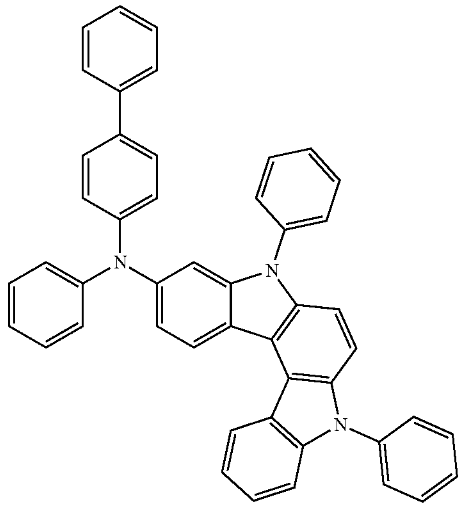
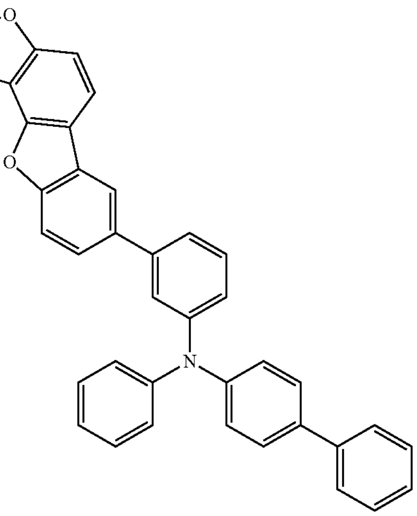
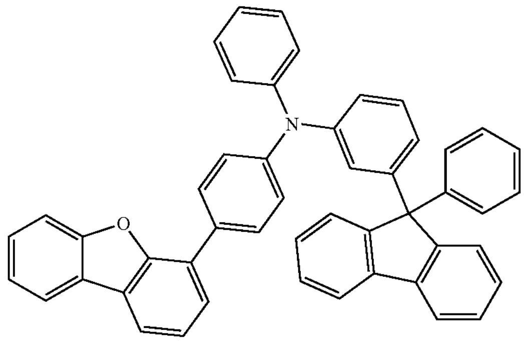
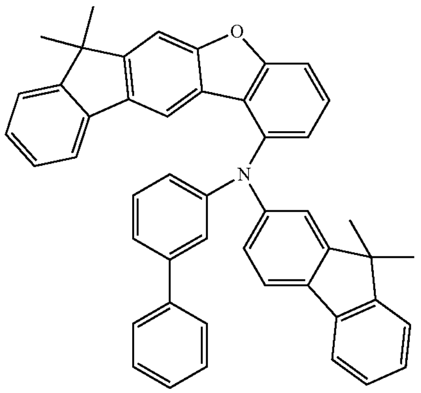
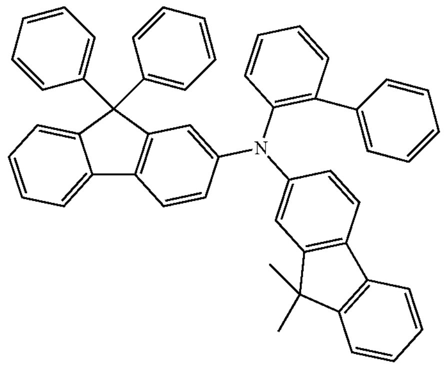
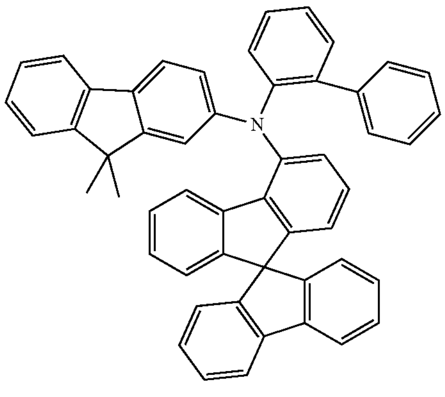

-continued
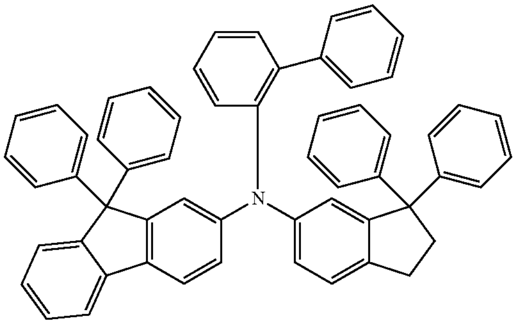
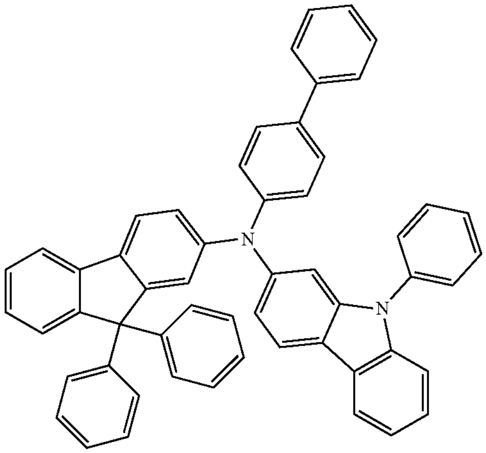
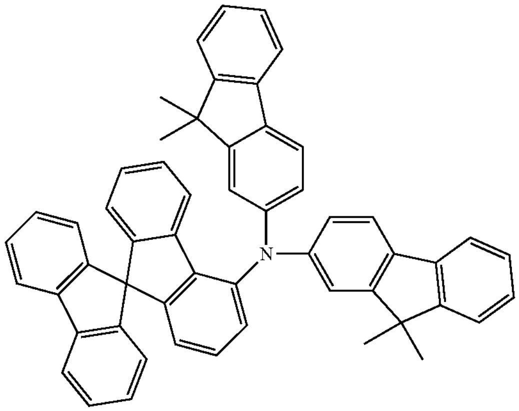
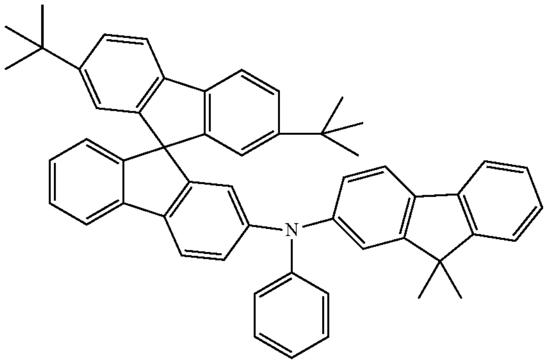
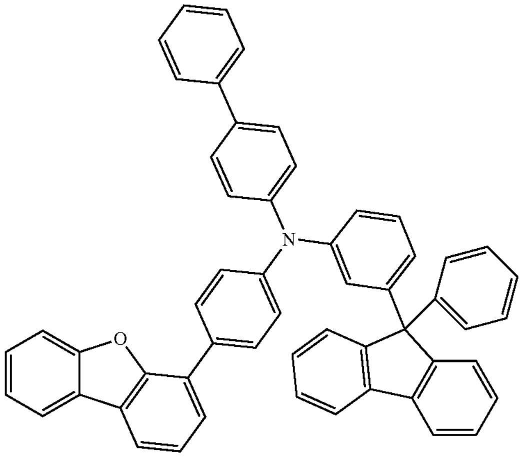
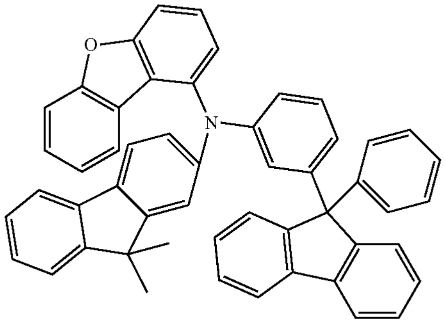
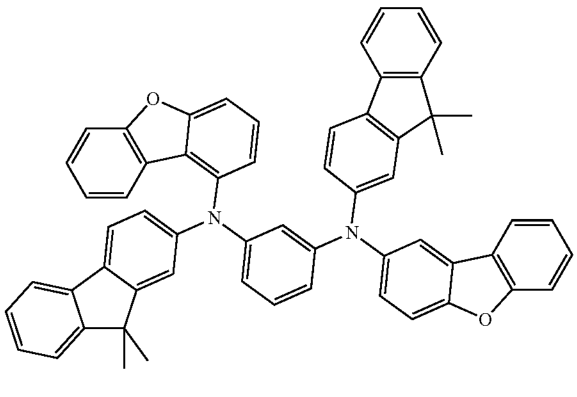
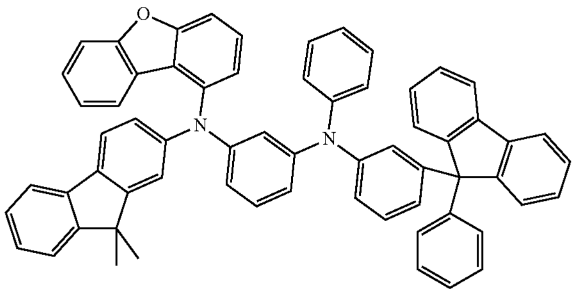

-continued
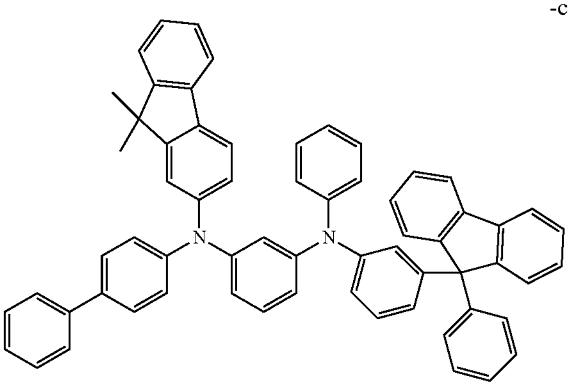
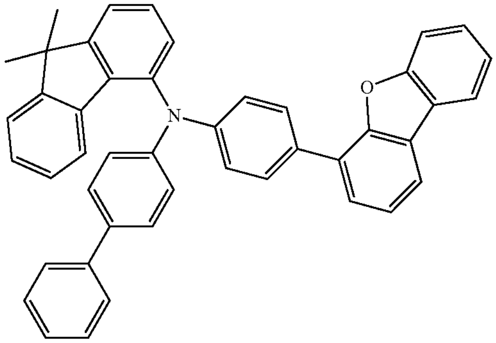
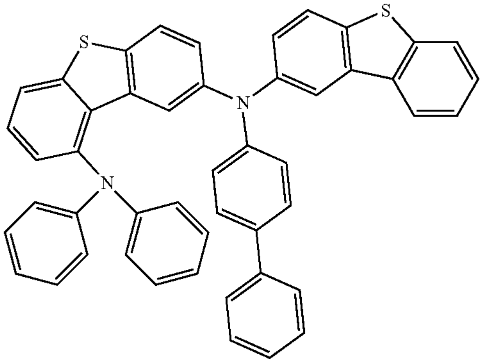
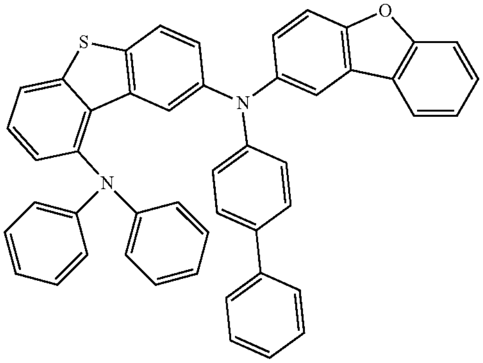
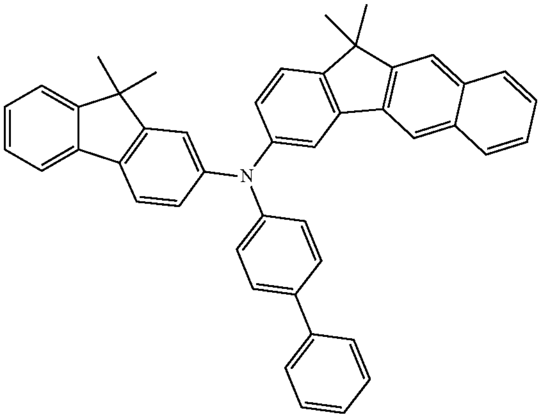
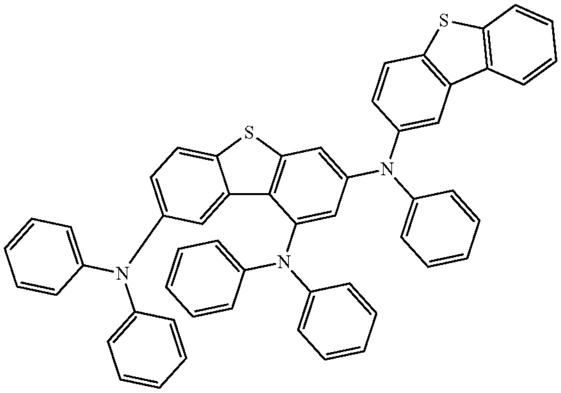
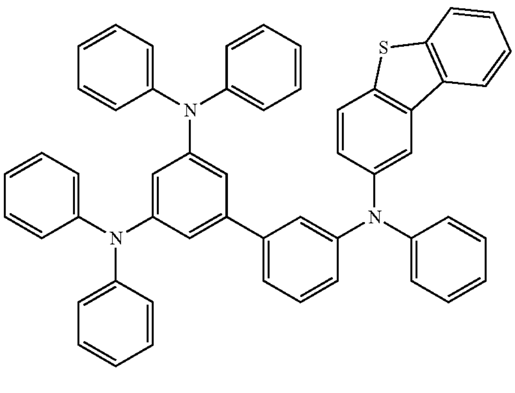
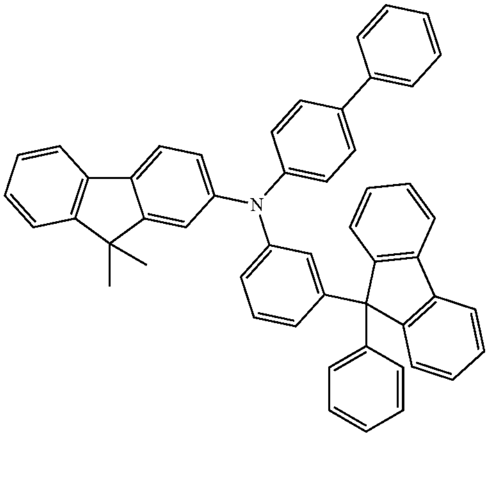

In the hole transport region, other suitable compounds may be used in addition to the compounds described herein.

In an implementation, the charge transport region may be, e.g., the electron transport region 150.

The electron transport region 150 may help further increase electron injection or electron mobility between the cathode 110 and the light emitting layer 130 and block holes.

In an implementation, the electron transport region 150 may include an electron transport layer between the cathode 110 and the light emitting layer 130, and an electron transport auxiliary layer between the light emitting layer 130 and the electron transport layer. In an implementation, a compound of Group C may be included in at least one of the electron transport layer and the electron transport auxiliary layer.

[Group C]

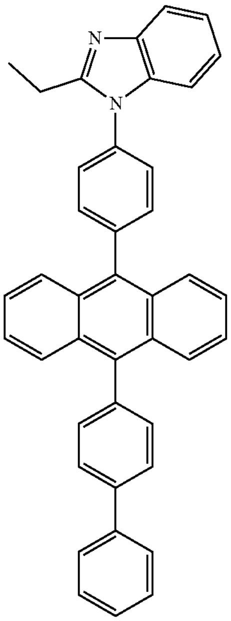

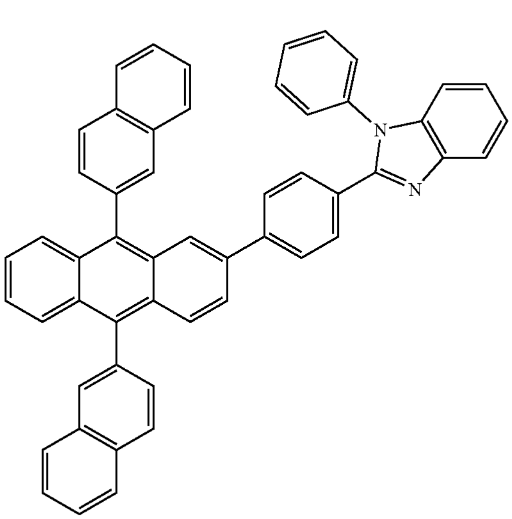

-continued

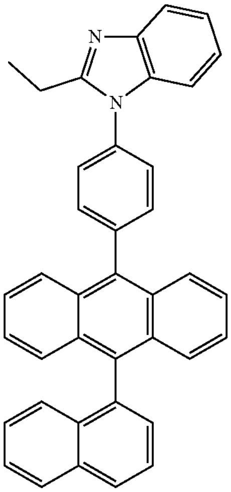

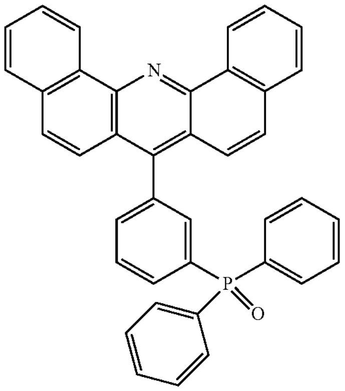

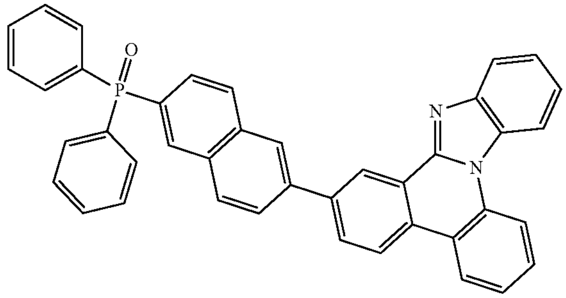

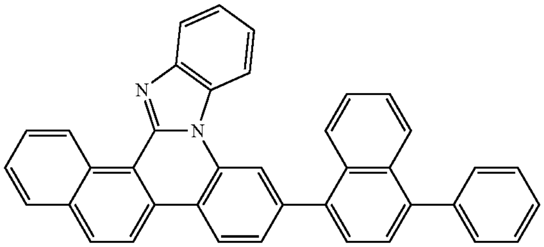

-continued
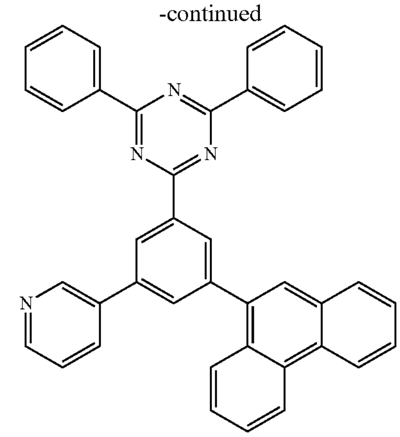
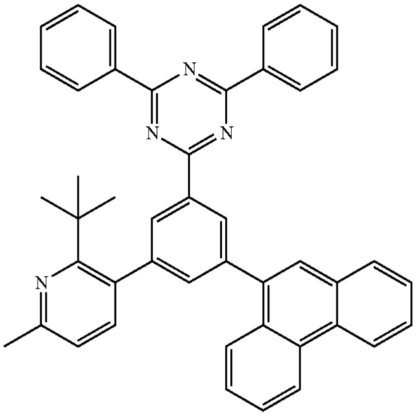
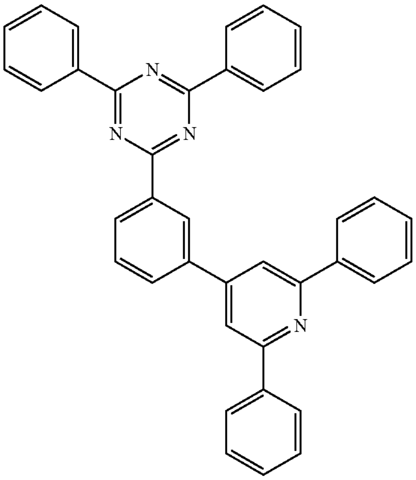
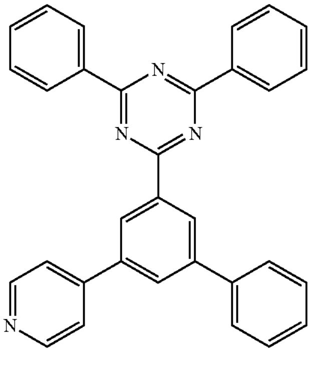
-continued
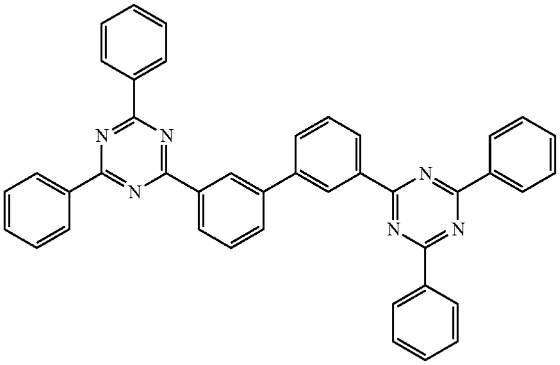
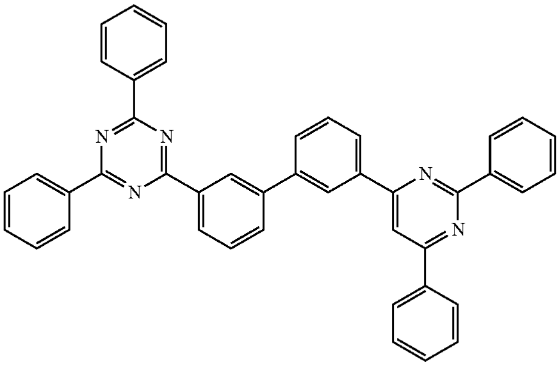
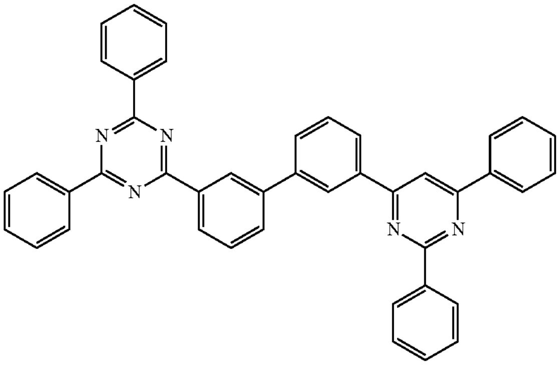
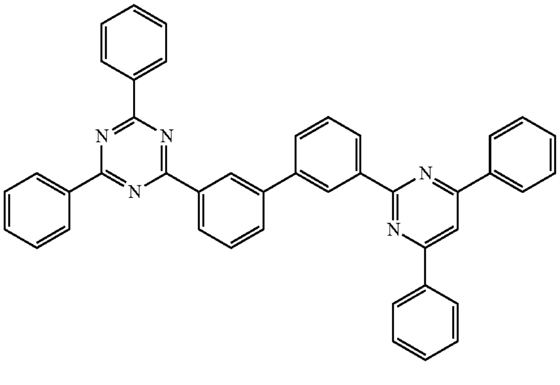

-continued
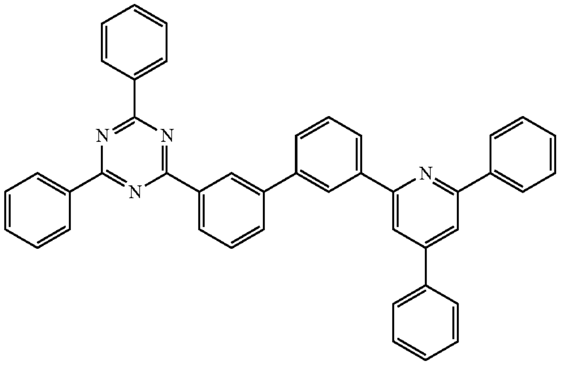
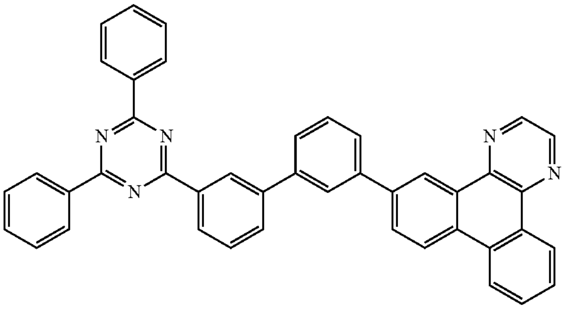
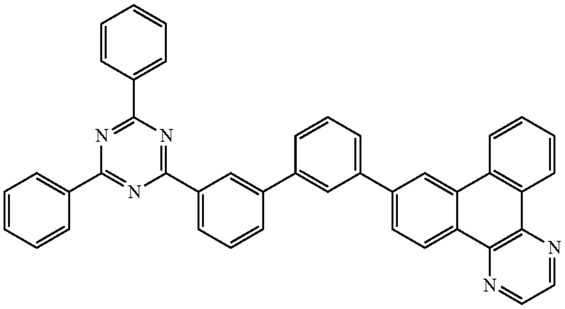
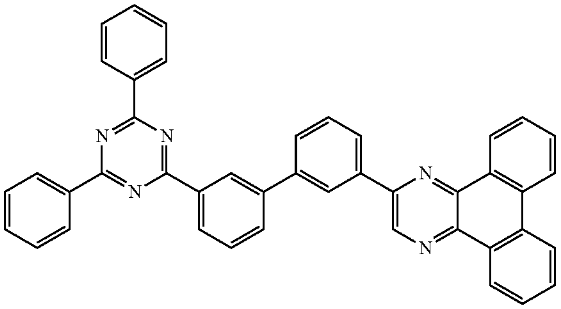
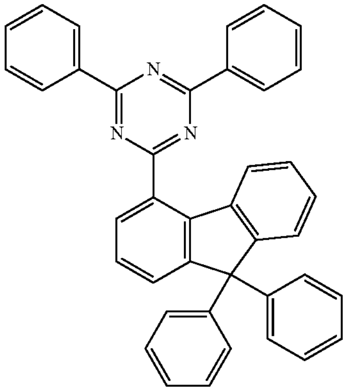
-continued
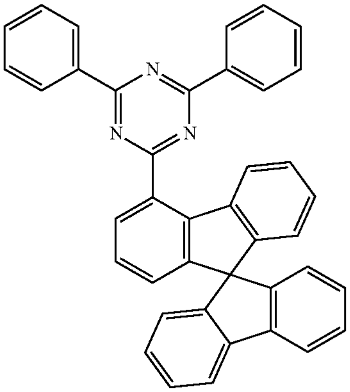
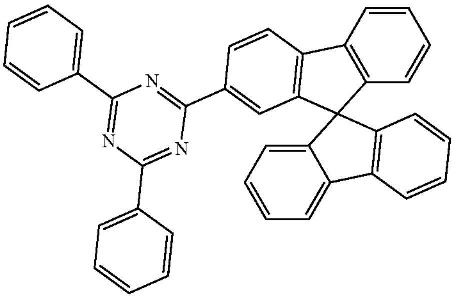
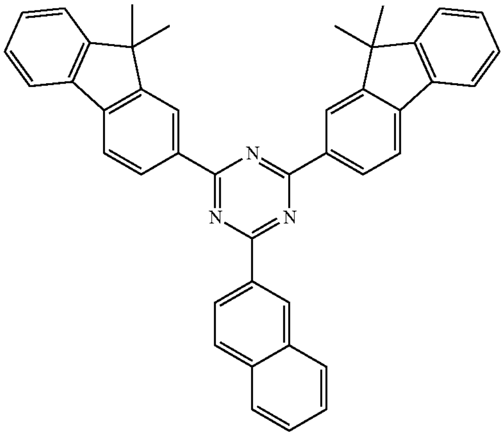
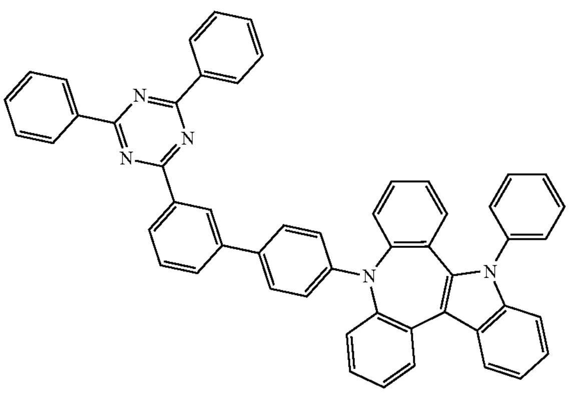

-continued
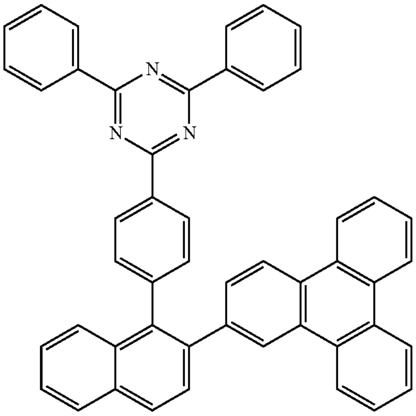
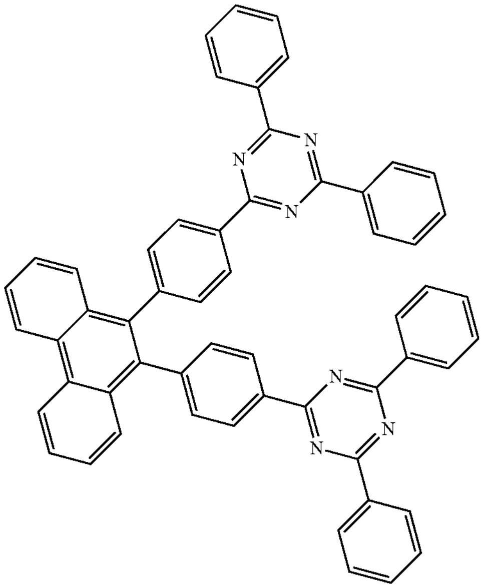
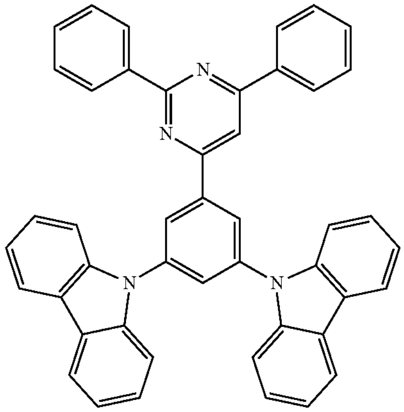
-continued
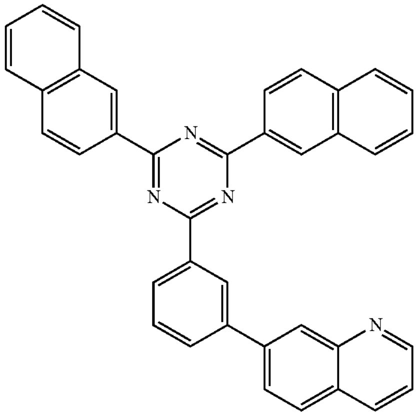
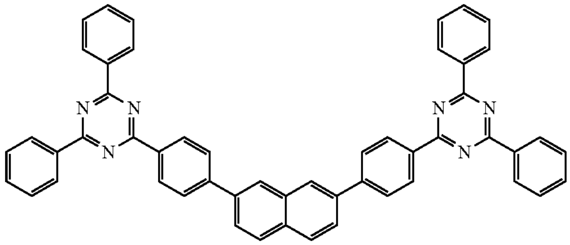
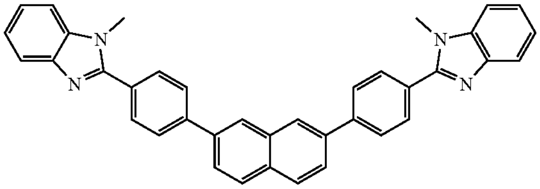
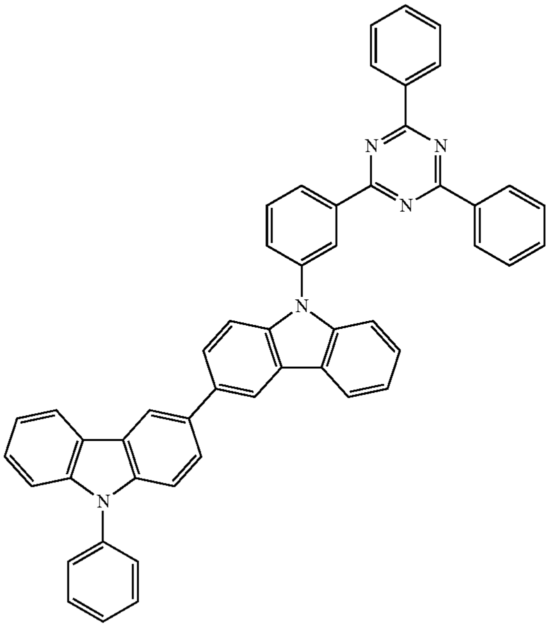

-continued
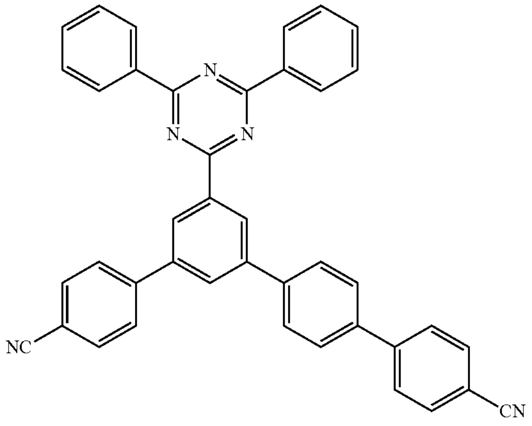
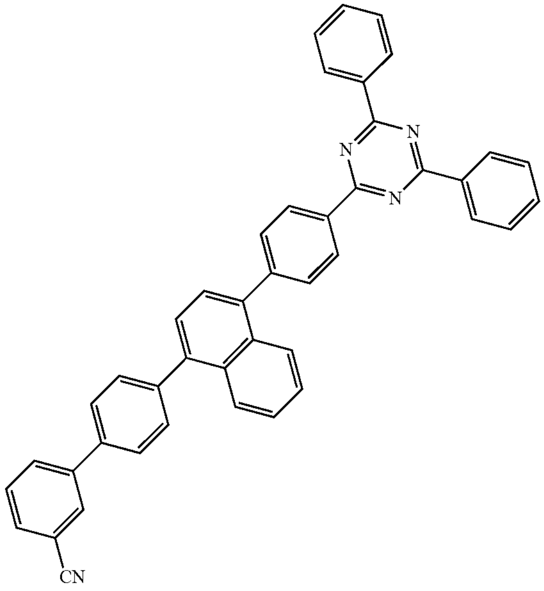
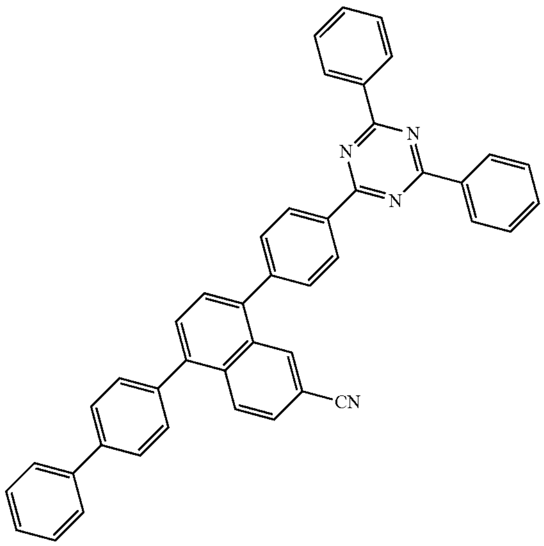
-continued
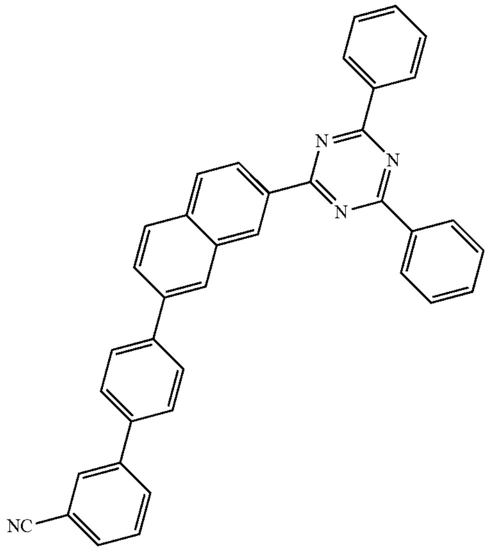
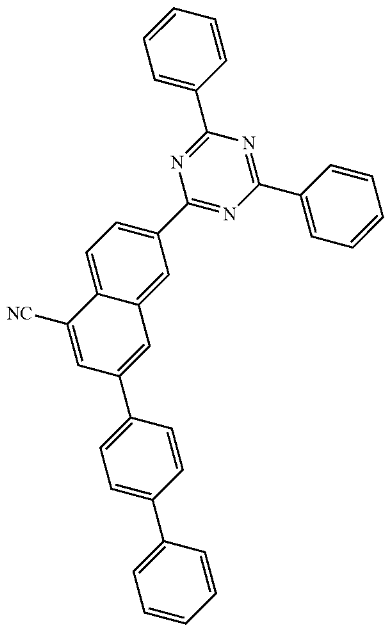

-continued
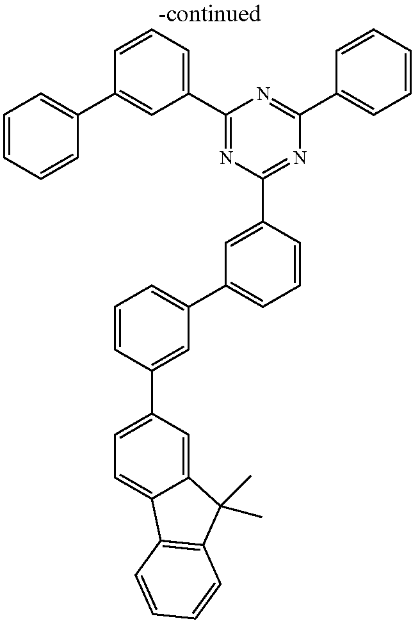
-continued
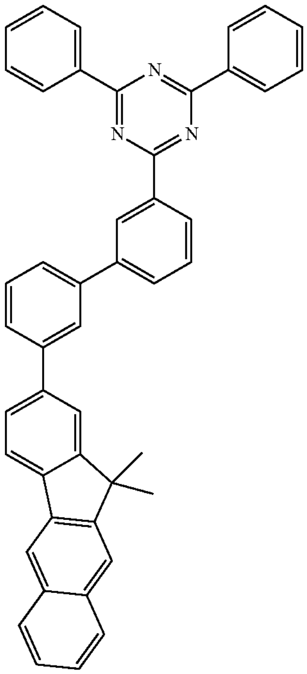
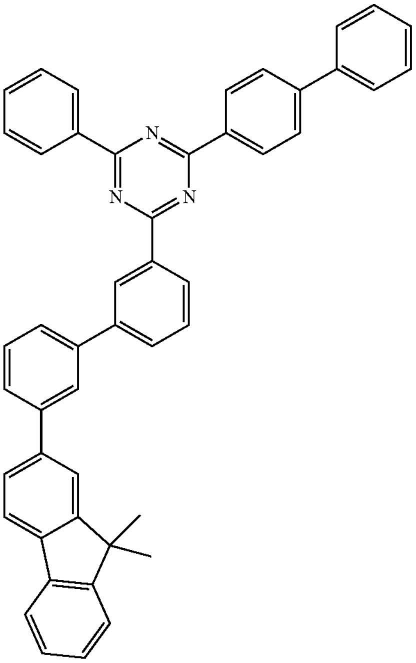
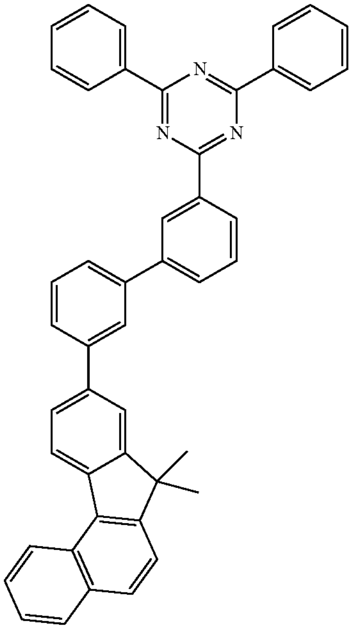

-continued
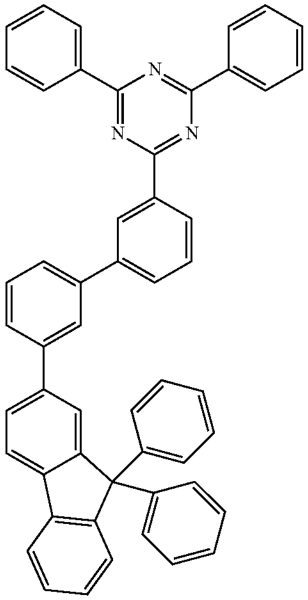
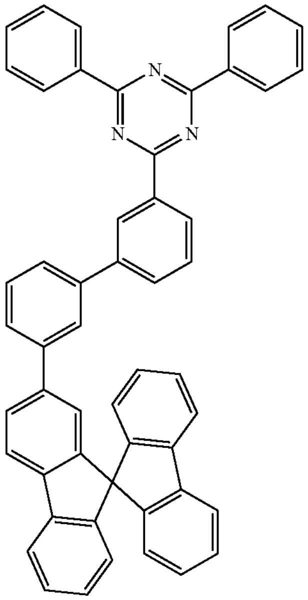
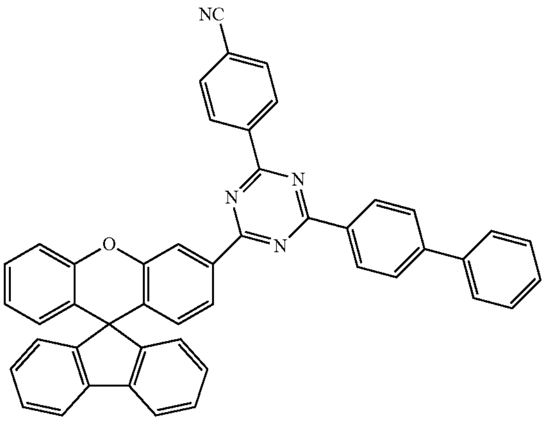
-continued
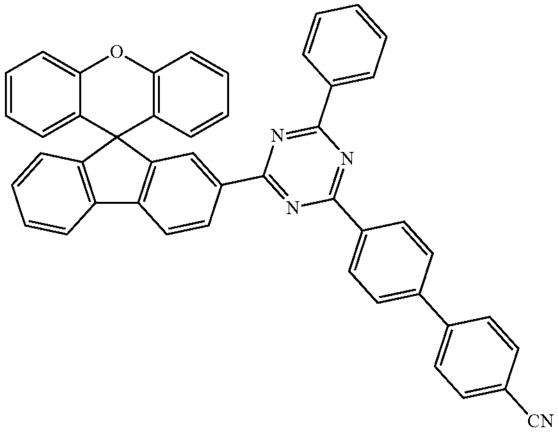
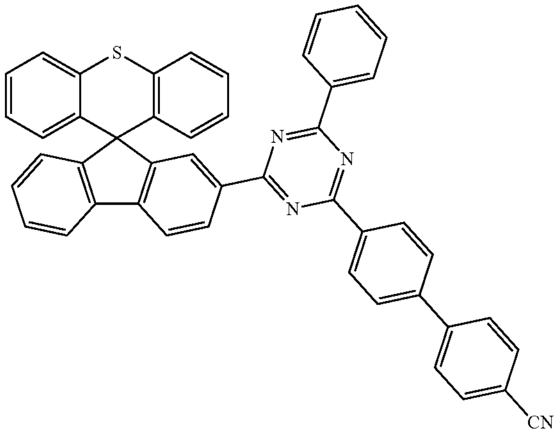
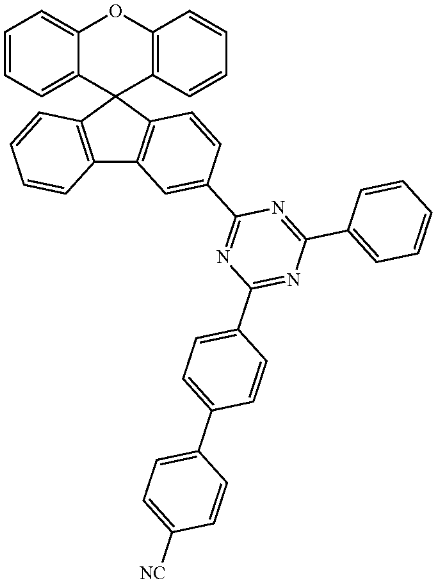

-continued
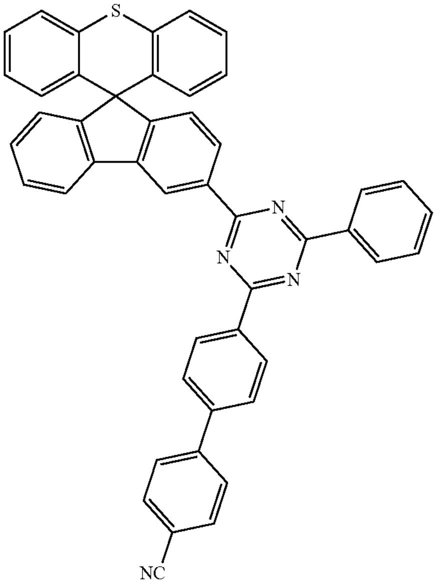
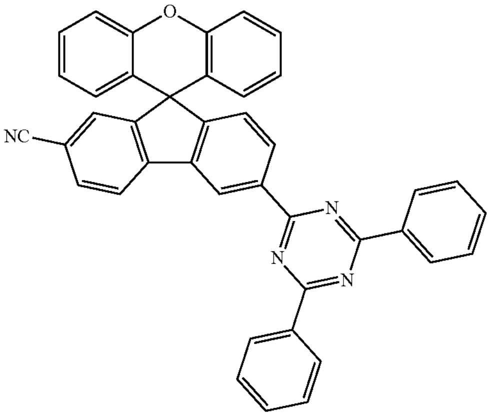
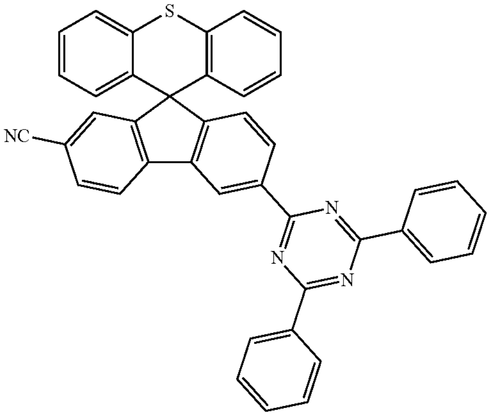
-continued
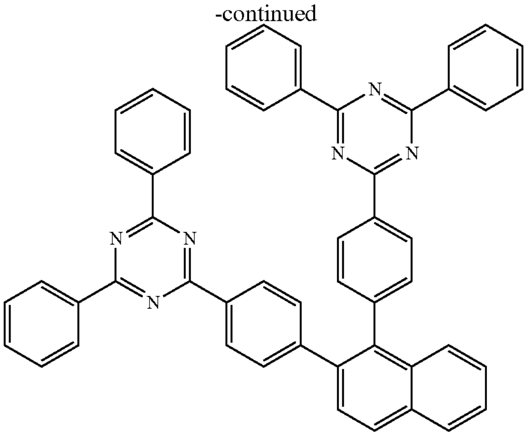
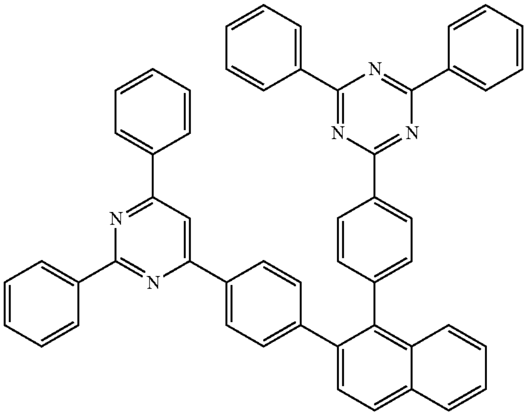
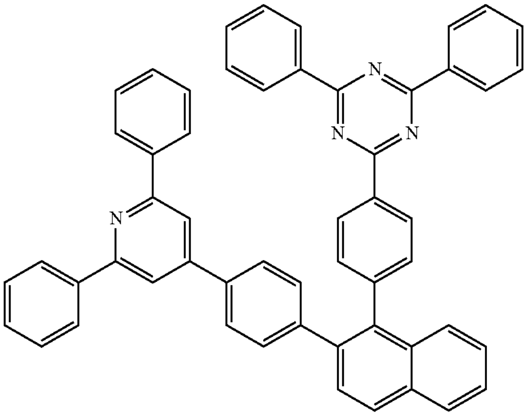
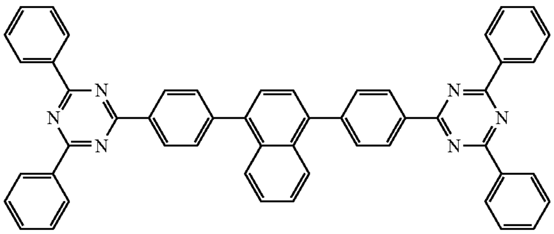

-continued

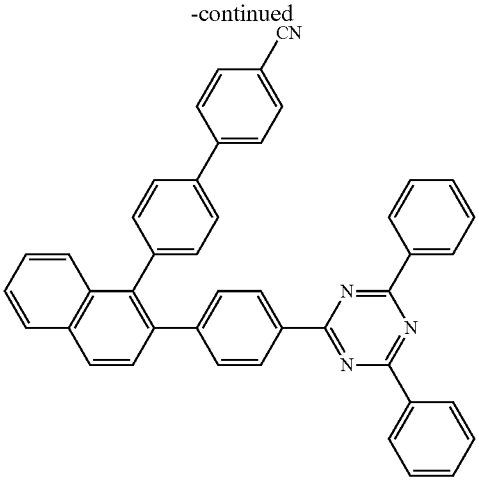

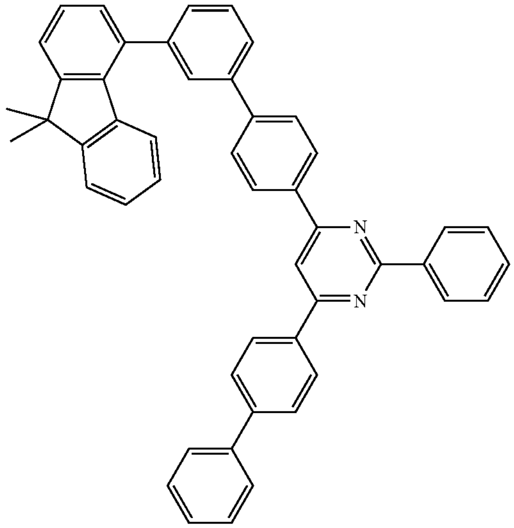

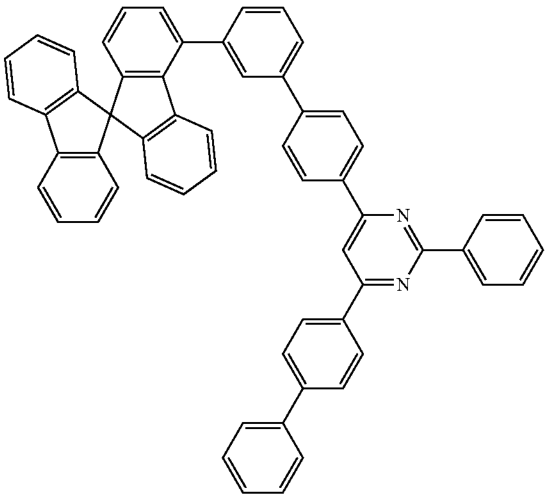

-continued

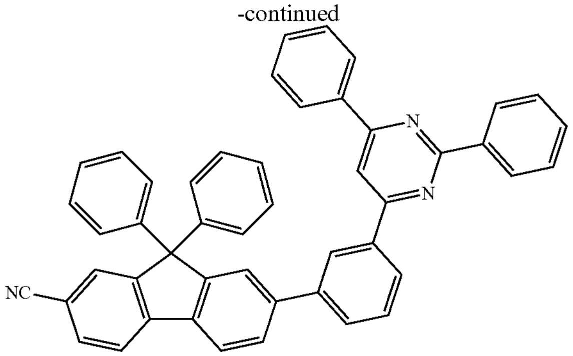

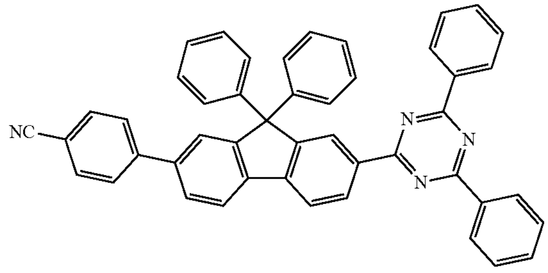

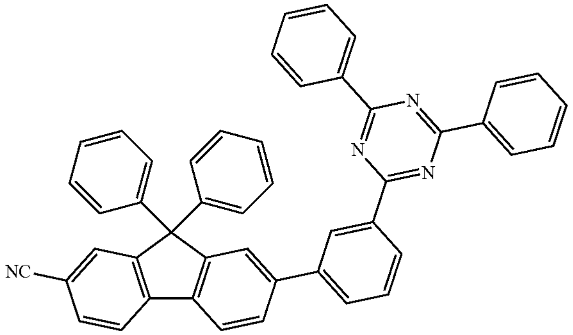 [SMILES: N#Cc1ccc2c(c1)C(c1ccccc1)(c1ccccc1)c1cc(-c3cccc(-c4nc(-c5ccccc5)nc(-c5ccccc5)n4)c3)ccc1-2]

One embodiment may provide an organic light emitting diode including a light emitting layer as an organic layer.

Another embodiment may provide an organic light emitting diode including a light emitting layer and a hole transport region as an organic layer.

Another embodiment may provide an organic light emitting diode including a light emitting layer and an electron transport region as an organic layer.

The organic light emitting diode according to an embodiment may be an organic light emitting diode including, e.g., a hole transport region 140 and an electron transport region 150 in addition to the light emitting layer 130 as the organic layer 105, as shown in the FIGURE.

In an implementation, the organic light emitting diode may further include an electron injection layer, a hole injection layer, or the like, in addition to the light emitting layer as the aforementioned organic layer.

The organic light emitting diode 100 may be produced by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

Hereinafter, the embodiments are illustrated in more detail with reference to examples. However, these examples are exemplary, and the present scope is not limited thereto.

Hereinafter, starting materials and reactants used in examples and synthesis examples were purchased from Sigma-Aldrich Co. Ltd., TCI Inc., Tokyo chemical industry or P&H tech as far as there is no particular comment or were synthesized by known methods.

(Preparation of Compound for Organic Optoelectronic Device)

Compounds were synthesized through the following steps.

(Synthesis of First Compound)

Synthesis Example 1: Synthesis of Int-1

[Reaction Scheme 1]

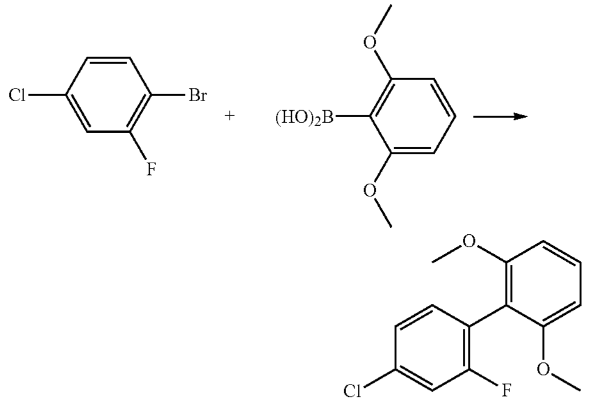

Int-1

1-bromo-4-chloro-2-fluorobenzene (61 g, 291 mmol), 2,6-dimethoxyphenylboronic acid (50.4 g, 277 mmol), $K_2CO_3$ (60.4 g, 437 mmol) and $Pd(PPh_3)_4$ (10.1 g, 8.7 mmol) were put in a round-bottomed flask and dissolved in THF (500 ml) and distilled water (200 ml) and then, stirred under reflux at 60° C. for 12 hours. When a reaction was completed, after removing an aqueous layer therefrom, column chromatography (hexane:dichloromethane (DCM) (20 vol %)) was used, obtaining 38 g (51%) of Int-1.

Synthesis Example 2: Synthesis of Int-2

[Reaction Scheme 2]

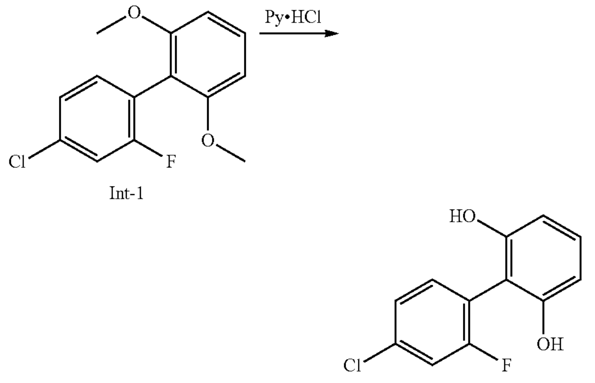

Int-1

Int-2

Int-1 (38 g, 142 mmol) and pyridine hydrochloride (165 g, 1425 mmol) were put in a round-bottomed flask and then, stirred under reflux at 200° C. for 24 hours. When a reaction was completed, the resultant was cooled to ambient temperature and slowly poured into distilled water and then, stirred for 1 hour. A solid therein was filtered, obtaining 23 g (68%) of Int-2.

Synthesis Example 3: Synthesis of Int-3

[Reaction Scheme 3]

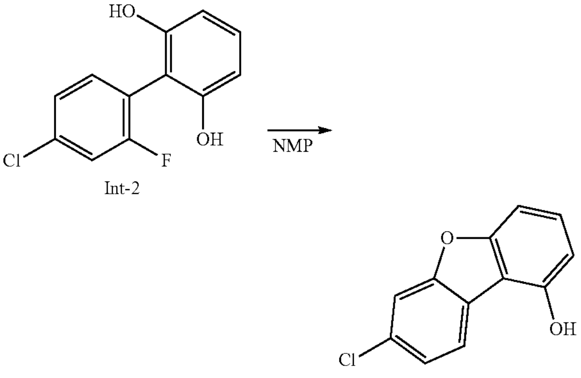

Int-2

Int-3

Int-2 (23 g, 96 mmol) and $K_2CO_3$ (20 g, 144 mmol) were put in a round-bottomed flask and dissolved in N-methylpyrrolidone (NMP) (100 ml) and then, stirred under reflux at 180° C. for 12 hours. When a reaction was completed, the mixture was poured into an excess of distilled water. A solid therein was filtered and dissolved in ethyl acetate and then, dried with $MgSO_4$, and an organic layer was removed therefrom under a reduced pressure. Subsequently, column chromatography (hexane:ethyl acetate (30 vol %)) was used, obtaining 16 g (76%) of Int-3.

Synthesis Example 4: Synthesis of Int-4

[Reaction Scheme 4]

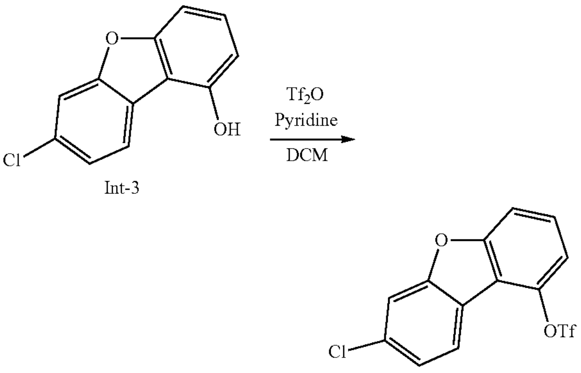

Int-3

Int-4

Int-3 (16 g, 73 mmol) and pyridine (12 ml, 146 mmol) were put in a round-bottomed flask and dissolved in DCM (200 ml). After decreasing a temperature to 0° C., trifluoromethanesulfonic anhydride (14.7 ml, 88 mmol) was slowly added thereto in a dropwise fashion. After stirring the mixture for 6 hours, when a reaction was completed, an excess of distilled water was added thereto and then, stirred for 30 minutes and extracted with DCM. After removing an organic solvent under a reduced pressure, the residue was vacuum-dried, obtaining 22.5 g (88%) of Int-4.

Synthesis Example 5: Synthesis of Int-5

[Reaction Scheme 5]

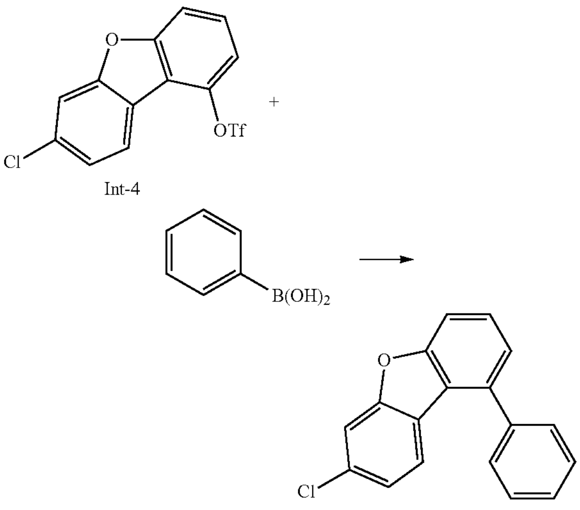

Int-4 (22.5 g, 64 mmol), phenylboronic acid (7.8 g, 64 mmol), $K_2CO_3$ (13.3 g, 96 mmol), and $Pd(PPh_3)_4$ (3.7 g, 3.2 mmol) were used in the same manner as Synthesis Example 1, synthesizing 14.4 g (81%) of Int-5.

Synthesis Example 6: Synthesis of Int-6

[Reaction Scheme 6]

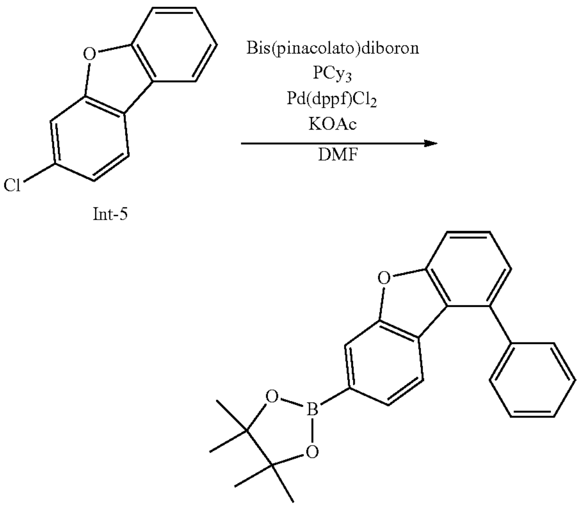

Int-6

Int-5 (22.5 g, 80 mmol), bis(pinacolato)diboron (24.6 g, 97 mmol), $Pd(dppf)Cl_2$ (2 g, 2.4 mmol), tricyclohexylphosphine (3.9 g, 16 mmol), and potassium acetate (16 g, 161 mmol) were put in a round-bottomed flask and dissolved in 320 ml of DMF. The mixture was stirred under reflux at 120° C. for 10 hours. When a reaction was completed, the mixture was poured into an excess of distilled water and then, stirred for 1 hour. A solid therein was filtered and dissolved in DCM. After removing moisture with $MgSO_4$, an organic solvent was filtered with a silica gel pad and removed under a reduced pressure. The solid therefrom was recrystallized with ethyl acetate and hexane, obtaining 26.9 g (90%) of Int-6.

Synthesis Example 7: Synthesis of Int-7

[Reaction Scheme 7]

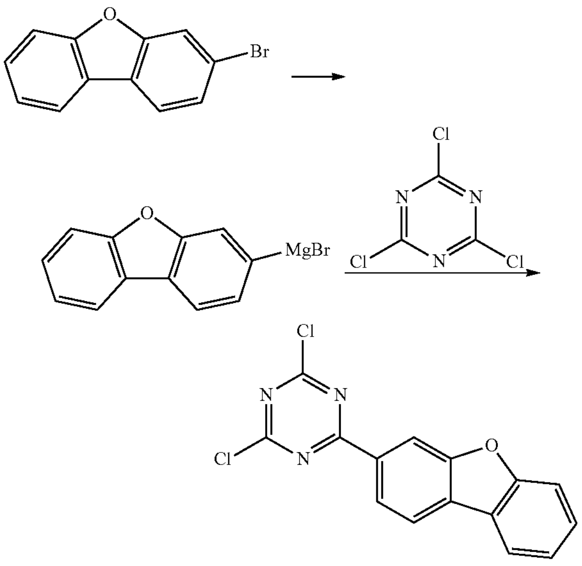

Int-7

Mg (4.9 g, 202 mmol) was put in a round-bottomed flask under a nitrogen and heated with a heat gun. When moderately cooled down, iodine (0.5 g, 2 mmol) was added thereto, and THF (30 ml) was added thereto and then, stirred. Subsequently, 3-bromodibenzofuran (50 g, 202 mmol) dissolved in THF (100 ml) was put in a dropping funnel and then, slowly added dropwise to the round-bottomed flask. The mixed solution became transparent, generating heat and thus was stirred, until completely transparent. In a new round-bottomed flask, cyanuric chloride (37.3 g, 202 mmol) was dissolved in THF (200 ml) and then, placed under an ice bath condition. Subsequently, a Grignard reagent, which had already been prepared, was slowly added thereto in a dropwise fashion. The obtained mixture was additionally stirred for 1 hour or so, and distilled water was added thereto, completing a reaction. An organic layer was separated therefrom, and the solvent was removed therefrom under a reduced pressure. After adding a small amount of DCM thereto to dissolve a product therefrom and then, adding the solution dropwise to methanol to precipitate a solid, the solid was filtered, obtaining 38 g (60%) of Int-7.

Synthesis Example 8: Synthesis of Int-8

[Reaction Scheme 8]

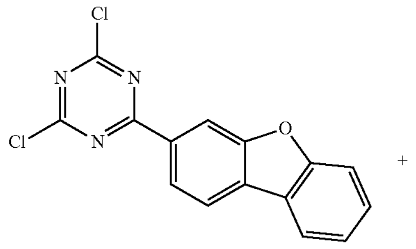

Int-7

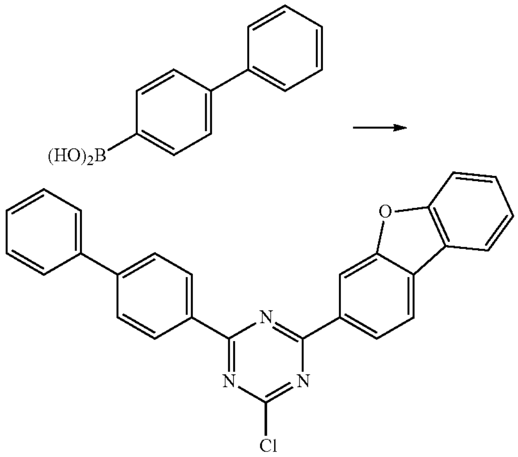

Int-8

Int-7 (19 g, 60 mmol), 4-biphenylboronic acid (11.9 g, 60 mmol), $K_2CO_3$ (12.5 g, 90 mmol), and $Pd(PPh_3)_4$ (3.5 g, 3 mmol) were used under a nitrogen condition in a round-bottomed flask in the same manner as Synthesis Example 1, synthesizing 15.1 g (58%) of Int-8.

Synthesis Example 9: Synthesis of Int-9

[Reaction Scheme 9]

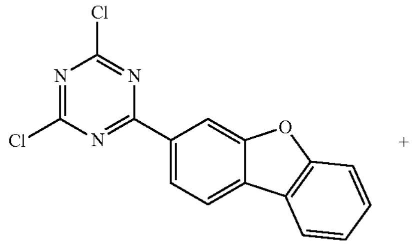

Int-7

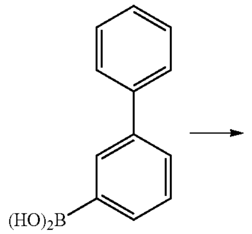

-continued

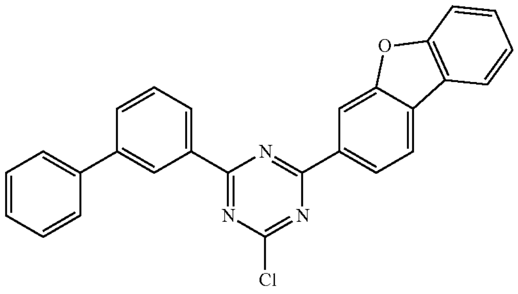

Int. 9

Int-7 (19 g, 60 mmol), 3-biphenylboronic acid (11.9 g, 60 mmol), $K_2CO_3$ (12.5 g, 90 mmol), and $Pd(PPh_3)_4$ (3.5 g, 3 mmol) were used under a nitrogen condition in a round-bottomed flask in the same manner as Synthesis Example 1, synthesizing 15.9 g (61%) of Int-9.

Synthesis Example 10: Synthesis of Compound 12

[Reaction Scheme 10]

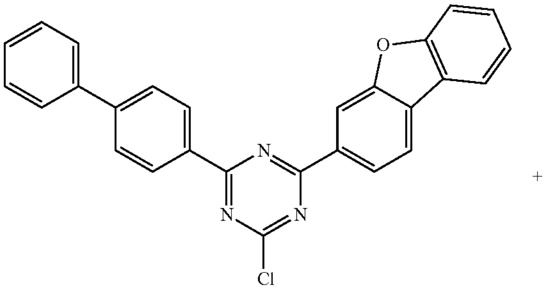

Int-8

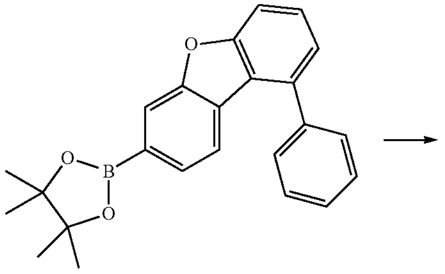

Int-6

-continued

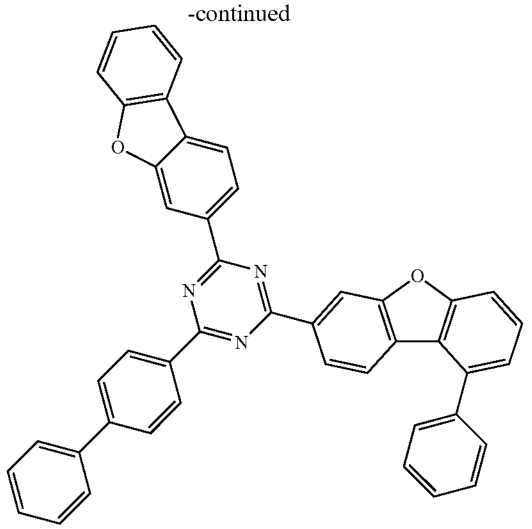

12

Int-8 (15 g, 35 mmol), Int-6 (12.8 g, 35 mmol), $K_2CO_3$ (7.2 g, 52 mmol) and $Pd(PPh_3)_4$ (2 g, 1.7 mmol) were used under a nitrogen condition in a round-bottomed flask in the same manner as Synthesis Example 1, synthesizing 15.5 g (70%) of Compound 12. LC/MS calculated for: $C_{45}H_{27}N_3O_2$ Exact Mass: 641.21 found for: 642.64

Synthesis Example 11: Synthesis of Compound 16

[Reaction Scheme 11]

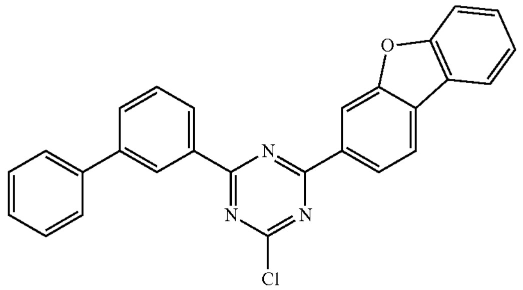

Int-9

+

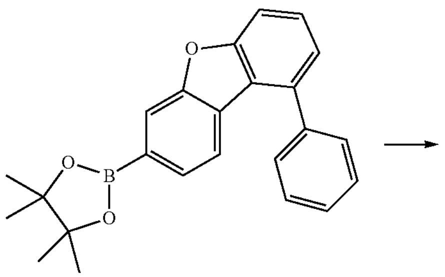

Int-6

-continued

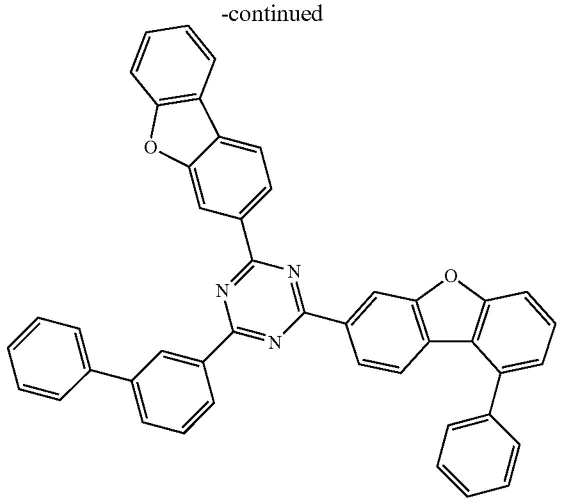

16

Int-9 (15.9 g, 37 mmol), Int-6 (15 g, 40 mmol), $K_2CO_3$ (7.6 g, 55 mmol) and $Pd(PPh_3)_4$ (2.1 g, 1.8 mmol)) were used under a nitrogen condition in a round-bottomed flask in the same manner as Synthesis Example 1, synthesizing 18.8 g (80%) of Compound 16. LC/MS calculated for: $C_{45}H_{27}N_3O_2$ Exact Mass: 641.21 found for: 642.16

Synthesis Example 12: Synthesis of Int-10

[Reaction Scheme 12]

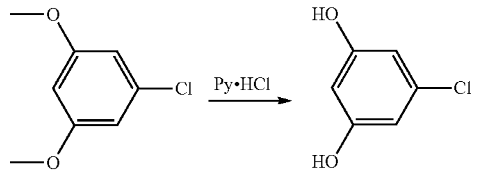

Int-10

1-chloro-3,5-dimethoxybenzene (70 g, 406 mmol) and pyridine hydrochloride (468 g, 4,055 mmol) were put in a round-bottomed flask and stirred under reflux at 200° C. for 24 hours. When a reaction was completed, the resultant was cooled to ambient temperature and slowly poured into distilled water for 1 hour and then, stirred. A solid therein were filtered, obtaining 51.6 g (88%) of Int-10.

Synthesis Example 13: Synthesis of Int-11

[Reaction Scheme 13]

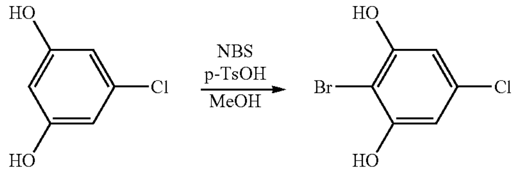

Int-10 Int-11

Int-10 (51.6 g, 357 mmol) and p-toluene sulfonic acid monohydrate (6.8 g, 36 mmol) were put in a round-bottomed flask and dissolved in 500 ml of methanol. Subsequently, a solution prepared by dissolving N-bromosuccinimide (NBS) (63.5 g, 357 mmol) in methanol (1 L) was slowly added thereto in a dropwise fashion at 0° C. for 30 minutes. After stirring the mixture for 1 hour at ambient temperature, when a reaction was completed, a sodium thiosulfate saturated solution was poured thereinto and then, stirred. Subsequently, DCM was added thereto for extraction, and the solvent was removed therefrom under a reduced pressure. A product therein was separated through flash column chromatography, obtaining 72 g (90%) of Int-11.

Synthesis Example 14: Synthesis of Int-12

[Reaction Scheme 14]

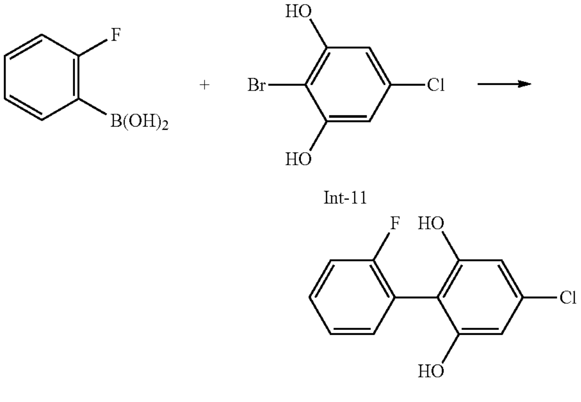

Int-11

Int-12

In a round-bottomed flask under a nitrogen atmosphere, 2-fluorophenylboronic acid (45 g, 322 mmol), Int-11 (72 g, 322 mmol), $K_2CO_3$ (97.8 g, 708 mmol), and $Pd(PPh_3)_4$ (11.2 g, 9.7 mmol) were used in the same manner as Synthesis Example 1, synthesizing 34.5 g (45%) of Int-12.

Synthesis Example 15: Synthesis of Int-13

[Reaction Scheme 15]

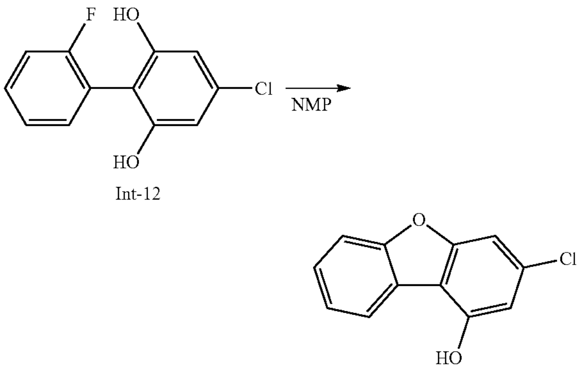

Int-12

Int-13

26.9 g (85%) of Int-13 was synthesized in the same manner as Synthesis Example 3 by and dissolving Int-12 (34.5 g, 145 mmol) and $K_2CO_3$ (26 g, 188 mmol) in 450 ml of NMP in a round-bottomed flask.

Synthesis Example 16: Synthesis of Int-14

[Reaction Scheme 16]

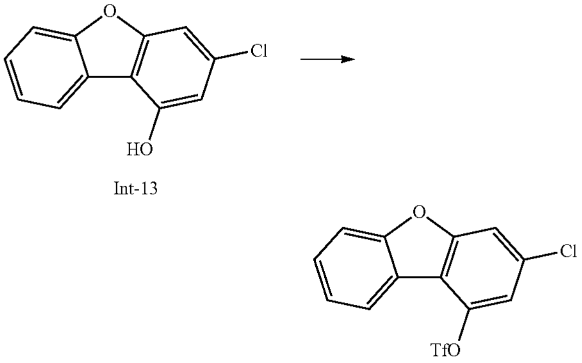

Int-13

Int-14

Int-13 (26.9 g, 123 mmol) and pyridine (20 ml, 246 mmol) were put in a round-bottomed flask and dissolved in DCM (300 ml). After decreasing a temperature to 0° C., trifluoromethane sulfonic anhydride (24.7 ml, 148 mmol) were slowly added thereto in a dropwise fashion. The obtained mixture was stirred for 6 hours, and when a reaction was completed, an excess of distilled water was added thereto and then, stirred for 30 minutes and extracted with DCM. After removing an organic solvent therefrom under a reduced pressure, the residue was vacuum-dried, obtaining 36.2 g (84%) of Int-14.

Synthesis Example 17: Synthesis of Int-15

[Reaction Scheme 17]

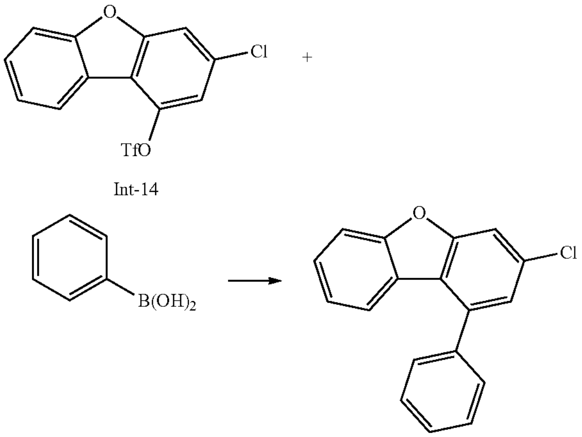

Int-14

Int-15

Int-14 (36.2 g, 103 mmol), phenylboronic acid (12.6 g, 103 mmol), $K_2CO_3$ (21.4 g, 155 mmol), and $Pd(PPh_3)_4$ (5.9 g, 5 mmol) were used in the same manner as Synthesis Example 1, obtaining 25.9 g (90%) of Int-15

Synthesis Example 18: Synthesis of Int-16

[Reactions Scheme 18]

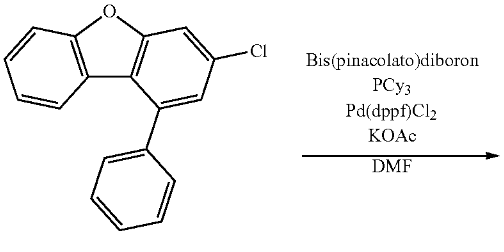

Int-15

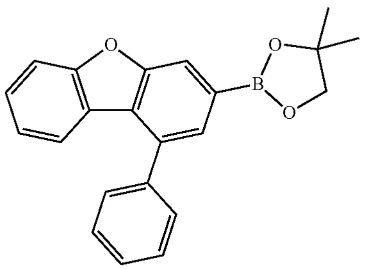

Int-16

25.8 g (75%) of Int-16 was synthesized in the same manner as Synthesis Example 6 by dissolving Int-15 (25.9 g, 93 mmol), bis(pinacolato)diboron (28.3 g, 112 mmol), $Pd(dppf)Cl_2$ (2.3 g, 2.8 mmol), tricyclohexylphosphine (4.5 g, 18.6 mmol), and potassium acetate (18.2 g, 186 mmol) in DMF (350 ml) in a round-bottomed flask.

Synthesis Example 19: Synthesis of Compound 9

[Reaction Scheme 19]

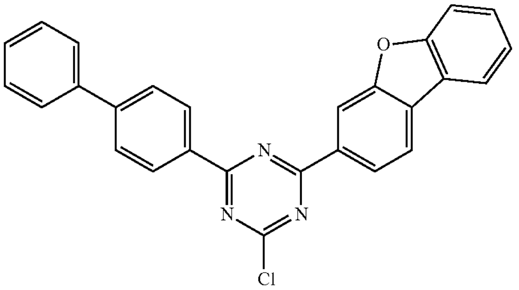

+

Int-8

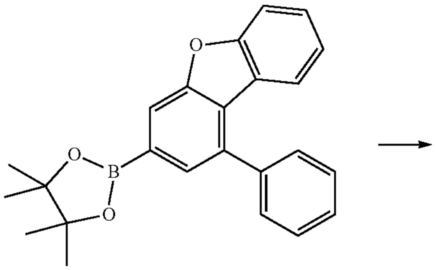

Int-16

-continued

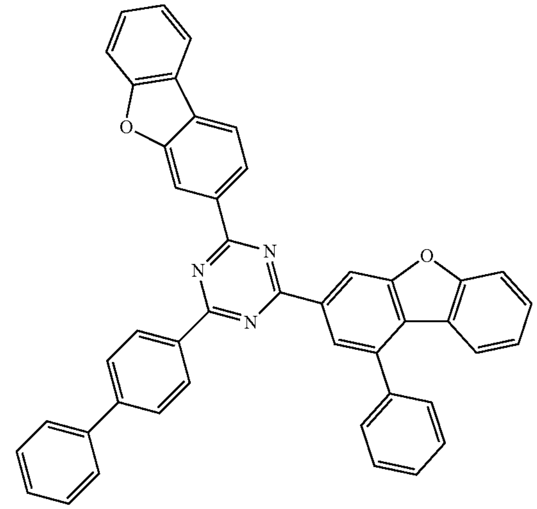

9

20.2 g (77%) of Compound 9 was synthesized in the same manner as Synthesis Example 1 by using Int-8 (12 g, 28 mmol), Int-16 (11 g, 30 mmol), $K_2CO_3$ (5.7 g, 41 mmol), and $Pd(PPh_3)_4$ (1.6 g, 1.4 mmol) in a round-bottomed flask under a nitrogen atmosphere. LC/MS calculated for: $C_{45}H_{27}N_3O_2$ Exact Mass: 641.21 found for: 642.31

Synthesis Example 20: Synthesis of Int-33

[Reactions Scheme 20]

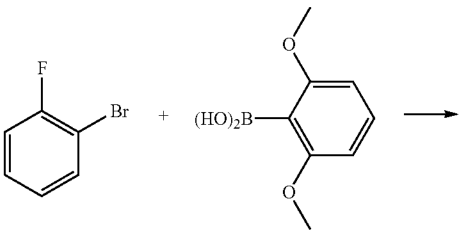

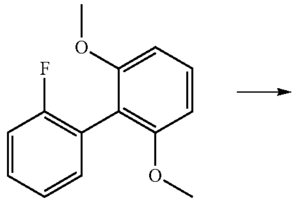

Int-29

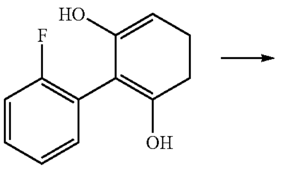

Int-30

-continued

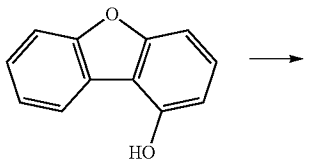

Int-31

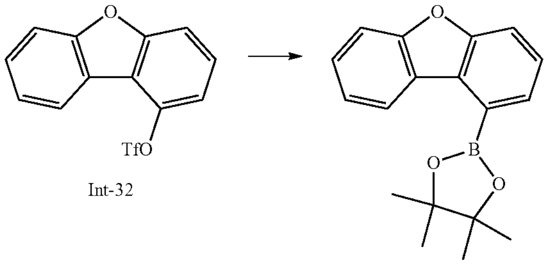

Int-32

Int-33

After sequentially synthesizing Int-29, Int-30, and Int-31 in the same manner as Synthesis Examples 1 to 4 by using 1-bromo-2-fluorobenzene (42 g, 240 mmol) instead of 1-bromo-4-chloro-2-fluorobenzene, 27.4 g (38%) of Int-32 was obtained.

In a round-bottomed flask under a nitrogen atmosphere, Int-32 (27.4 g, 86.6 mmol), bis(pinacolato)diboron (26.4 g, 104 mmol), $Pd(dppf)Cl_2$ (2.2 g, 2.6 mmol), and potassium acetate (12.8 g, 130 mmol) were dissolved in toluene (350 ml) and then, stirred under reflux at 120° C. for 15 hours. When a reaction was completed, after removing a solid therefrom using Celite, 1 L of hot toluene was poured thereinto. Subsequently, a filtrate therefrom was removed under a reduced pressure, ethyl acetate was used for recrystallization, obtaining 11.5 g (45%) of Int-33.

Synthesis Example 21: Synthesis of Int-34

[Reaction Scheme 21]

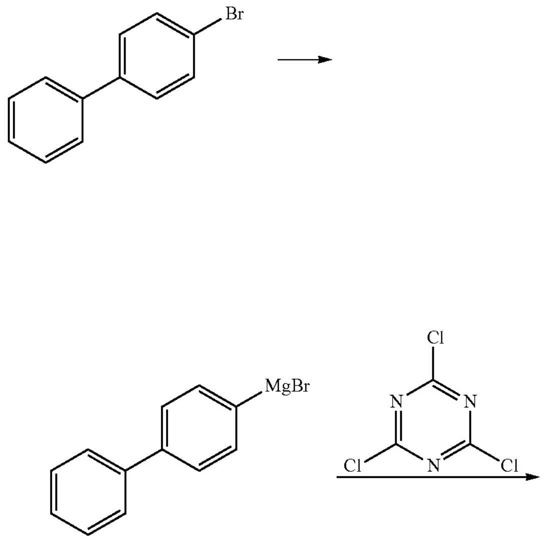

-continued

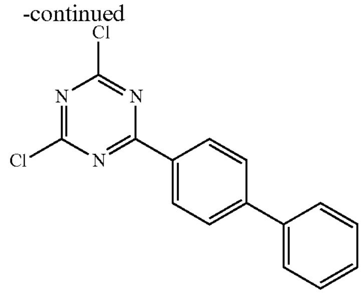

Int-34

24.5 g (63%) of Int-34 was obtained in the same manner as Synthesis Example 7 by using 4-bromobiphenyl (30 g, 128.7 mmol) instead of 3-bromodibenzofuran.

Synthesis Example 22: Synthesis of Int-35

[Reaction Scheme 22]

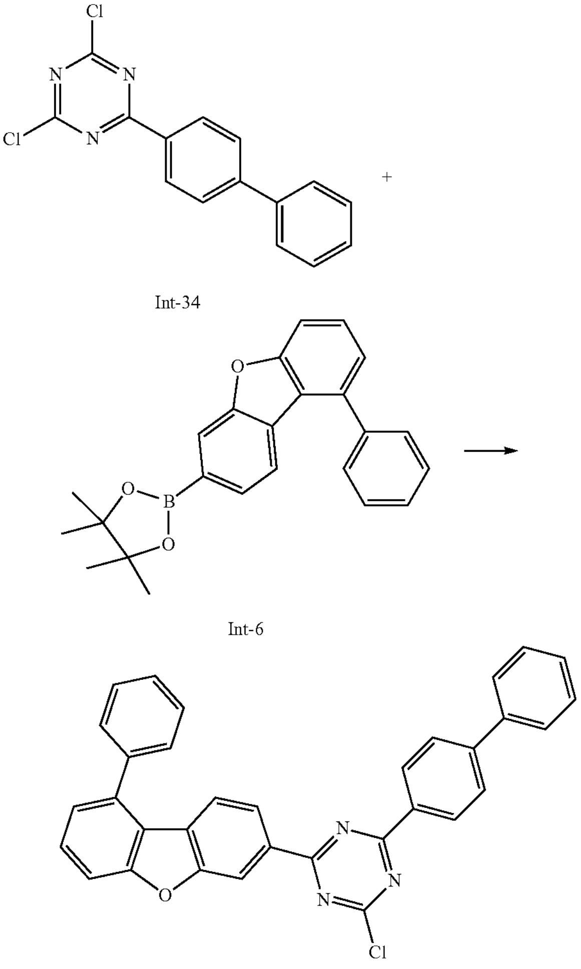

Int-34

Int-6

Int-35

Int-34 (16.5 g, 54.6 mmol), Int-6 (20.2 g, 54.6 mmol), $K_2CO_3$ (11.3 g, 81.9 mmol), and $Pd(PPh_3)_4$ (3.2 g, 2.7 mmol) were put in a round bottomed flask and dissolved in distilled water (50 ml) and THF (150 ml) and then, stirred under reflux at 60° C. for 12 hours. When a reaction was completed, an excess of methanol was poured thereinto and then, stirred for 30 minutes at ambient temperature. Then, a solid was filtered therefrom and recrystallized in dichlorobenzene, obtaining 20.9 g (75%) of Int-35.

Synthesis Example 23: Synthesis of Compound 33

[Reaction Scheme 23]

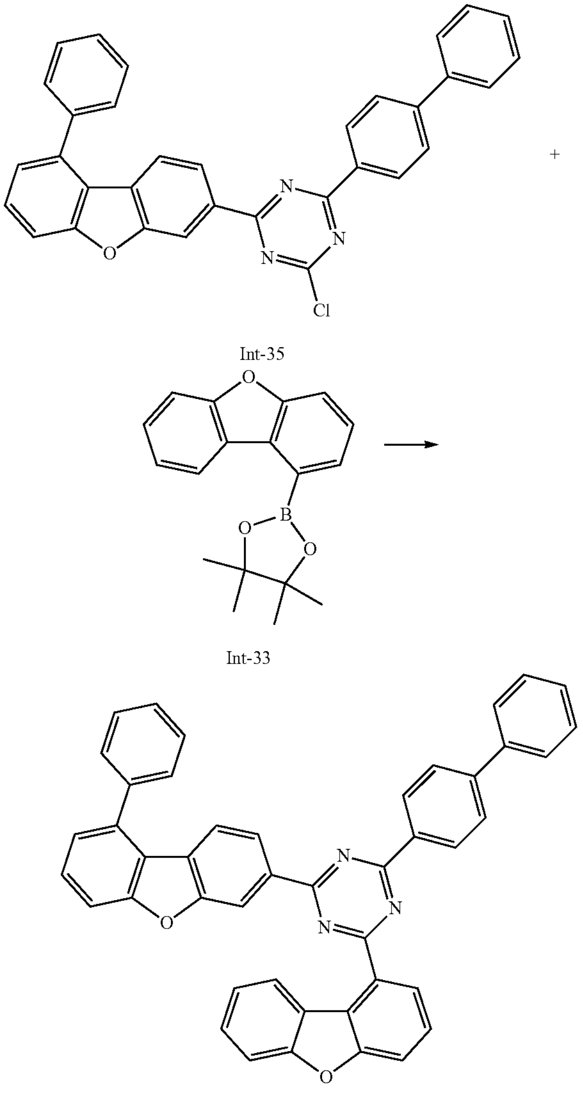

Int-35

Int-33

33

Int-35 (19.9 g, 39 mmol), Int-33 (11.5 g, 39 mmol), $K_2CO_3$ (8.1 g, 58.5 mmol), and $Pd(PPh_3)_4$ (2.25 g, 1.95 mmol) were put in a round-bottomed flask and dissolved in distilled water (50 ml) and THF (150 ml) and then, stirred under reflux at 60° C. for 12 hours. When a reaction was completed, the mixture was poured into an excess of methanol and then, stirred at ambient temperature for 30 minutes. A solid therein was filtered and recrystallized in dichlorobenzene, obtaining 13 g (52%) of Compound 33. LC/MS calculated for: $C_{45}H_{27}N_3O_2$ Exact Mass: 641.21 found for: 642.30

Comparative Synthesis Example 1: Synthesis of Compound Y

[Reaction Scheme 24]

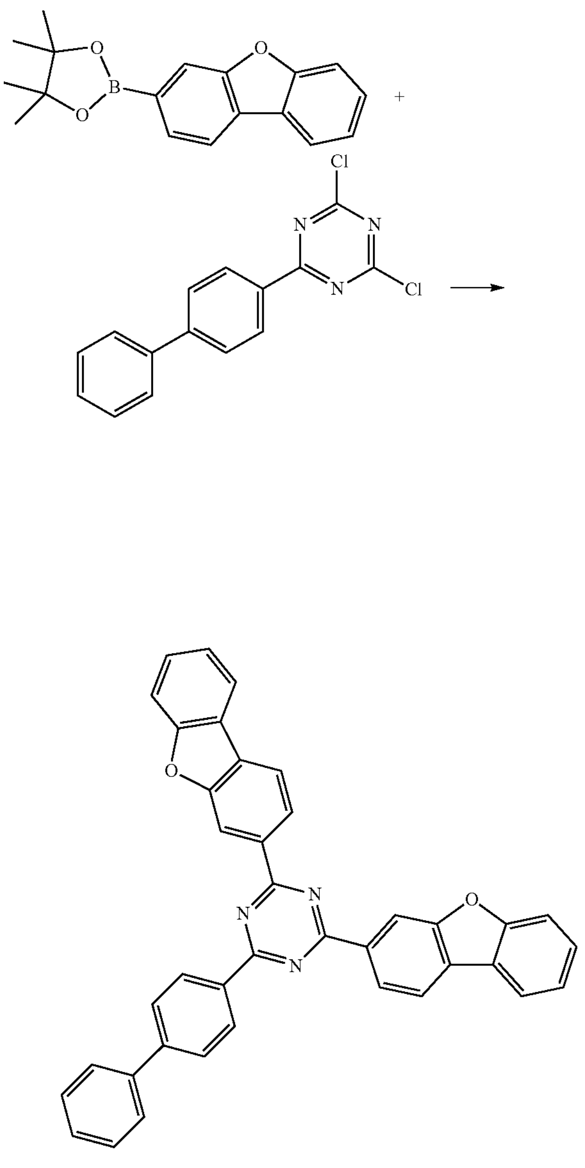

Y 2,4-bis(4-biphenylyl)-6-chloro-1,3,5-triazine (11 g, 36.4 mmol), 3-(4,4,5,5-tetramethyl-1,3,2-dioxaborolan-2-yl)-dibenzofuran (23.6 g, 80.1 mmol), $K_2CO_3$ (11.1 g, 80.1 mmol), and $Pd(PPh_3)_4$ (2.1 g, 1.8 mmol) were put in a round-bottomed flask under a nitrogen atmosphere, and dissolved in distilled water (60 ml) and THF (190 ml) and then, stirred under reflux at 60° C. for 12 hours. When a reaction was completed, the mixture was poured into an excess of methanol and then, stirred at ambient temperature for 30 minutes. A solid therein was filtered and vacuum-dried. The solid was recrystallized in monochlorobenzene, obtaining 14.4 g (70%) of Compound Y.

LC/MS calculated for: $C_{39}H_{23}N_3O_2$ Exact Mass: 565.18 found for: 566.01

(Synthesis of Second Compound)

Synthesis Example 24: Synthesis of Compound B-2

[Reaction Scheme 25]

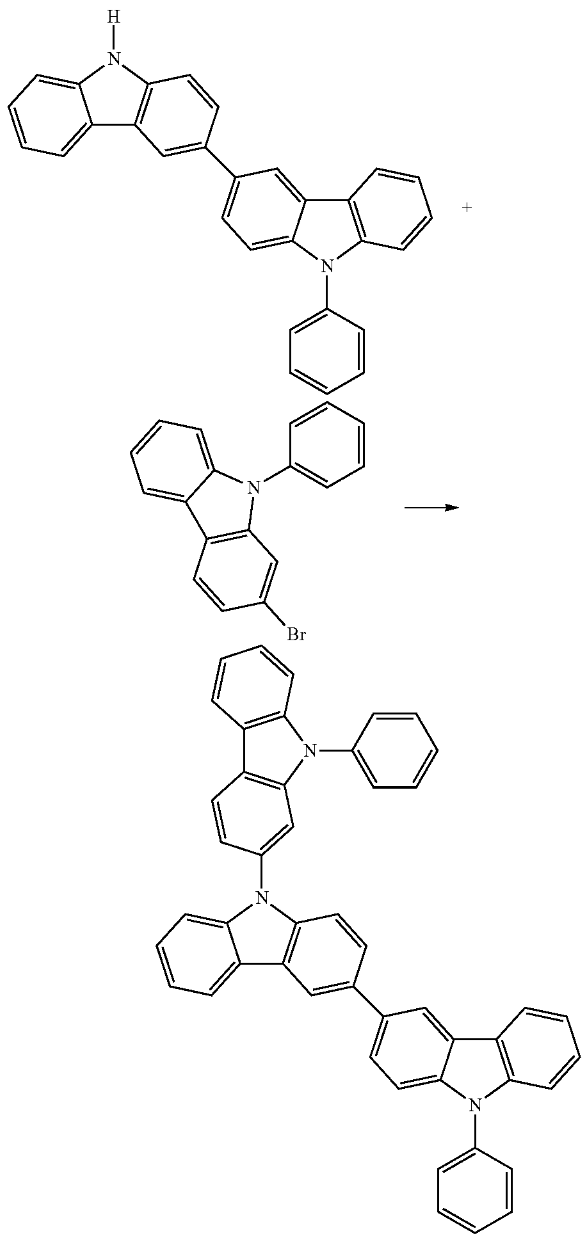

9-phenyl-3,3'-bi-9H-carbazole (20 g, 49.0 mmol), 2-bromo-9-phenylcarbazole (15.8 g, 49.0 mmol), NaOtBu (7.1 g, 73.5 mmol), $Pd_2(dba)_3$ (2.2 g, 2.5 mmol), and $P(t-Bu)_3$ (1.5 g, 7.4 mmol) were put in a round-bottomed flask under a nitrogen atmosphere and dissolved in xylene (245 ml) and then, stirred under reflux at 120° C. for 12 hours. When a reaction was completed, an excess of distilled water was poured thereinto and then, stirred for 1 hour. A solid therein was filtered and dissolved in toluene at a high temperature. After removing moisture with $MgSO_4$ and filtering an organic solvent with silica gel pad, a filtrate therefrom was stirred. Subsequently, a solid generated therein was filtered and vacuum-dried, obtaining 21.6 g (68%) of Compound B-2.

Synthesis Example 25: Synthesis of Compound B-3

[Reaction Scheme 26]

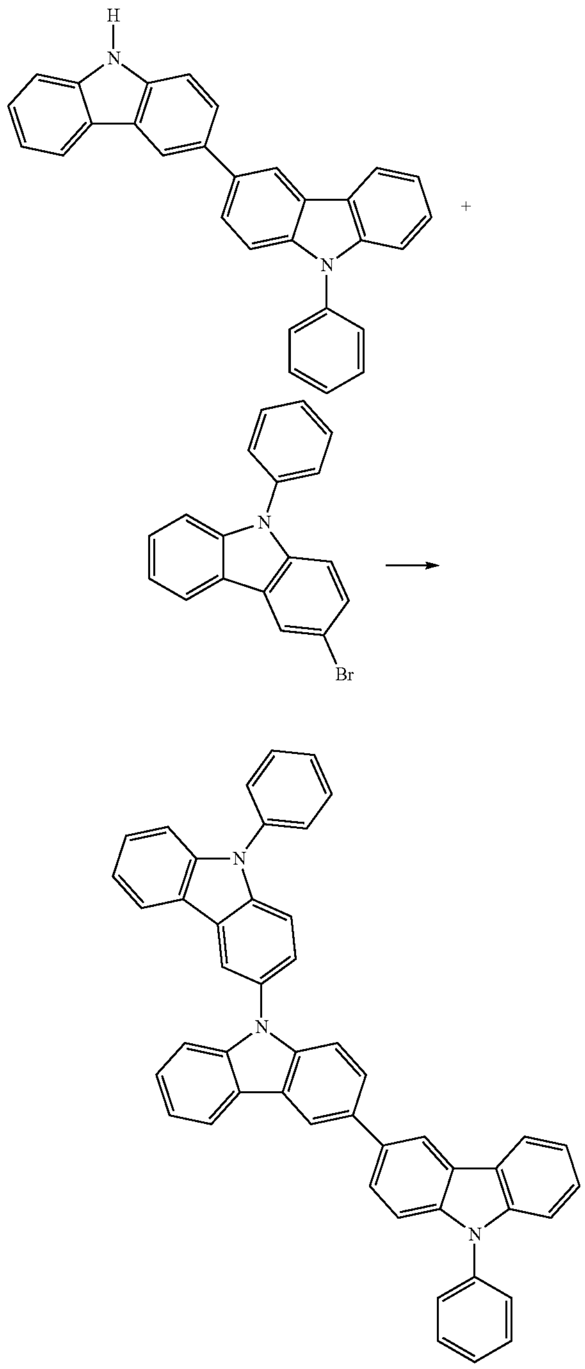

Compound B-3 (22.6 g, 71%) was obtained in the same manner as Synthesis Example 24 except that 3-bromo-9-phenylcarbazole was used instead of the 2-bromo-9-phenylcarbazole.

Comparative Synthesis Example 2: Synthesis of Compound D-1

[Reaction Scheme 27]

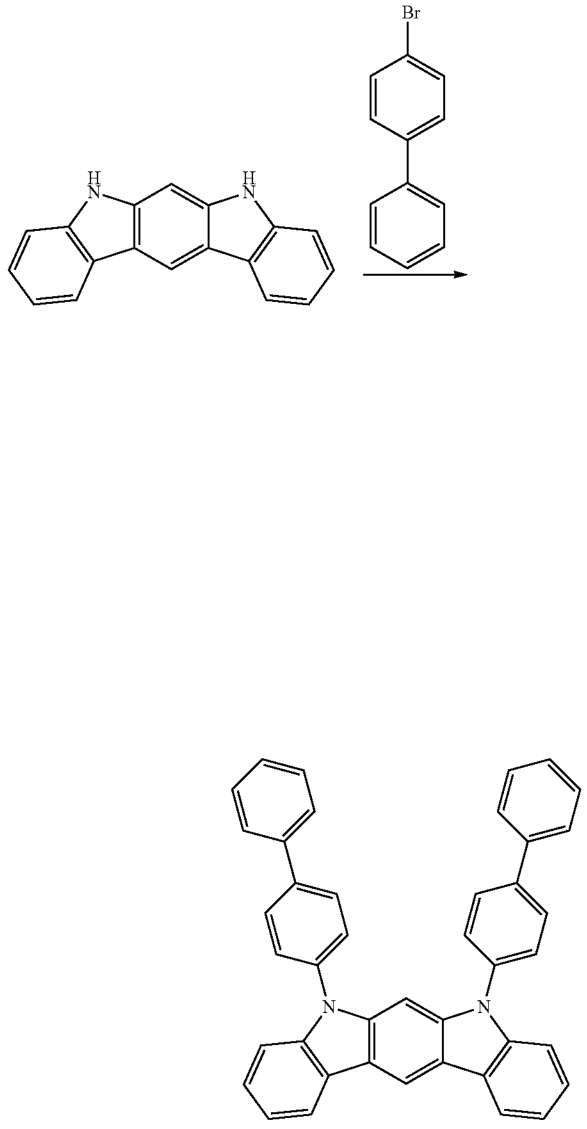

D-1

Compound D-1 was synthesized in the same manner as Synthesis Example 25 by using 1 equivalent of a synthesis intermediate of 5,7-dihydro-indolo[2,3-b]carbazole (cas: 111296-90-3) and 2.5 equivalent of 4-bromo-1,1'-biphenyl (cas:92-66-0).

LC/MS calculated for: C42H28N2 Exact Mass: 560.2252 found for: 561.24

Comparative Synthesis Example 3: Synthesis of Compound D-2

Compound D-2 was synthesized by a suitable method.

D-2

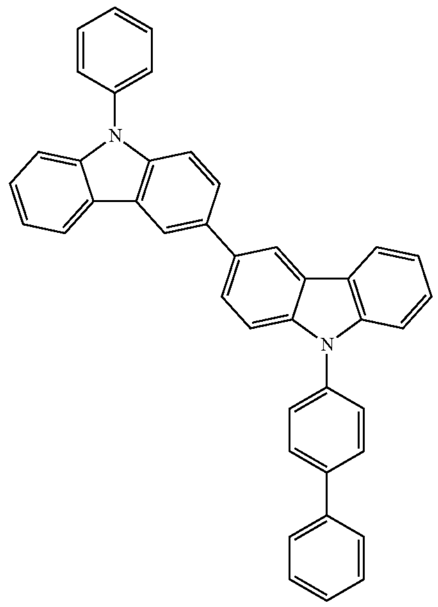

(Manufacture of Organic Light Emitting Diode)

Example 1

A glass substrate coated with ITO (indium tin oxide) was washed with distilled water and ultrasonic waves. After washing with the distilled water, the glass substrate was ultrasonically washed with isopropyl alcohol, acetone, or methanol, and dried and then, moved to a plasma cleaner, cleaned by using oxygen plasma for 10 minutes, and moved to a vacuum depositor. This prepared ITO transparent electrode was used as an anode, and Compound A doped with 3% NDP-9 (Novaled GmbH) was vacuum-deposited on the ITO substrate to form a 100 Å-thick hole injection layer, and Compound A was deposited to be 1,350 Å thick on the hole injection layer to form a hole transport layer. Compound B was deposited to be 350 Å thick on the hole transport layer to form a hole transport auxiliary layer. On the hole transport auxiliary layer, Compound 12 and Compound B-3 were simultaneously used as a host and doped with 10 wt % of PhGD as a dopant and then, vacuum-deposited to form a 400 Å-thick light emitting layer. In Example 1, Compound 12 and Compound B-3 were used in a weight ratio of 2:8. Subsequently, Compound C was deposited to form a 50 Å-thick electron transport auxiliary layer on the light emitting layer, and Compound D and LiQ were simultaneously vacuum-deposited in a weight ratio of 1:1 to form a 300 Å-thick electron transport layer. On the electron transport layer, LiQ and Al were sequentially vacuum-deposited to be 15 Å-thick and 1,200 Å-thick, manufacturing an organic light emitting diode.

The structure was ITO/Compound A (3% NDP-9 doping, 100 Å)/Compound A (1,350 Å)/Compound B (350 Å)/EML [90 wt % of host (Compound 12: Compound B-3=2:8 w/w): PhGD=90 wt %: 10 wt % (400 Å)/Compound C (50 Å)/Compound D: LiQ (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-bis(9,9-dimethyl-9H-fluoren-4-yl)-9,9-spirobi(fluorene)-2-amine Compound C: 2-[3'-(9,9-Dimethyl-9H-fluorenc-2-yl)[1,1'-biphenyl]-3-yl]-4,6-diphenyl-1,3,5-triazine Compound D: 2-[4-[4-(4'-Cyano-1,1'-biphenyl-4-yl)-1-naphthyl]phenyl]-4,6-diphenyl-1,3,5-triazine

[PhGD]

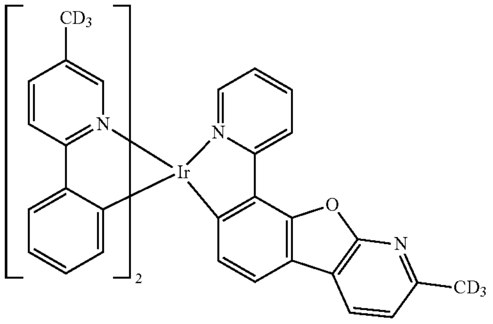

Examples 2 to 4 and Comparative Examples 1 to 3

Diodes of Examples 2 to 4, and Comparative Examples 1 to 3 were manufactured in the same manner as in Example 1, except that the host compositions were changed as described in Tables 1 to 3.

Evaluation

The characteristics of the organic light emitting diodes according to Examples 1 to 4 and Comparative Examples 1 to 3 were evaluated, and the results are shown in Tables 1 to 3. Specific measurement methods are as follows.

(1) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Current Efficiency

Current efficiency (cd/A) at the same current density (10 $mA/cm^2$) were calculated by using the luminance and current density from the items (1) and (2).

(4) Measurement of Life-Span

The luminance ($cd/m^2$) was maintained at 6,000 $cd/m^2$, and the time at which the current efficiency (cd/A) decreased to 90% was measured to obtain results.

(5) Measurement of Driving Voltage

A driving voltage of each diode was measured by using a current-voltage meter (Keithley 2400) at 15 $mA/cm^2$.

(6) Calculation of Driving Voltage Ratio (%)

The relative comparison values with the measured driving voltage value of Comparative Example 1 are shown in Table 1.

The relative comparison values with the measured driving voltage value of Comparative Example 3 are shown in Table 3.

(7) Calculation of Current Efficiency Ratio (%)

The relative comparison values with the measured luminous efficiency value of Comparative Example 2 are shown in Table 2.

(8) Calculation of Life-Span Ratio (%)

The relative comparison values with the measured T90(h) life-span value of Comparative Example 1 are shown in Table 1.

The relative comparison values with the measured T90(h) life-span value of Comparative Example 2 are shown in Table 2.

The relative comparison values with the measured T90(h) life-span value of Comparative Example 3 are shown in Table 3.

TABLE 1

| | First host | Second host | Driving voltage ratio (%) | T90 life-span ratio (%) |
|---|---|---|---|---|
| Example 1 | 12 | B-3 | 96% | 132% |
| Example 2 | 16 | B-2 | 96% | 120% |
| Comparative Example 1 | Y | B-3 | 100% | 100% |

TABLE 2

| | First host | Second host | Current efficiency ratio (%) | T90 life-span ratio (%) |
|---|---|---|---|---|
| Example 3 | 12 | B-3 | 110% | 455% |
| Comparative Example 2 | 12 | D-1 | 100% | 100% |

TABLE 3

| | First host | Second host | Driving voltage ratio (%) | T90 life-span ratio (%) |
|---|---|---|---|---|
| Example 4 | 16 | B-2 | 94% | 130% |
| Comparative Example 3 | 16 | D-2 | 100% | 100% |

Referring to Tables 1 to 3, the compositions according to the Examples exhibited greatly improved driving voltage, efficiency, or life-span compared with the composition according to the Comparative Examples.

In general, the lower driving voltage and the higher efficiency and life-span mean excellent performance, and referring Tables 1 and 3, the compositions according to the Examples exhibited a relatively lower driving voltage ratio and a relatively higher current efficiency ratio or T90 life-span ratio than the Comparative Examples and thus improved device performance.

One or more embodiments may provide a composition for an organic optoelectronic device capable of implementing an organic optoelectronic device having high efficiency and a long life-span.

An organic optoelectronic device having high efficiency and a long life-span may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an organic optoelectronic device, the composition comprising:

a first compound represented by Chemical Formula 1, and a second compound represented by Chemical Formula 4,

[Chemical Formula 1]

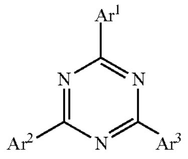

wherein:

in Chemical Formula 1, $Ar^1$ is a substituted or unsubstituted C6 to C20 aryl group, $Ar^2$ is a group of Group IA or Group II, $Ar^3$ is a group of Group IB or Group III, and $Ar^2$ and $Ar^3$ are not both selected from Group IA and Group IB, respectively, at the same time,

[Group IA]

[Chemical Formula 1-3]

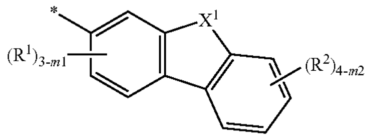

[Group IB]

[Chemical Formula 1-6]

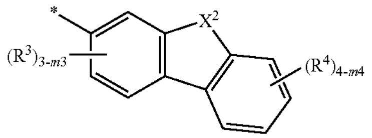

[Group II]

[Chemical Formula 2-31]

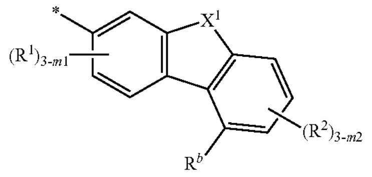

[Chemical Formula 2-32]

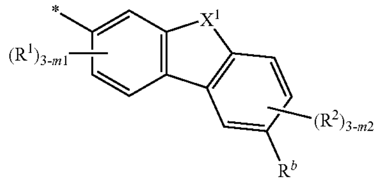

-continued

[Chemical Formula 2-33]

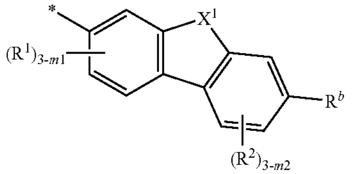

[Chemical Formula 2-34]

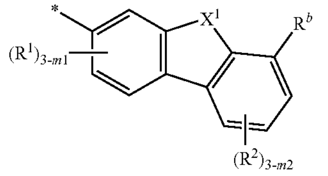

[Chemical Formula 2-35]

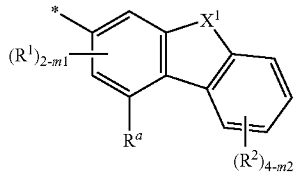

[Chemical Formula 2-36]

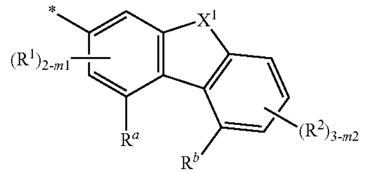

[Chemical Formula 2-37]

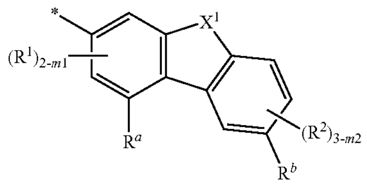

[Chemical Formula 2-38]

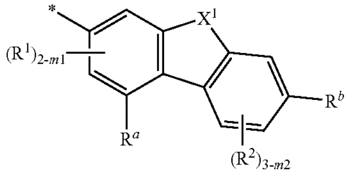

[Chemical Formula 2-39]

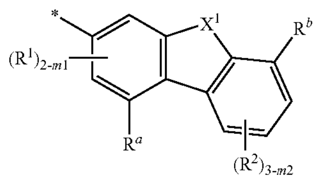

[Chemical Formula 2-40]

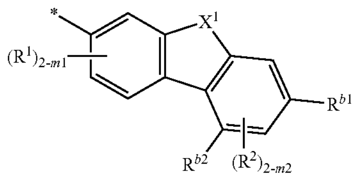

-continued
[Chemical Formula 2-41]
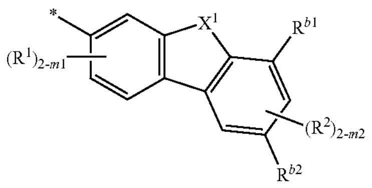
[Chemical Formula 2-42]
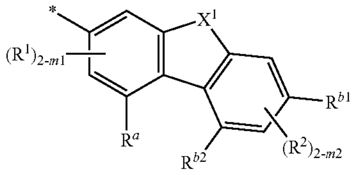
[Chemical Formula 2-43]
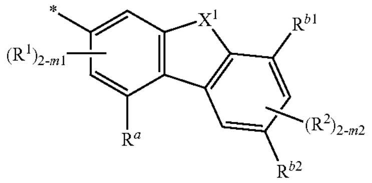
[Group III]
[Chemical Formula 3-31]
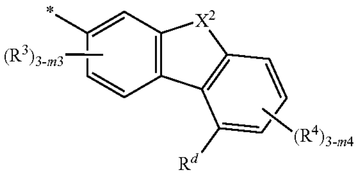
[Chemical Formula 3-32]
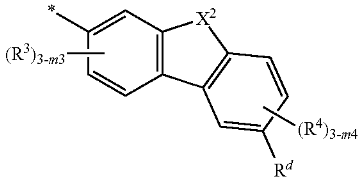
[Chemical Formula 3-33]
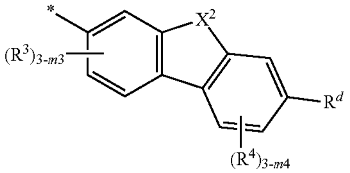
[Chemical Formula 3-36]
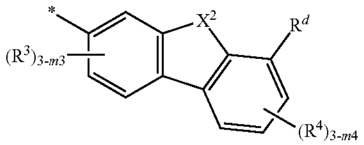
[Chemical Formula 3-35]
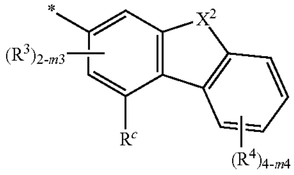
-continued
[Chemical Formula 3-36]
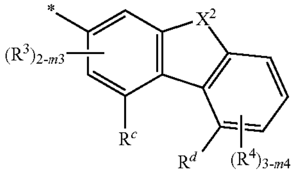
[Chemical Formula 3-37]
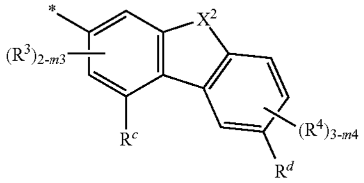
[Chemical Formula 3-38]
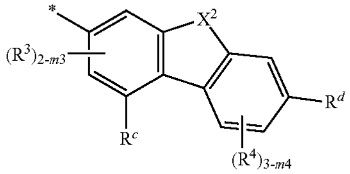
[Chemical Formula 3-39]
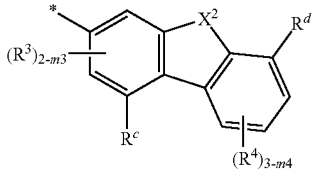
[Chemical Formula 3-40]
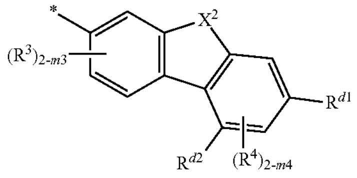
[Chemical Formula 3-41]
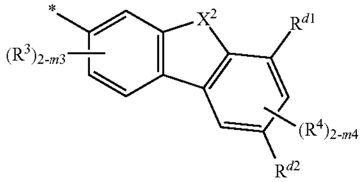
[Chemical Formula 3-42]
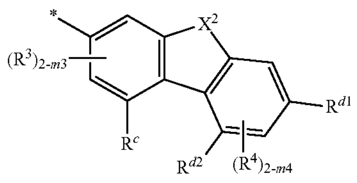
[Chemical Formula 3-43]
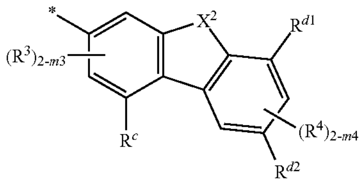

in Group IA and Group IB, Group II, and Group III, $X^1$ and $X^2$ are each independently O or S, $R^1$ to $R^4$ are each independently hydrogen or deuterium, $R^a$, $R^b$, $R^c$, $R^d$, $R^{b1}$, $R^{b2}$, $R^{d1}$, and $R^{d2}$ are each independently a substituted or unsubstituted C6 to C20 aryl group that does not include a fused ring, m1 and m3 are each independently an integer of 0 to 3, m2 and m4 are each independently an integer of 0 to 4, and satisfy the following relation: m1+m2+m3+m4≥1, and

* is a linking point:

[Chemical Formula 4-11']

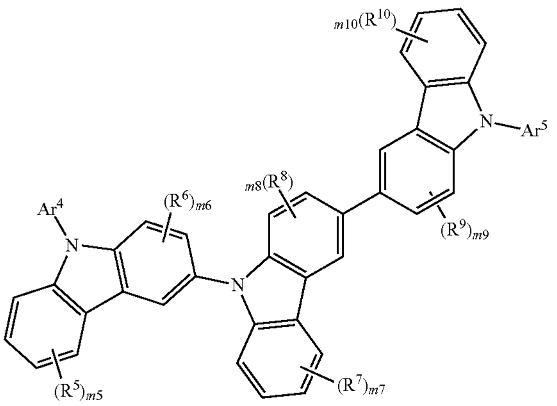

in Chemical Formula 4-11', $Ar^4$ and $Ar^5$ are each independently a substituted or unsubstituted C6 to C20 aryl group, $R^5$ to $R^{10}$ are each independently hydrogen, deuterium, a cyano group, a halogen, a substituted or unsubstituted C1 to C30 alkyl group, or a substituted or unsubstituted C6 to C30 aryl group, m5, m7 and m10 are each independently an integer of 1 to 4, and m6, m8 and m9 are each independently an integer of 1 to 3.

2. The composition as claimed in claim 1, wherein $R^a$, $R^b$, $R^c$, $R^d$, $R^{b1}$, $R^{b2}$, $R^{d1}$, and $R^{d2}$ are each independently a substituted or unsubstituted phenyl group or a substituted or unsubstituted biphenyl group.

3. The composition as claimed in claim 2, wherein:

$R^a$, $R^b$, $R^c$, $R^{b1}$, $R^{b2}$, $R^{d1}$, and $R^{d2}$ are each independently a group of Group IV:

[Group IV]

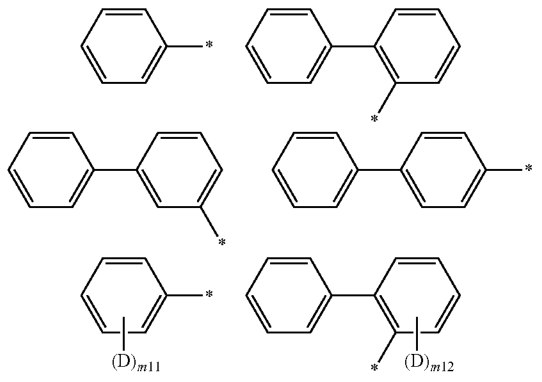

-continued

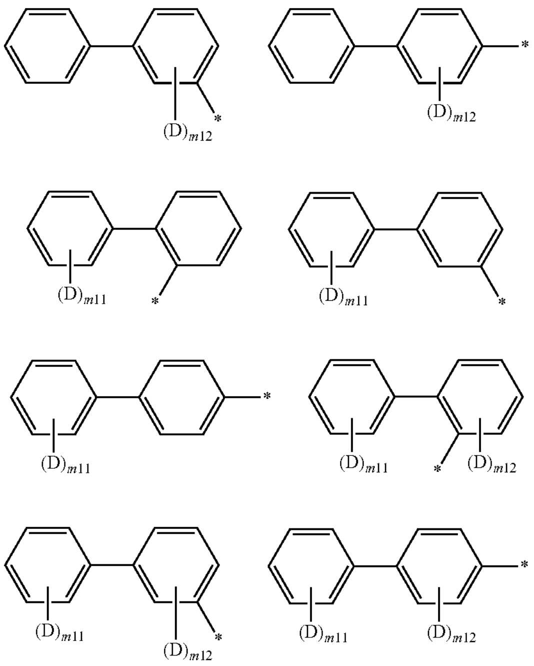

in Group IV,

D is deuterium, m11 is an integer of 1 to 5, m12 is an integer of 1 to 4, and

* is a linking point.

4. The composition as claimed in claim 1, wherein $Ar^1$ is a substituted or unsubstituted phenyl group, a substituted or unsubstituted biphenyl group, or a substituted or unsubstituted terphenyl group.

5. The composition as claimed in claim 1, wherein the first compound represented by Chemical Formula 1 is a compound of Group 1:

[Group 1]

10

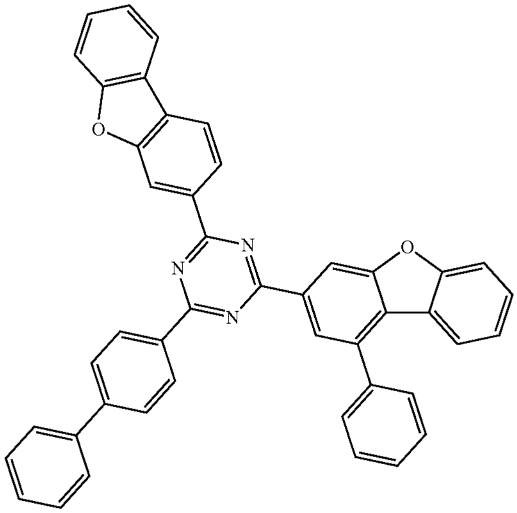

-continued
11
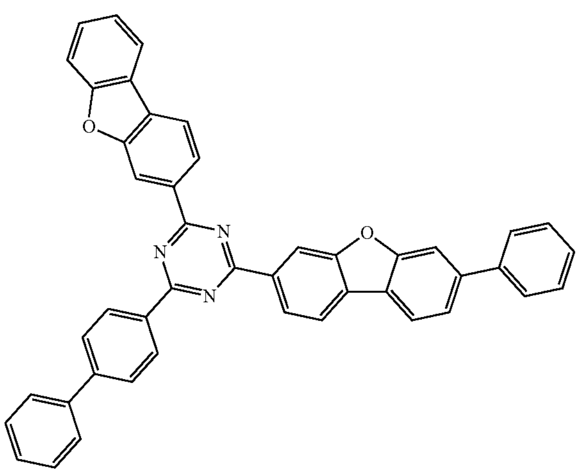
12
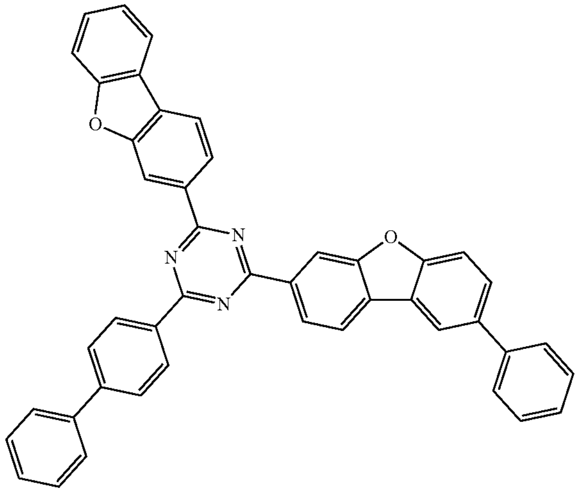
12
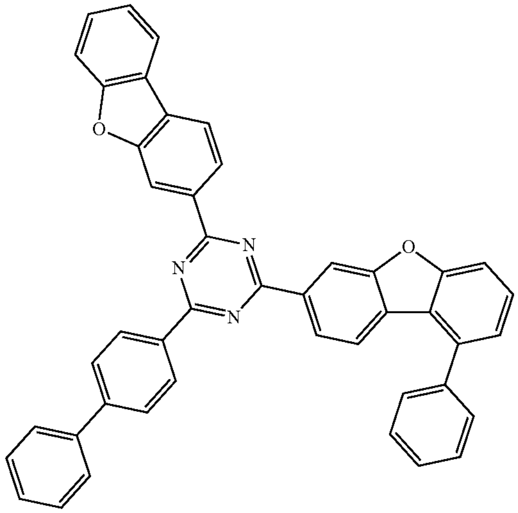
-continued
13
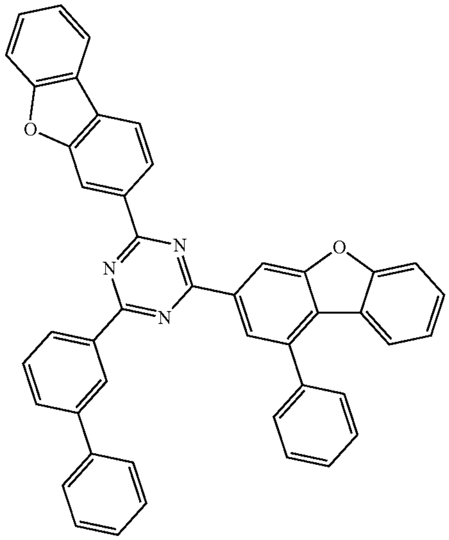
14
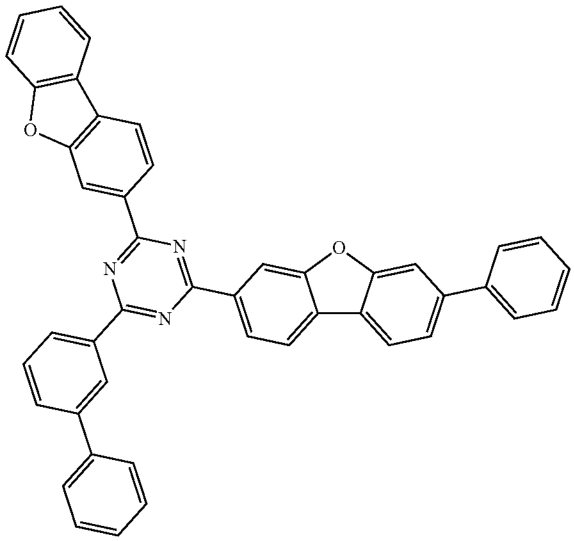
15
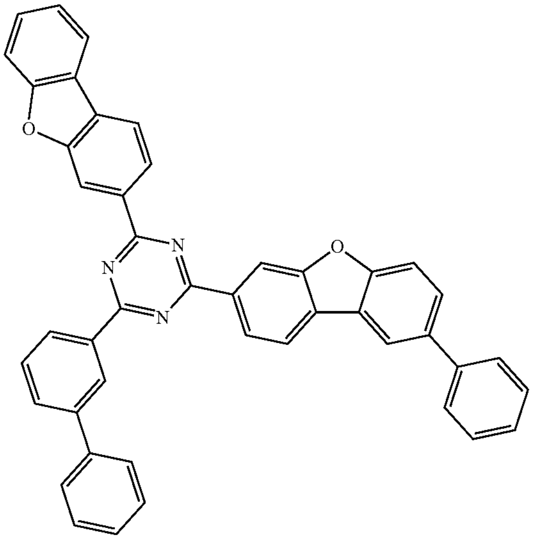

-continued
16
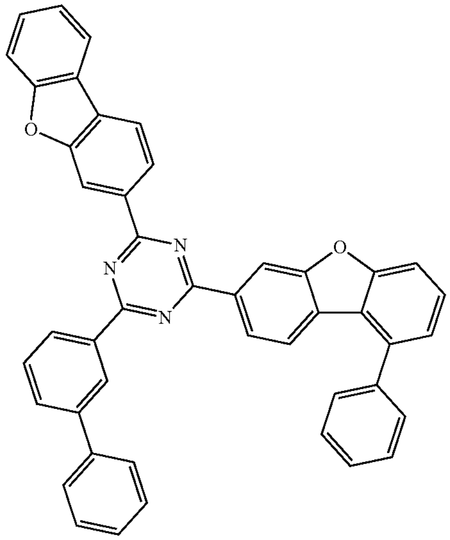
17
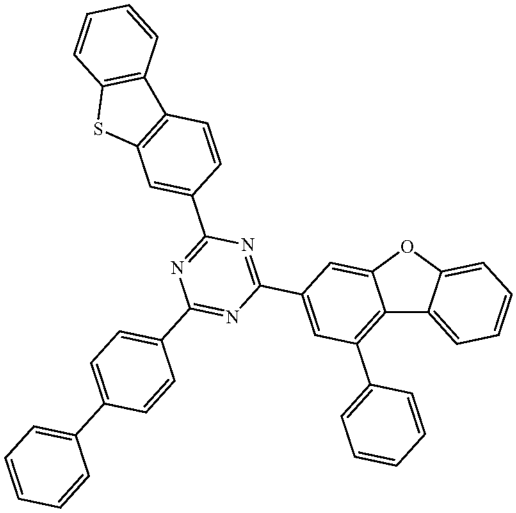
18
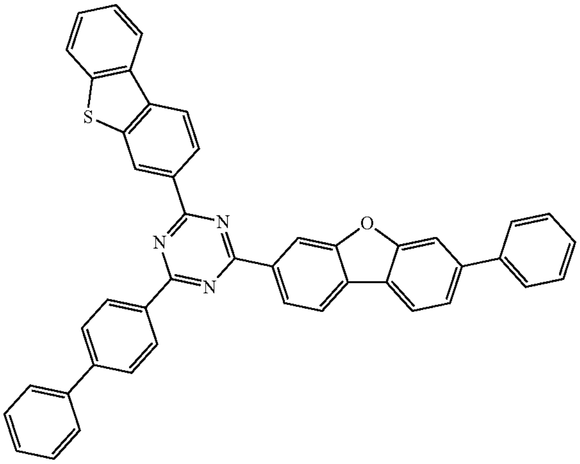
-continued
19
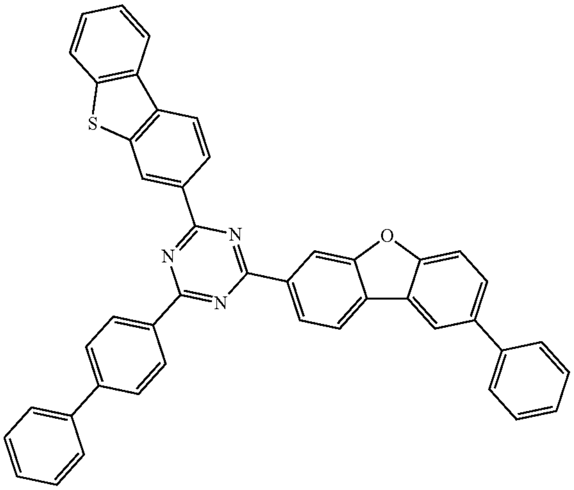
20
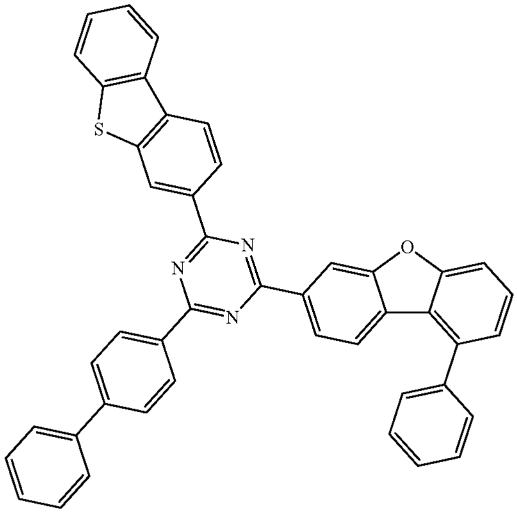
21
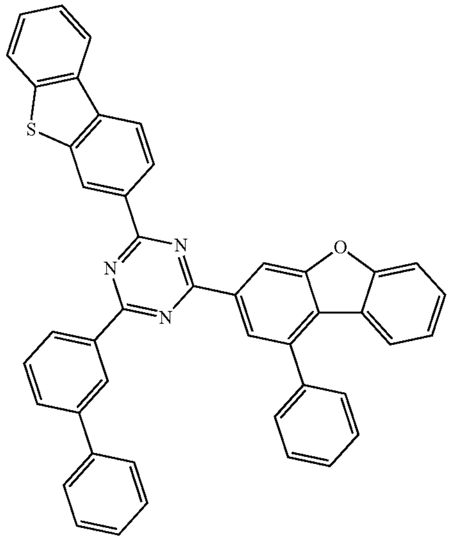

-continued
22
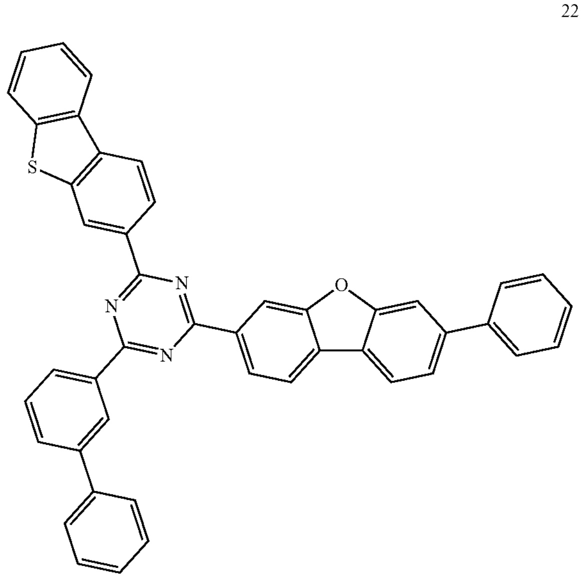
23
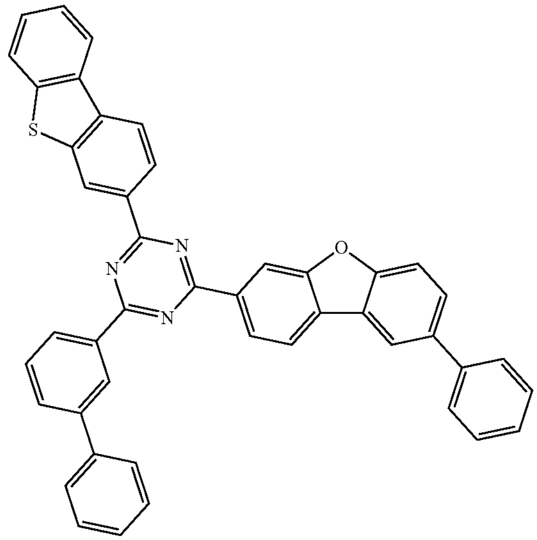
24
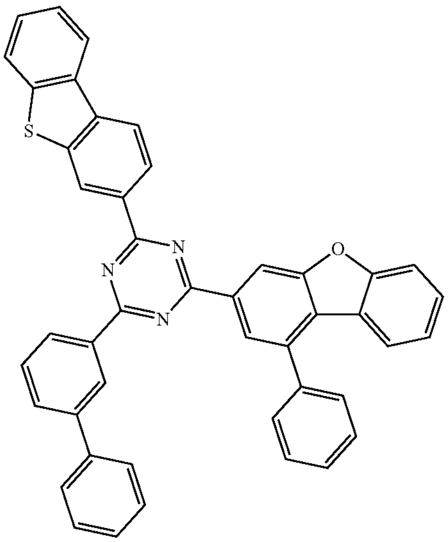
-continued
26
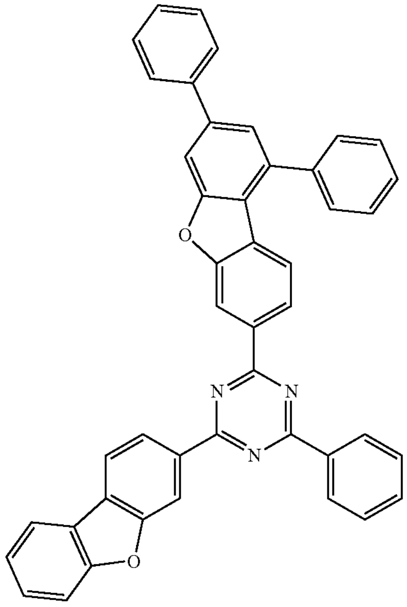
27
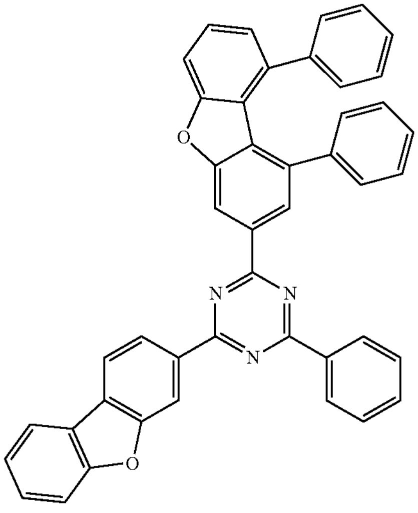
28
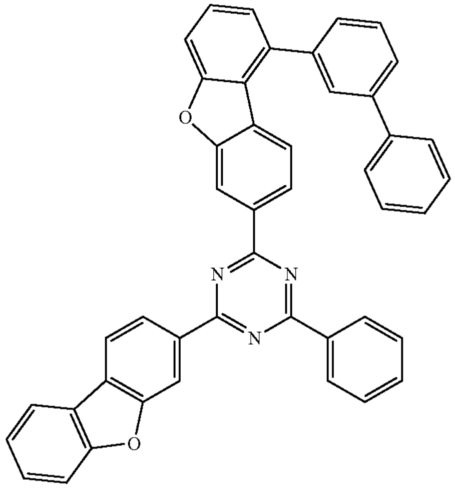

-continued
29
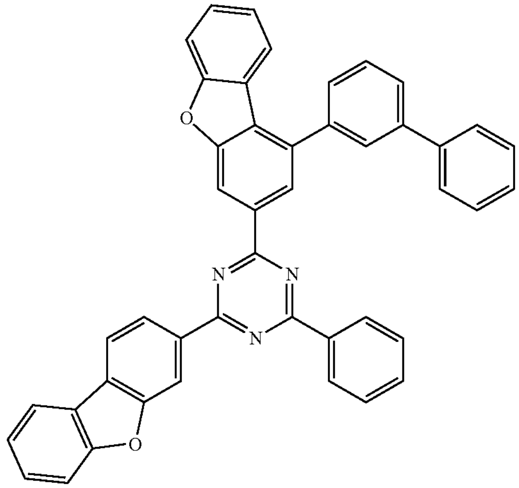
30
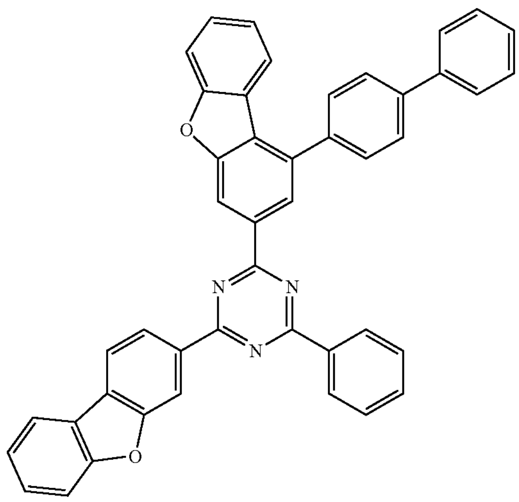
31
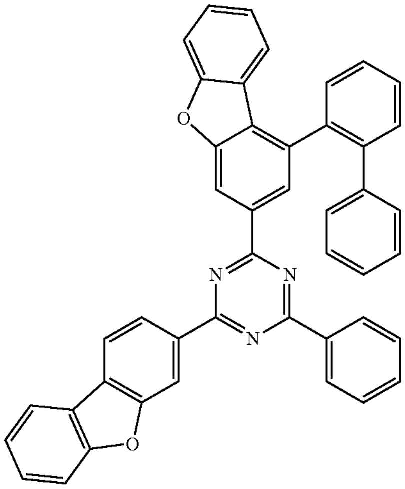
-continued
32
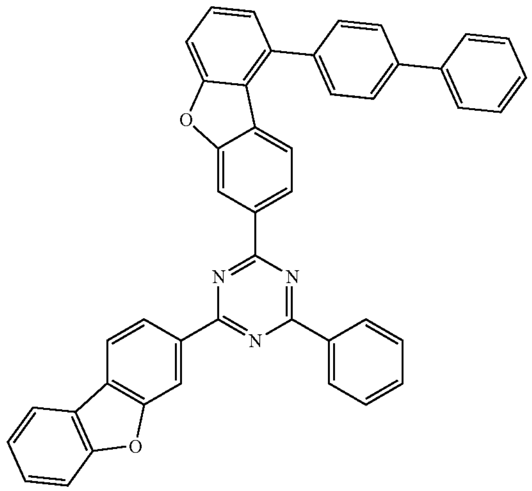
65
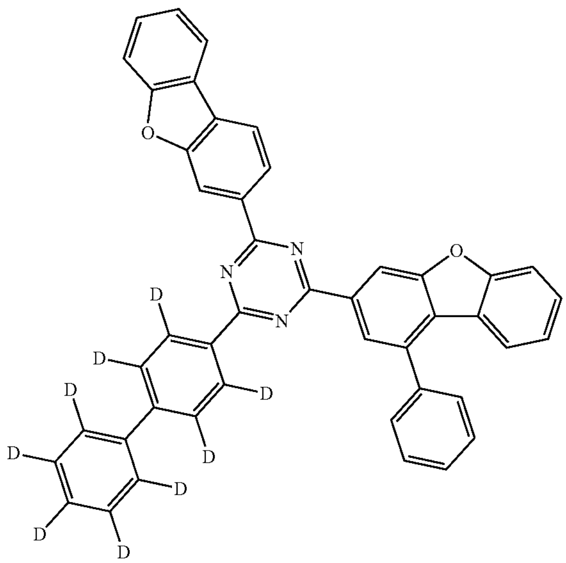
66
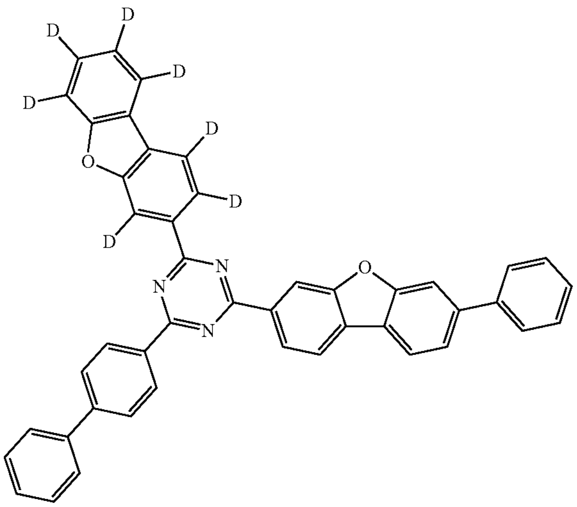

-continued
67
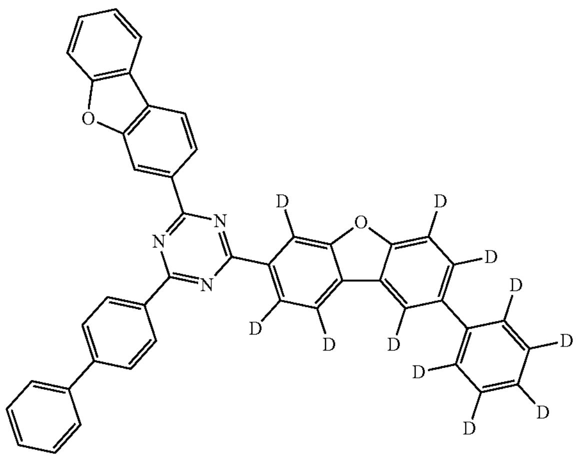
68
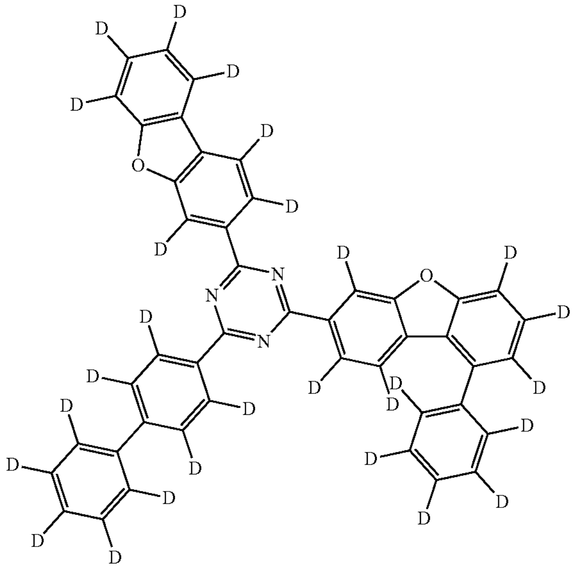
69
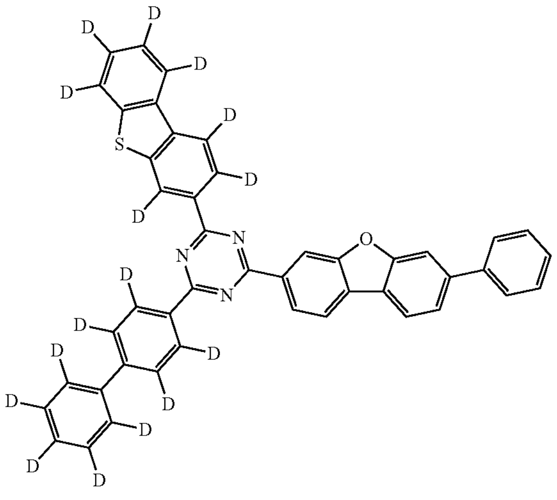
6. The composition as claimed in claim 1, wherein $Ar^4$ and $Ar^5$ are each independently a substituted or unsubstituted phenyl group or a substituted or unsubstituted biphenyl group.
7. The composition as claimed in claim 1, wherein:
$Ar^4$ and $Ar^5$ are each independently a group of Group VI:
[Group VI]
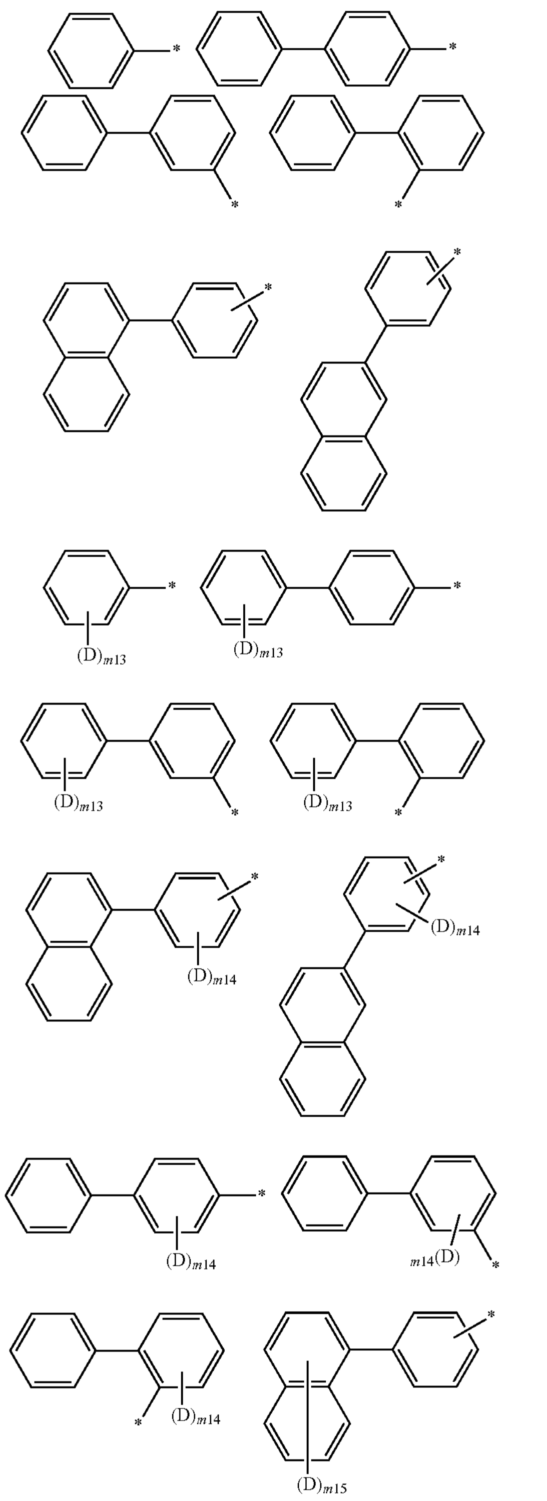

-continued
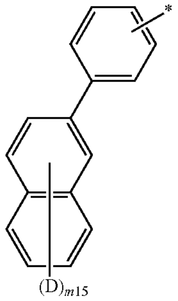
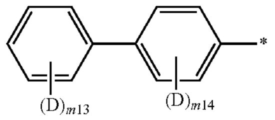
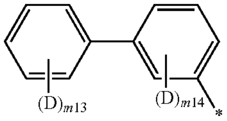
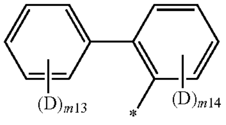
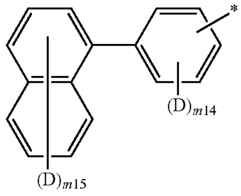
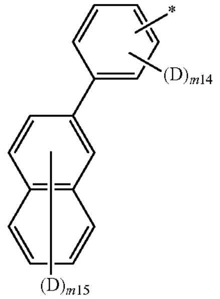
in Group VI,
D is deuterium,
m13 is an integer of 1 to 5,
m14 is an integer of 1 to 4,
m15 is an integer of 1 to 7, and
* is a linking point.
8. The composition as claimed in claim 1, wherein the second compound represented by Chemical Formula 4 is a compound of Group 2:
B-3
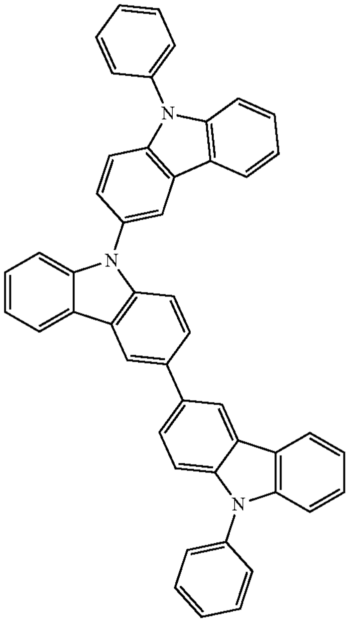
-continued
B-12
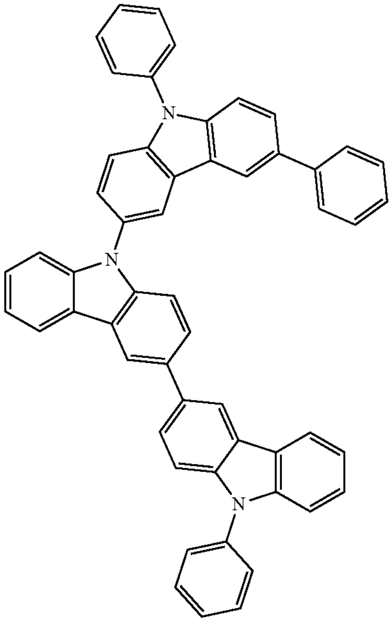
B-19
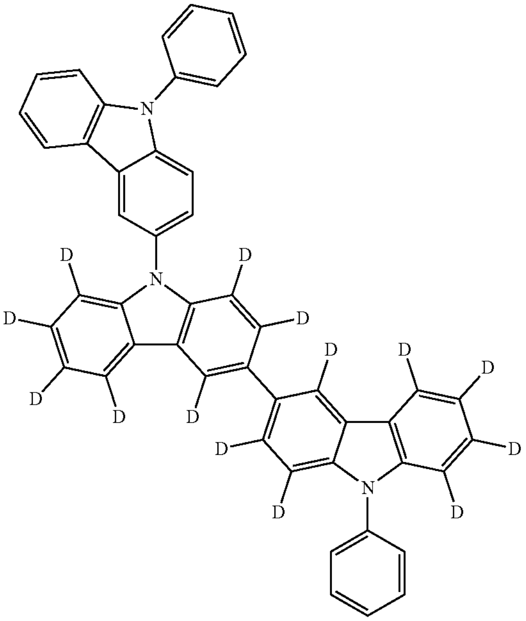

-continued
B-20
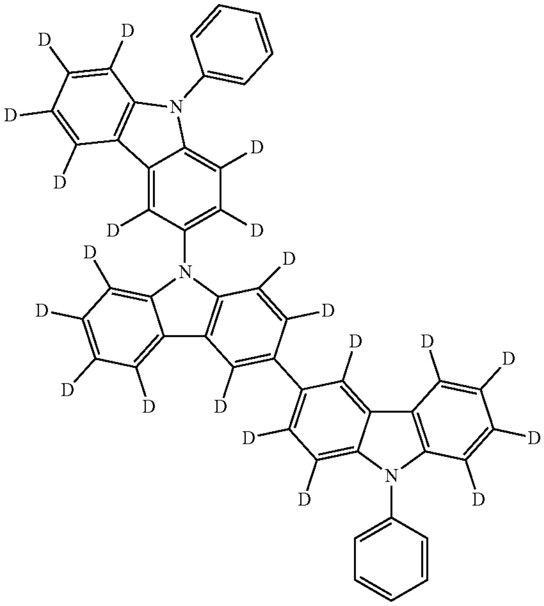
B-21
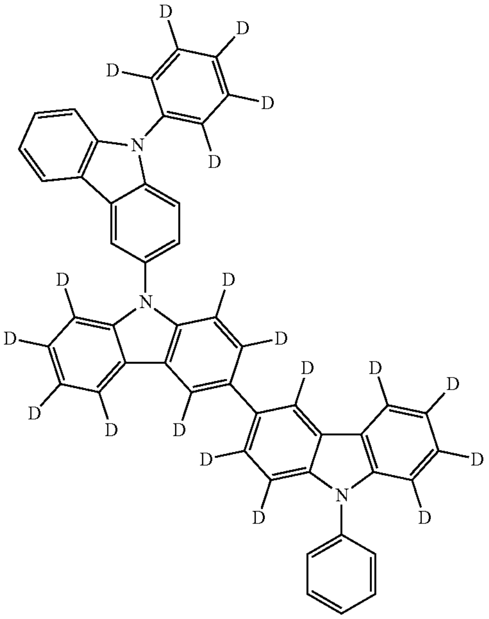
-continued
B-22
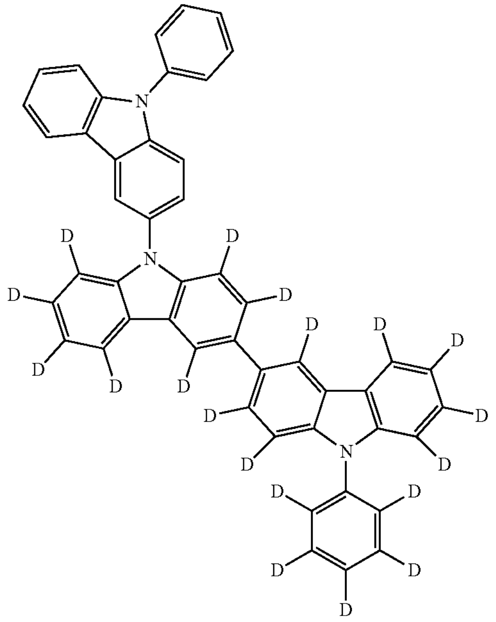
B-23
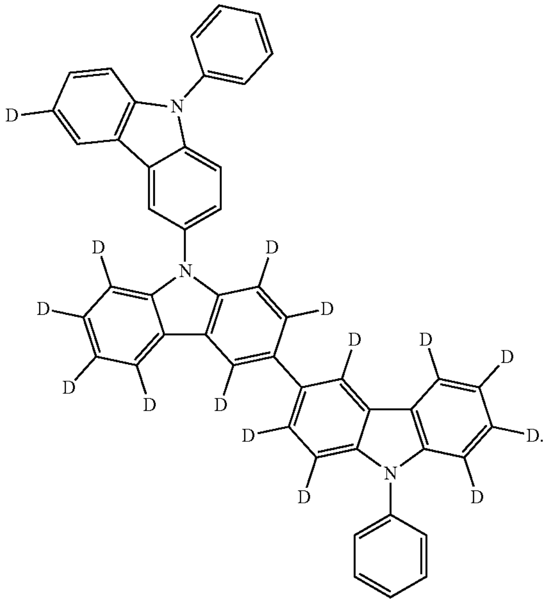
9. The composition as claimed in claim 1, wherein:
in the first compound, $Ar^2$ of Chemical Formula 1 is represented by Chemical Formula 2-3 and $Ar^3$ is represented by Chemical Formula 3-3:
[Chemical Formula 2-3]
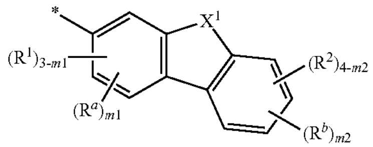

-continued

[Chemical Formula 3-3]

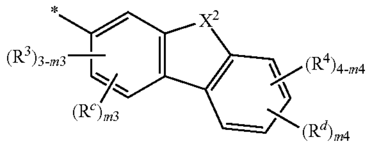

in Chemical Formula 2-3 and Chemical Formula 3-3, $X^1$ and $X^2$ are each independently O or S, $R^1$ to $R^4$ are each independently hydrogen or deuterium, $R^a$, $R^b$, $R^c$, and $R^d$ are each independently a substituted or unsubstituted phenyl group or a substituted or unsubstituted biphenyl group, m1 and m3 are each independently an integer of 0 to 3, m2 and m4 are each independently an integer of 0 to 4, and satisfy the following relation: $m1+m2+m3+m4 \geq 1$, and

* is a linking point;

$Ar^4$ and $Ar^5$ of Chemical Formula 4-11' are each independently a substituted or unsubstituted phenyl group or a substituted or unsubstituted biphenyl group, $R^5$ to $R^{10}$ of Chemical Formula 4-11' are each independently hydrogen or deuterium, m5, m7 and m10 of Chemical Formula 4-11' are each independently an integer of 1 to 4, and m6, m8 and m9 of Chemical Formula 4-11' are each independently an integer of 1 to 3.

10. An organic optoelectronic device, comprising:

an anode and a cathode facing each other, and at least one organic layer between the anode and the cathode, wherein:

the at least one organic layer includes a light emitting layer, and the light emitting layer includes the composition for an organic optoelectronic device as claimed in claim 1.

11. The organic optoelectronic device as claimed in claim 10, wherein the composition for an organic optoelectronic device is a host of the light emitting layer.

12. A display device comprising the organic optoelectronic device as claimed in claim 10.

* * * * *